US006734489B2

(12) United States Patent
Morimoto et al.

(10) Patent No.: US 6,734,489 B2
(45) Date of Patent: May 11, 2004

(54) SEMICONDUCTOR ELEMENT AND MIM-TYPE CAPACITOR FORMED IN DIFFERENT LAYERS OF A SEMICONDUCTOR DEVICE

(75) Inventors: Noboru Morimoto, Tokyo (JP); Kinya Goto, Tokyo (JP); Masahiro Matsumoto, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/122,387

(22) Filed: Apr. 16, 2002

(65) Prior Publication Data

US 2002/0179955 A1 Dec. 5, 2002

(30) Foreign Application Priority Data

May 30, 2001 (JP) .......................... 2001-162414
Sep. 6, 2001 (JP) .......................... 2001-269827

(51) Int. Cl.[7] .................... H01L 27/08; H01L 29/76; H01L 29/94; H01L 31/119
(52) U.S. Cl. .................... 257/306; 257/296; 257/300; 257/310
(58) Field of Search ................ 257/300, 306, 257/310, 312, 296, 297, 298, 299, 307, 308, 390, 311, 313

(56) References Cited

U.S. PATENT DOCUMENTS

| | | | | |
|---|---|---|---|---|
| 6,010,933 A | * | 1/2000 | Cherng .................... | 438/253 |
| 6,100,138 A | * | 8/2000 | Tu ........................... | 438/253 |
| 6,215,144 B1 | * | 4/2001 | Saito et al. .............. | 257/310 |
| 6,222,219 B1 | * | 4/2001 | Gambino et al. ........ | 257/306 |
| 6,285,050 B1 | * | 9/2001 | Emma et al. ............ | 257/296 |
| 6,313,491 B1 | * | 11/2001 | Shuto ...................... | 257/295 |
| 6,340,632 B1 | * | 1/2002 | Fukada et al. ........... | 438/622 |
| 6,384,446 B2 | * | 5/2002 | Lee et al. ................ | 257/309 |
| 6,437,387 B2 | * | 8/2002 | Gutsche .................. | 257/301 |
| 6,528,366 B1 | * | 3/2003 | Tu et al. .................. | 438/253 |
| 2001/0000493 A1 | * | 4/2001 | Liu et al. ................. | 438/398 |
| 2002/0005583 A1 | * | 1/2002 | Harada et al. ........... | 257/758 |
| 2002/0058391 A1 | * | 5/2002 | Kim et al. ............... | 438/396 |
| 2002/0177287 A1 | * | 11/2002 | Downey et al. ......... | 438/396 |
| 2002/0192919 A1 | * | 12/2002 | Bothra .................... | 438/381 |

FOREIGN PATENT DOCUMENTS

JP          2000-228497          8/2000

OTHER PUBLICATIONS

Ruichen Liu, et al., "Single Mask Metal–Insulator–Metal (MIM) Capacitor with Copper Damascene Metallization for Sub–0.18 μm Mixed Mode Signal and System–on–a–Chip (SoC) Applications" 2000 IEEE pp. 111–113.

* cited by examiner

Primary Examiner—Amir Zarabian
Assistant Examiner—Ida M. Soward
(74) Attorney, Agent, or Firm—Oblon, Spivak, McClelland, Maier & Neustadt, P.C.

(57) ABSTRACT

A second-level wire is formed by a dual damascene process in a insulating film. In an upper surface of the first insulating film a metal film is formed and serves as a first electrode of an MIM-type capacitor. A second insulating films has a structure in which a plurality of insulating films are layered on a second interconnection layer, in this order. In a first insulating film of the plurality of insulating films, a second electrode of the MIM-type capacitor is formed. The second electrode has a first metal film formed on a second insulating film of the plurality of the insulating films and a second metal film is formed on the first metal film. A portion of the second insulating film which is sandwiched between the first electrode and the second electrode of the MIM-type capacitor serves as a capacitor dielectric film of the MIM-type capacitor. In the second insulating film, a third-level wire is formed Thus, a semiconductor device and a method of manufacturing the same are provided such that the MIM-type capacitor is formed together with metal wires with no additional complicated step.

20 Claims, 89 Drawing Sheets

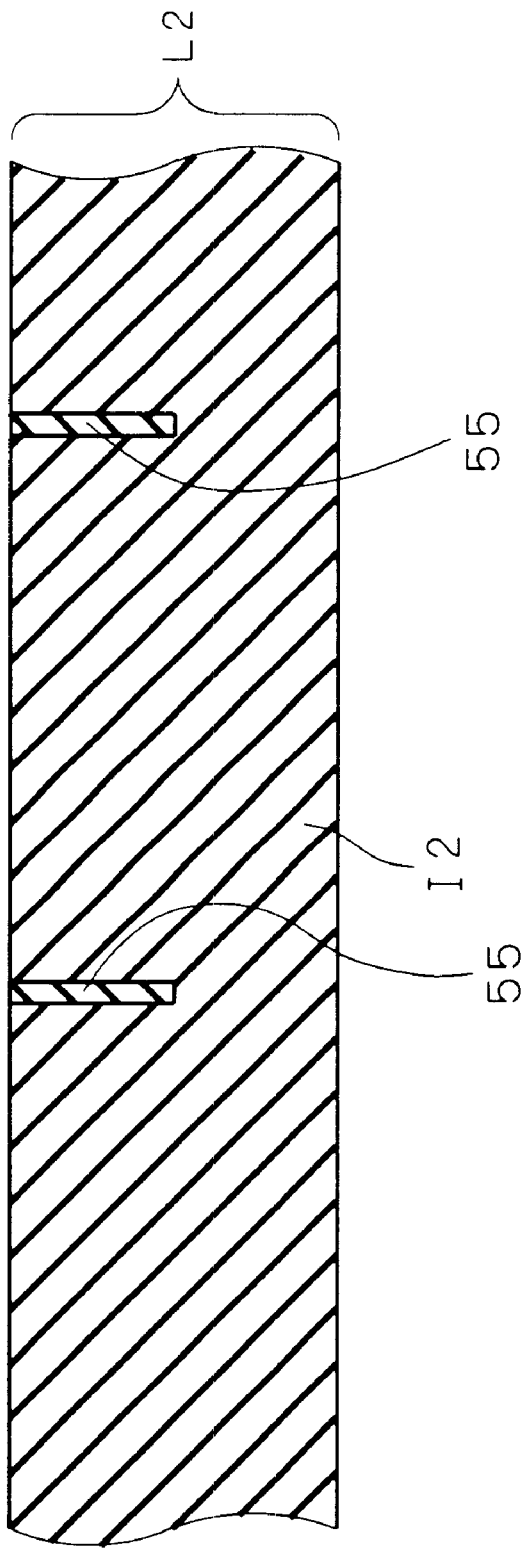
F I G . 6 9

SEMICONDUCTOR ELEMENT AND MIM-TYPE CAPACITOR FORMED IN DIFFERENT LAYERS OF A SEMICONDUCTOR DEVICE

TITLE OF THE INVENTION

Semiconductor Device comprising MIM-type Capacitor and Method of Manufacturing The Same

BACKGROUND OF THE INVENTION

1. Field of the Invention

The present invention relates to a semiconductor device and a method of manufacturing the same, and more particularly to a semiconductor device which comprises an MIM (Metal Insulator Metal)-type capacitor using copper and a method of manufacturing the same.

2. Description of the Background Art

FIG. 94 is a cross section showing a structure of a semiconductor device comprising a capacitor in the background art. In an upper surface of a silicon substrate 101 formed is an isolation insulating film 102 made of a silicon oxide film. In an element formation region defined by the isolation insulating film 102, a MOS transistor is formed. The MOS transistor has a gate structure consisting of a gate oxide film 103, a gate electrode 104 and sidewalls 105 and source/drain regions 106 which are paired with each other with a channel region below the gate structure interposed therebetween. On the isolation insulating film 102 formed is a PIP (Polysilicon Insulator polysilicon)-type capacitor having a lower electrode 116 and an upper electrode 118 both of which are made of polysilicon and a dielectric film 117 of ON (Oxide Nitride) structure. The PIP-type capacitor can be formed with no additional complicate process since its upper electrode and lower electrode are each made of a polysilicon film which is widely used in a manufacturing process for a semiconductor device.

On the silicon substrate 101 formed is an interlayer insulating film 107 covering the MOS transistor and the PIP-type capacitor. In the interlayer insulating film 107 formed are a plurality of plugs 108 connected to the source/drain regions 106 of the MOS transistor and the upper electrode 118 and the lower electrode 116 of the PIP-type capacitor. On the interlayer insulating film 107, a first interconnection layer is formed. The first interconnection layer has an insulating film 109, a plurality of metal wires 110 formed in the insulating film 109 and a plurality of plugs 111 connected to the metal wires 110. The metal wires 110 are connected to the plugs 108, respectively.

On the first interconnection layer, a second interconnection layer is formed. The second interconnection layer has an insulating film 112, a plurality of metal wires 113 formed in the insulating film 112 and a plurality of plugs 114 connected to the metal wires 113. The metal wires 113 are connected to the plugs 111, respectively. On the second interconnection layer formed are a plurality of metal wires 115 connected to the plugs 114, respectively.

The PIP-type capacitor, however, whose voltage coefficient (VCC) is about 220 ppm/V and temperature coefficient (TCC) is about 120 ppm/° C., which cause a relatively large variation in capacitance due to voltage variation and temperature variation, has a problem of unstable characteristics against voltage variation and temperature variation. Further, since the resistance value of polysilicon is relatively large, especially when the PIP-type capacitor is used for a radio frequency circuit, there arises a problem of low stability of circuit operation.

In an attempt to solve the problems of the PIP-type capacitor, recently, there has been a promotion of development of an MIM-type capacitor having an upper electrode and a lower electrode made of a metal. The MIM-type capacitor, whose VCC value is a fifth to a sixth of that of the PIP-type capacitor and TCC value is a half of that of the PIP-type capacitor or lower, has high stability of characteristics against voltage variation and temperature variation. Further, since a metal has lower resistance value than polysilicon, when the MIM-type capacitor is used for a radio frequency circuit, the stability of circuit operation is improved as compared with the case of using the PIP-type capacitor.

The MIM-type capacitor is formed together with the metal wires in a BEOL (Back End Of the Line) process which is one of the semiconductor manufacturing processes. In the background-art BEOL process, an aluminum wire is generally used as a metal wire. Since there has arisen a problem of wire delay in aluminum wire as devices have become smaller, however, a copper wire which has lower resistance than the aluminum wire has been recently being used. The copper wire is generally formed in a damascene process, not in an etching process, due to the difficulty of copper in patterning by etching unlike aluminum. Therefore, forming an MIM-type capacitor having copper electrodes needs a new structure and a new process, unlike the MIM-type capacitor having aluminum electrodes in the background art.

SUMMARY OF THE INVENTION

An object of the present invention is to provide a semiconductor device and a method of manufacturing the same, in which an MIM-type capacitor can be formed together with metal wires with no additional complicate process when the metal wires are formed by a damascene process step in the BEOL process.

According to a first aspect of the present invention, the semiconductor device includes a substrate, a semiconductor element, an interlayer insulating film, and an MIM (Metal Insulator Metal)-type capacitor. The semiconductor element is formed on the substrate. The interlayer insulating film is so formed on the substrate as to cover the semiconductor element. The capacitor is formed in the interlayer insulating film and electrically connected to the semiconductor element. The capacitor has a first metal film, a dielectric film, and a second metal film. The first metal film is formed on side surfaces and a bottom surface of a recess defined in the interlayer insulating film, serving as a first electrode. The dielectric film is formed on the first metal film. The second metal film fills the recess and is opposed to the first metal film with the dielectric film interposed therebetween, serving as a second electrode.

In this semiconductor device, the first electrode is formed not only on the bottom surface of the recess but also on the side surfaces thereof. Therefore, the area in which the first electrode and second electrode are opposed to each other is enlarged and the capacitor capacitance is thereby increased.

According to a second aspect of the present invention, the semiconductor device includes a substrate, a semiconductor element, an interlayer insulating film, and an MIM (Metal Insulator Metal)-type capacitor. The semiconductor element is formed on the substrate. The interlayer insulating film is so formed on the substrate as to cover the semiconductor element. The capacitor is formed in the interlayer insulating film and electrically connected to the semiconductor element. The interlayer insulating film has a predetermined insulating layer. The capacitor has a first metal film, a dielectric film, and a second metal film. The first metal film is formed in a main surface of the insulating layer, serving a first electrode. The dielectric film is formed on a side surface of the first metal film in the main surface of the insulating layer. The second metal film is opposed to the first metal film with the dielectric film interposed therebetween in the main surface of the insulating layer, serving as a second electrode.

In this semiconductor device, since the first electrode and the second electrode are formed in the same plane, the flatness of surface is improved as compared with the case where the first electrode and the second electrode are layered. Therefore, when the MIM-type capacitor is formed in the multi-level wire structure, it is possible to suppress level difference in the surfaces of interconnection layers.

According to a third aspect of the present invention, the semiconductor device includes a substrate, a semiconductor element, an interlayer insulating film, and an MIM (Metal Insulator Metal)-type capacitor. The semiconductor element is formed on the substrate. The interlayer insulating film is so formed on the substrate as to cover the semiconductor element. The capacitor is formed in the interlayer insulating film and electrically connected to the semiconductor element. The capacitor has a plurality of first metal films, a second metal film, a dielectric film, and a third metal film. The plurality of first metal films are connected to one another with a wire formed in the interlayer insulating film. The second metal film is formed extending onto the plurality of first metal films, serving as a first electrode together with the plurality of first metal films. The dielectric film is formed on the second metal film. The third metal film is opposed to the second metal film with the dielectric film interposed therebetween, serving as a second electrode.

In this semiconductor device, the dielectric film is formed not directly on the first metal films but on the second metal film. Therefore, a film other than the antioxidizing film for the first metal film can be used as the dielectric film.

Moreover, since the first metal film is divided into a plurality of films, the area of an upper surface of each divided first metal film is reduced. Therefore, it is possible to reduce dishing in the CMP process.

These and other objects, features, aspects and advantages of the present invention will become more apparent from the following detailed description of the present invention when taken in conjunction with the accompanying drawings.

BRIEF DESCRIPTION OF THE DRAWINGS

FIG. 69 is a cross section showing a structure of a semiconductor device in accordance with a twelfth preferred embodiment of the present invention;

DESCRIPTION OF THE PREFERRED EMBODIMENTS

Figure 1:
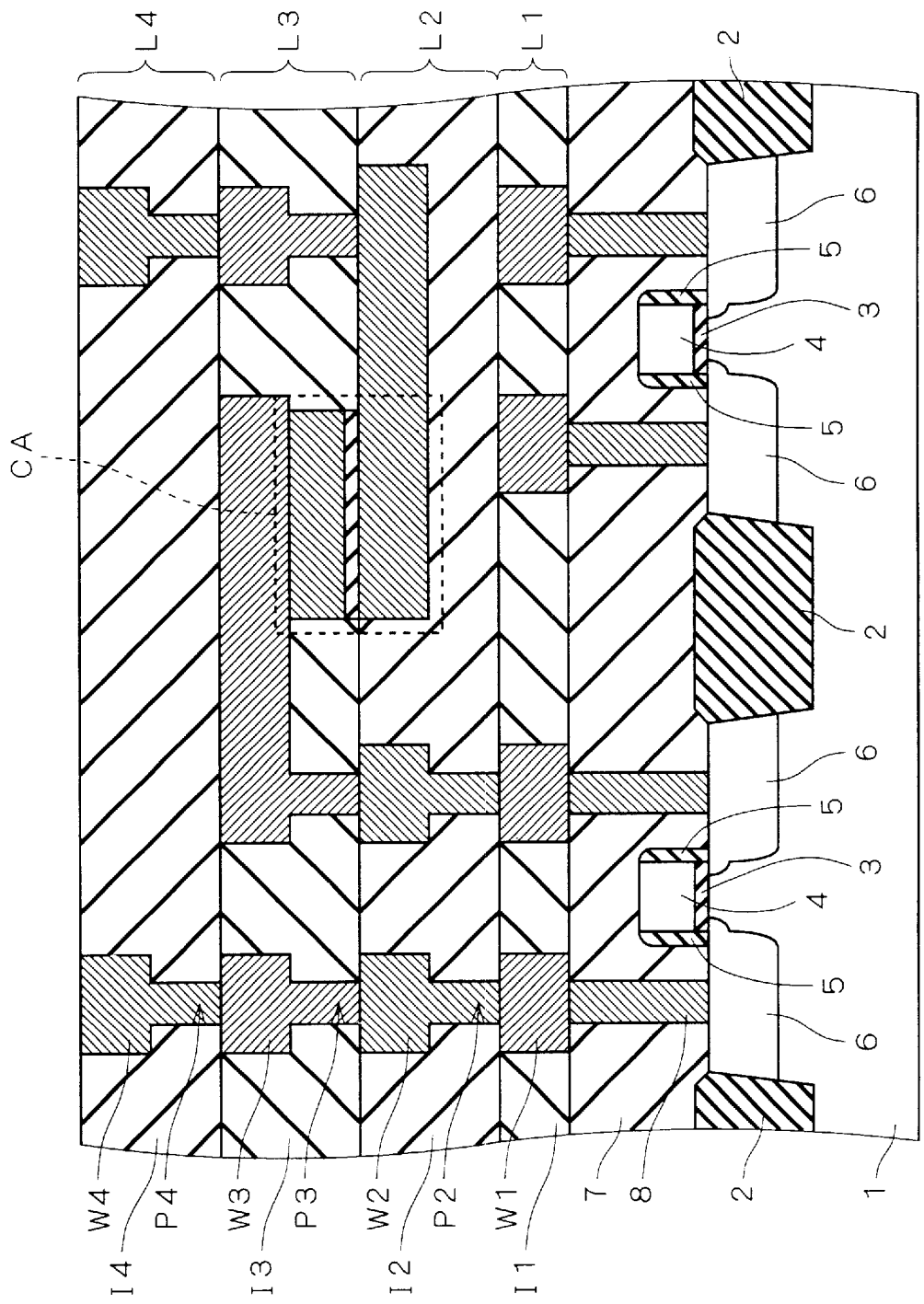
FIG. 1 is a cross section showing a structure of a semiconductor device comprising an MIM-type capacitor formed in a BEOL process.

FIG. 1 is a cross section showing a structure of a semiconductor device comprising an MIM-type capacitor formed in a BEOL process. In an upper surface of a silicon substrate 1 formed is an isolation insulating film 2 made of a silicon oxide film. In an element formation region defined by the isolation insulating film 2, a MOS transistor is formed. The MOS transistor has a gate structure consisting of a gate oxide film 3, a gate electrode 4 and sidewalls 5 and source/drain regions 6 which are paired with each other with a channel region below the gate structure interposed therebetween.

On the silicon substrate 1 formed is an interlayer insulating film 7 made of a silicon oxide film to cover the MOS transistor. In the interlayer insulating film 7 formed are a plurality of plugs 8 connected to the source/drain regions 6 of the MOS transistor. On the interlayer insulating film 7 formed is a multi-level wire structure having a plurality of interconnection layers. FIG. 1 shows a multi-level wire structure having four interconnection layers, i.e., first to fourth interconnection layers L1 to L4, as an example. On the interlayer insulating film 7, the first interconnection layer L1 is formed. The first interconnection layer L1 has an insulating film I1 and a plurality of first-level wires W1 formed in the insulating film I1. The first-level wires W1 are connected to the plugs 8, respectively.

On the first interconnection layer L1, a second interconnection layer L2 is formed. The second interconnection layer L2 has an insulating film I2 and a plurality of second-level wires W2 formed by a dual damascene process in the insulating film I2. Plug portions P2 of the second-level wires W2 are connected to the first-level wires W1. A third interconnection layer L3 is formed on the second interconnection layer L2 and a fourth interconnection layer L4 is formed on the third interconnection layer L3. Like the second interconnection layer L2, the third interconnection layer L3 has an insulating film I3 and a plurality of third-level wires W3, and the fourth interconnection layer L4 has an insulating film I4 and a plurality of fourth-level wires W4. Plug portions P3 of the third-level wires W3 are connected to the second-level wires W2, respectively, and plug portions P4 of the fourth-level wires W4 are connected to the third-level wires W3, respectively.

Figure 94:
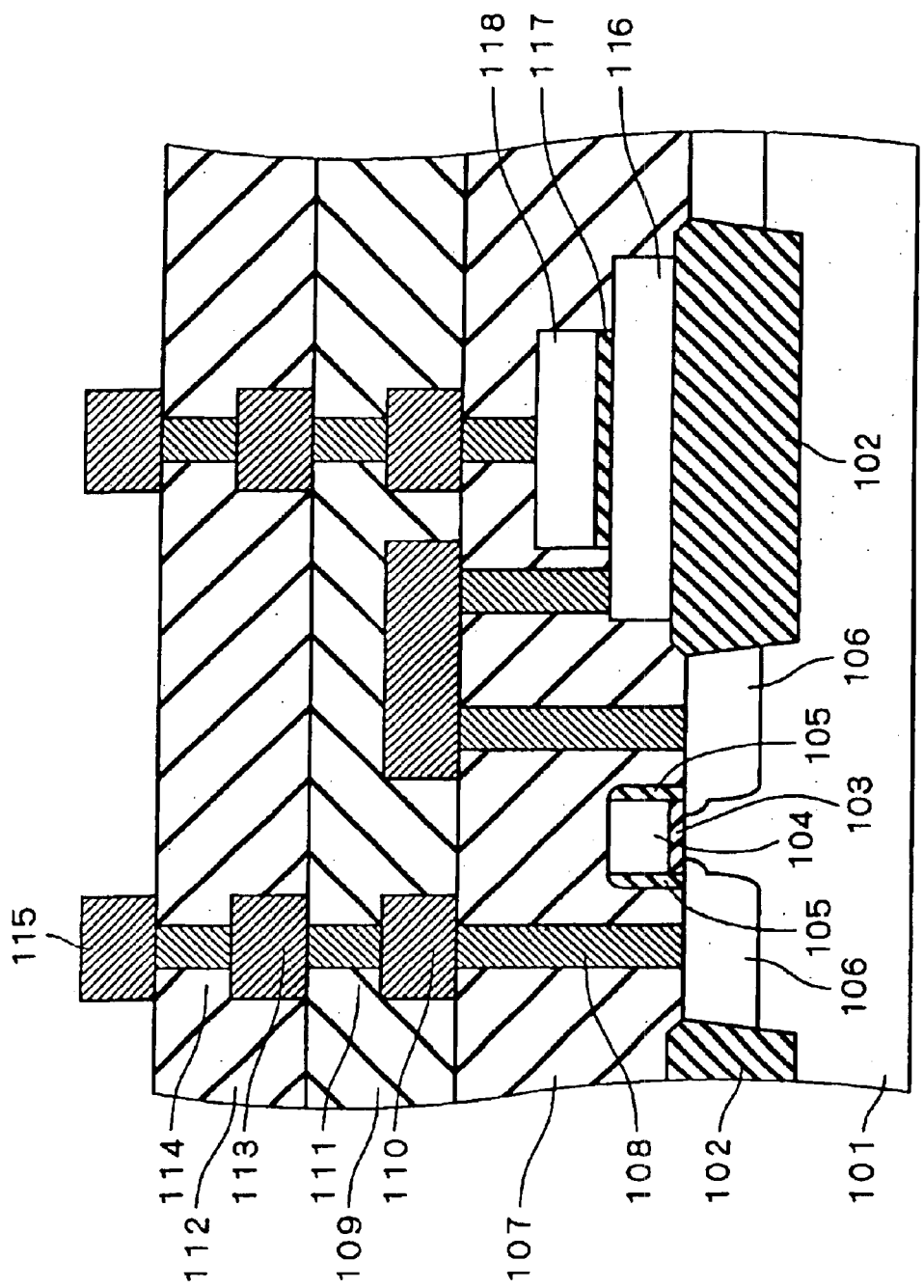
FIG. 94 is a cross section showing a structure of a semiconductor device comprising a capacitor in the background art.

The MIM-type capacitor CA, unlike the background-art PIP-type capacitor shown in FIG. 94, is formed in the multi-level wire structure, not on the isolation insulating film 2. In the case of FIG. 1, the MIM-type capacitor CA is formed in the second interconnection layer L2 and the third interconnection layer L3. Needless to say, the MIM-type capacitor CA may be formed in other interconnection layers and further the multi-level wire structure may have more interconnection layers.

More specific discussion will be made below on preferred embodiments of the present invention, taking the case where the MIM-type capacitor CA is formed in the second interconnection layer L2 and the third interconnection layer L3 as an example and focusing attention on only the second interconnection layer L2 and the third interconnection layer L3.

The First Preferred Embodiment

Figure 2:
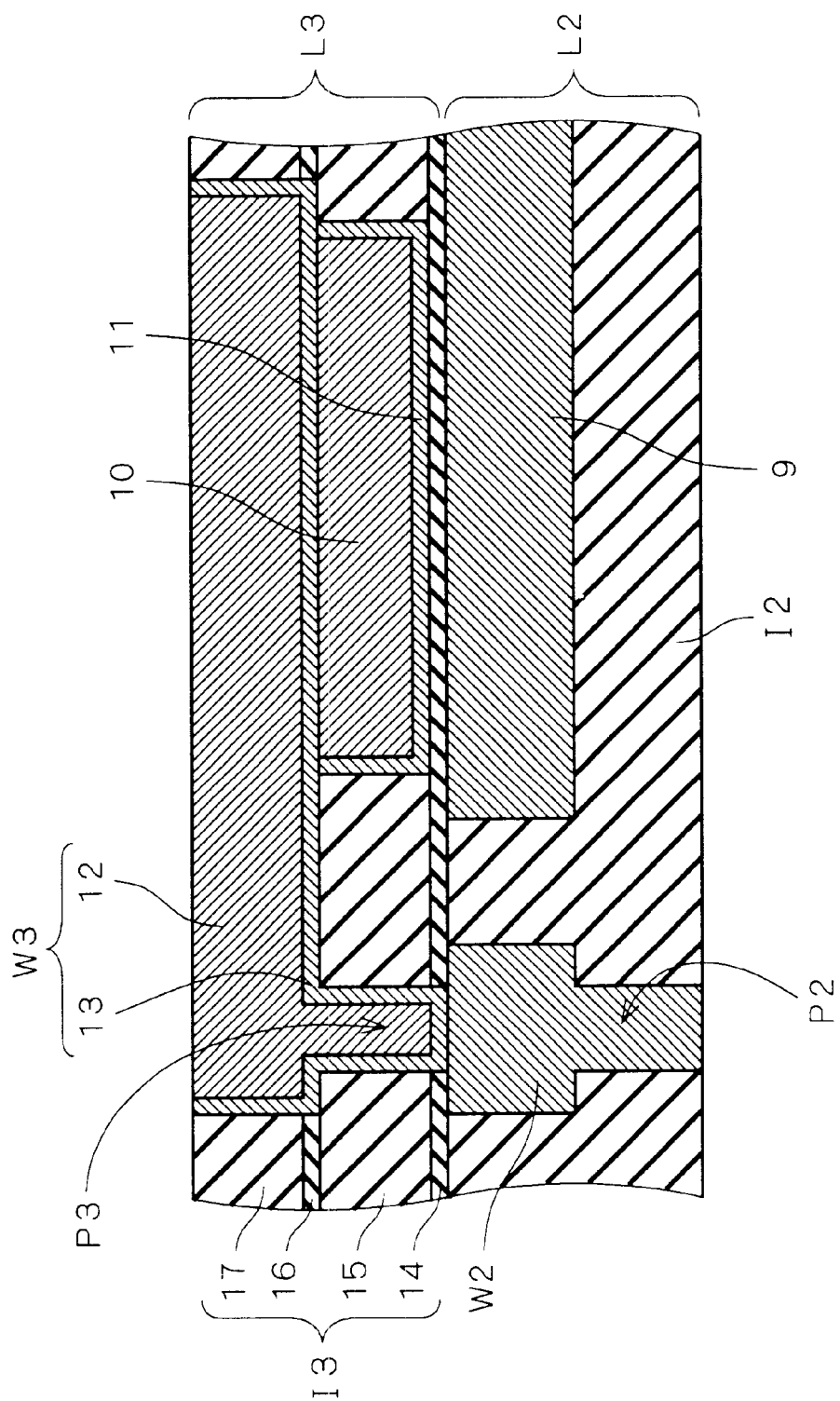
FIG. 2 is a cross section showing a structure of a semiconductor device in accordance with a first preferred embodiment of the present invention.
Figure 3:
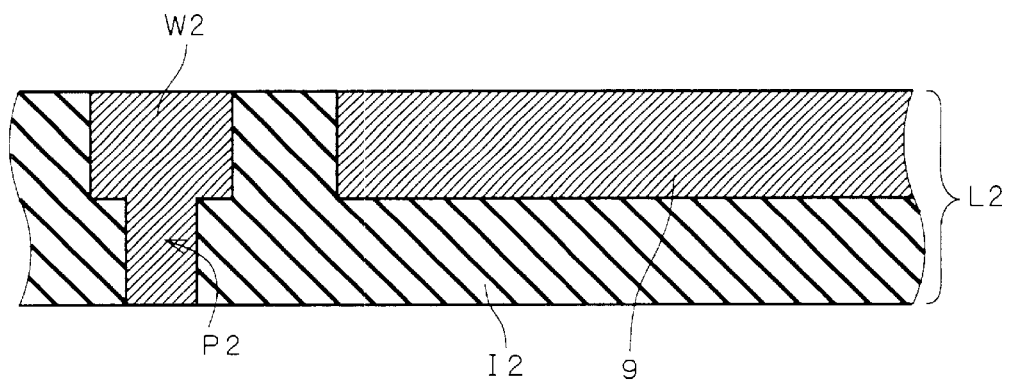
FIGS. 3 to 11 are cross sections showing a method of manufacturing a semiconductor device in accordance with the first preferred embodiment of the present invention step by step in sequence.
Figure 4:
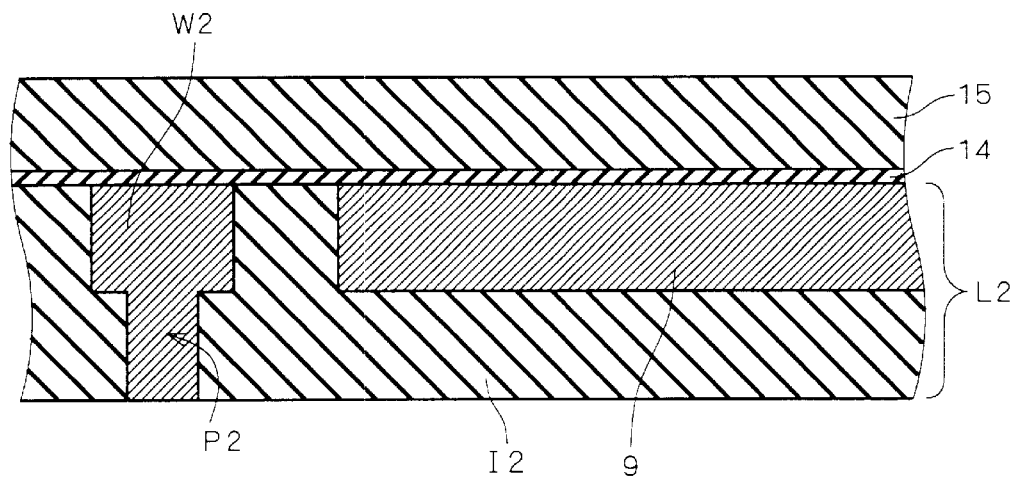

FIG. 2 is a cross section showing a structure of a semiconductor device in accordance with the first preferred embodiment of the present invention. The second interconnection layer L2 has the insulating film I2 made of a silicon oxide film. In the insulating film I2, the second-level wire W2 is formed by a dual damascene process. The second-level wire W2 is made of a metal such as copper, aluminum and tungsten, and it is assumed that the metal is copper in the first preferred embodiment. The second-level wire W2 has an interconnection portion in its upper portion (in an upper surface of the second interconnection layer L2) and the plug portion P2 in its lower portion. The plug portion P2 is connected to the wire in the lower layer or the like. Further, a metal film 9 serving as a first electrode of the MIM-type capacitor is formed in an upper surface of the insulating film I2. In the first preferred embodiment, the metal film 9 is made of copper. Further, at an interface between the second-level wire W2 and the insulating film I2 and an interface between the metal film 9 and the insulating film I2, a barrier metal made of a metal such as TaN (tantalum nitride), Ta (tantalum) and TiN (titanium nitride) may be formed. This also applies to other preferred embodiments discussed later.

The third interconnection layer L3 is formed on the upper surface of the second interconnection layer L2. The third interconnection layer L3 has the insulating film I3 having almost the same film thickness as the insulating film I2 has. The insulating film I3 has a structure in which insulating films 14 to 17 are layered on the upper surface of the second interconnection layer L2 in this order. The insulating film 14 is made of SiO$_2$ (silicon oxide film), Si$_3$N$_4$ (silicon nitride film), SiC (silicon carbide), Ta$_2$O$_3$ or the like. When Si$_3$N$_4$ or SiC is used for the insulating film 14, the insulating film 14 has a function of preventing oxidation of the second-level wire W2 and the metal film 9 both of which are made of copper, serving as an antioxidizing film. Further, when a film of Si$_3$N$_4$, SiC, Ta$_2$O$_3$ or the like which has higher dielectric constant than SiO$_2$ is used for the insulating film 14, capacitor capacitance is increased. The increase in capacitor capacitance in the case where the film having high dielectric constant such as Si$_3$N$_4$, SiC, Ta$_2$O$_3$ or the like is used as a capacitor dielectric film also applies to the preferred embodiments discussed later.

The insulating film 15 is made of a silicon oxide film, SiOC or the like. In the insulating film 15, a second electrode of the MIM-type capacitor is formed. The second electrode has a metal film 11 formed on the insulating film 14 and a metal film 10 formed on the metal film 11. In the first preferred embodiment, the metal film 10 is made of copper and the metal film 11 is made of TaN, Ta, TiN or the like. The metal film 11 has a function of preventing diffusion of the material of the metal film 10 out of this film, serving as a barrier metal (diffusion barrier film). An upper surface of the first electrode and a bottom surface of the second electrode in the MIM-type capacitor are opposed to each other with the insulating film 14 interposed therebetween. A portion of the insulating film 14 which is sandwiched between the first electrode and the second electrode serves as a capacitor dielectric film of the MIM-type capacitor.

The insulating film 16 is made of Si$_3$N$_4$, SiC or the like. The insulating film 16 serves as an antioxidizing film for the metal film 10. The insulating film 17 is made of a silicon oxide film or the like. In the insulating film I3, the third-level wire W3 is formed. The third-level wire W3 has an interconnection portion in its upper portion (in the insulating films 16 and 17) and the plug portion P3 in its lower portion (in the insulating films 14 and 15). The interconnection portion of the third-level wire W3 is connected to an upper surface of the metal film 10. The plug portion P3 is connected to the second-level wire W2 of the second interconnection layer L2 which is lower layer of the third interconnection layer L3. The third-level wire W3 has a metal film 13 serving as a barrier metal and a metal film 12 formed on the metal film 13. In the first preferred embodiment, the metal film 12 is made of copper and the metal film 13 is made of TaN, Ta, TiN or the like.

FIGS. 3 to 11 are cross sections showing a method of manufacturing the semiconductor device of FIG. 2 in accordance with the first preferred embodiment of the present invention step by step in sequence. First, referring to FIG. 3, the second-level wire W2 and the metal film 9 are formed in the insulating film I2 of the second interconnection layer L2 by a dual damascene process. The metal film 9 has a film thickness of about 100 to 1000 nm. Next, referring to FIG. 4, the insulating film 14 is formed by CVD (Chemical Vapor Deposition) to have a film thickness of about 50 to 100 nm on the upper surface of the second interconnection layer L2. Subsequently, the insulating film 15 is formed by CVD to have a film thickness of about 100 to 1000 nm on the insulating film 14.

Figure 5:
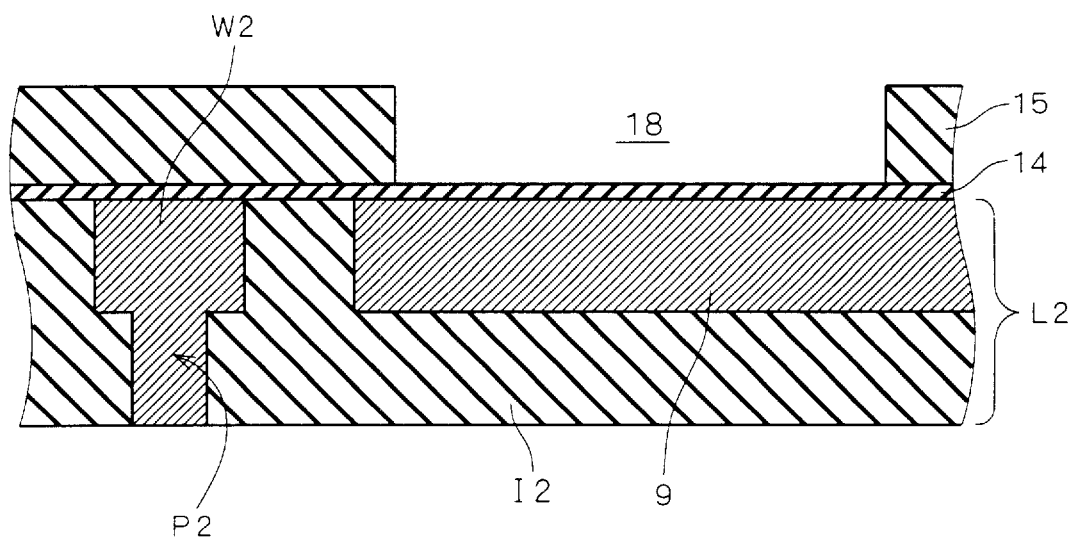

Next, referring to FIG. 5, the insulating film 15 is patterned by photolithography and anisotropic dry etching to form a recess 18 having a bottom surface defined by an upper surface of the insulating film 14 in the insulating film 15. This photolithography is performed with a photomask having an opening pattern corresponding to the formation layout of the second electrode of the MIM-type capacitor. Further, this anisotropic dry etching is performed under the condition of high selectivity for the material of the insulating film 14 (in other words, under the condition that the material of the insulating film 14 is hard to etch).

Figure 6:
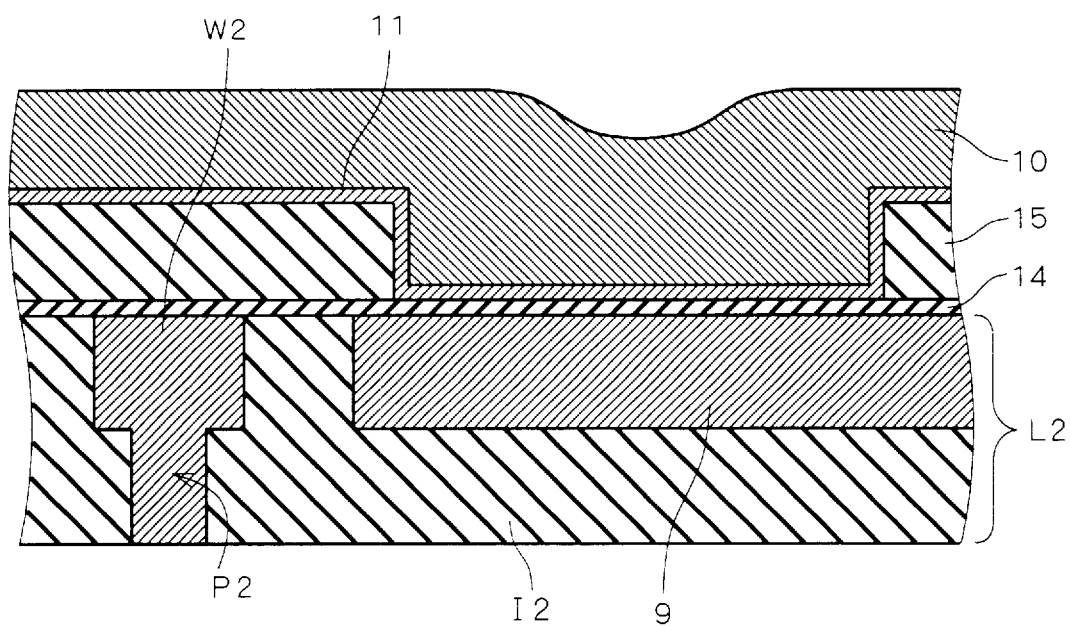
Figure 7:
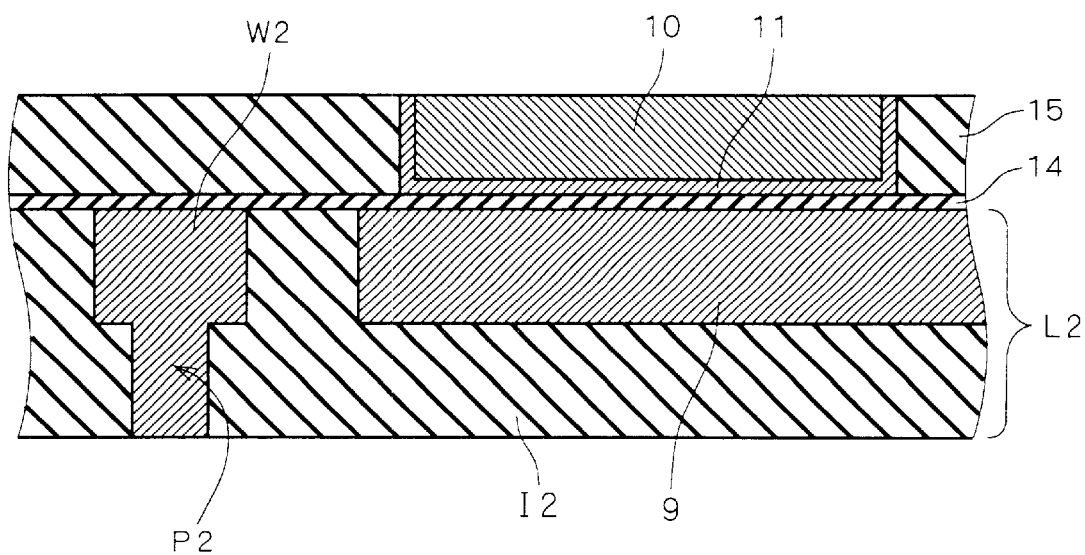

Next, referring to FIG. 6, the metal film 11 is entirely formed by sputtering to have a film thickness of about 10 to 100 nm. Subsequently, the metal film 10 is entirely formed by plating to have a film thickness enough to fully fill the inside of the recess 18. Next, referring to FIG. 7, the metal films 10 and 11 are polished by CMP (Chemical Mechanical Polishing) till an upper surface of the insulating film 15 is exposed to planarize the surfaces of these metal and insulating films.

Figure 8:
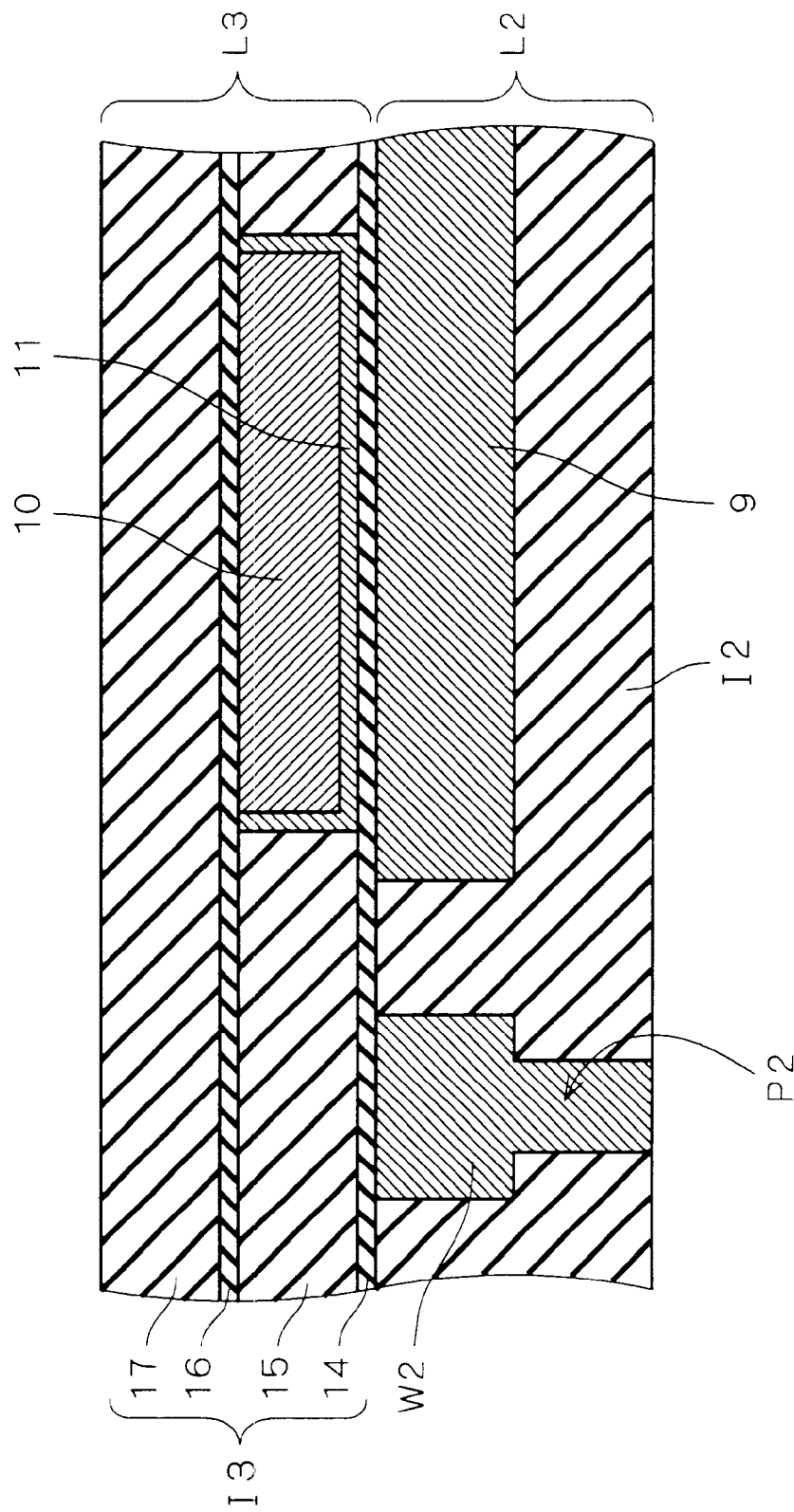
Figure 9:
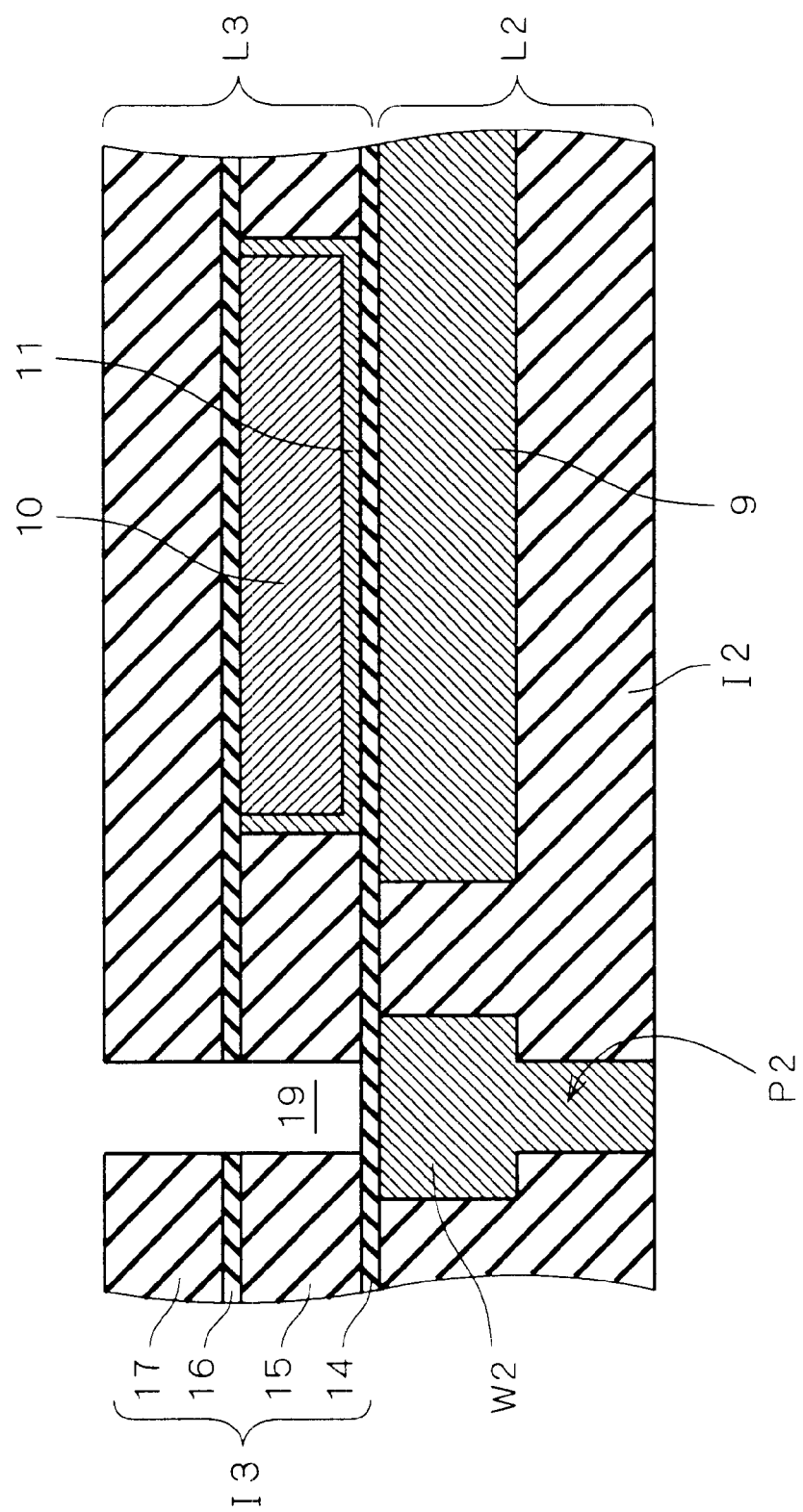

Next, referring to FIG. 8, the insulating film 16 is entirely formed by CVD to have a film thickness of about 50 to 100 nm. Subsequently, the insulating film 17 is formed by CVD to have a film thickness of about 100 to 1000 nm on the insulating film 16. Next, referring to FIG. 9, portions of the insulating films 17, 16 and 15 which are positioned above the second-level wire W2 are etched by photolithography and anisotropic dry etching in this order, to form a contact hole 19. This anisotropic dry etching for the insulating film 15 is performed under the condition of high selectivity for the material of the insulating film 14.

Figure 10:
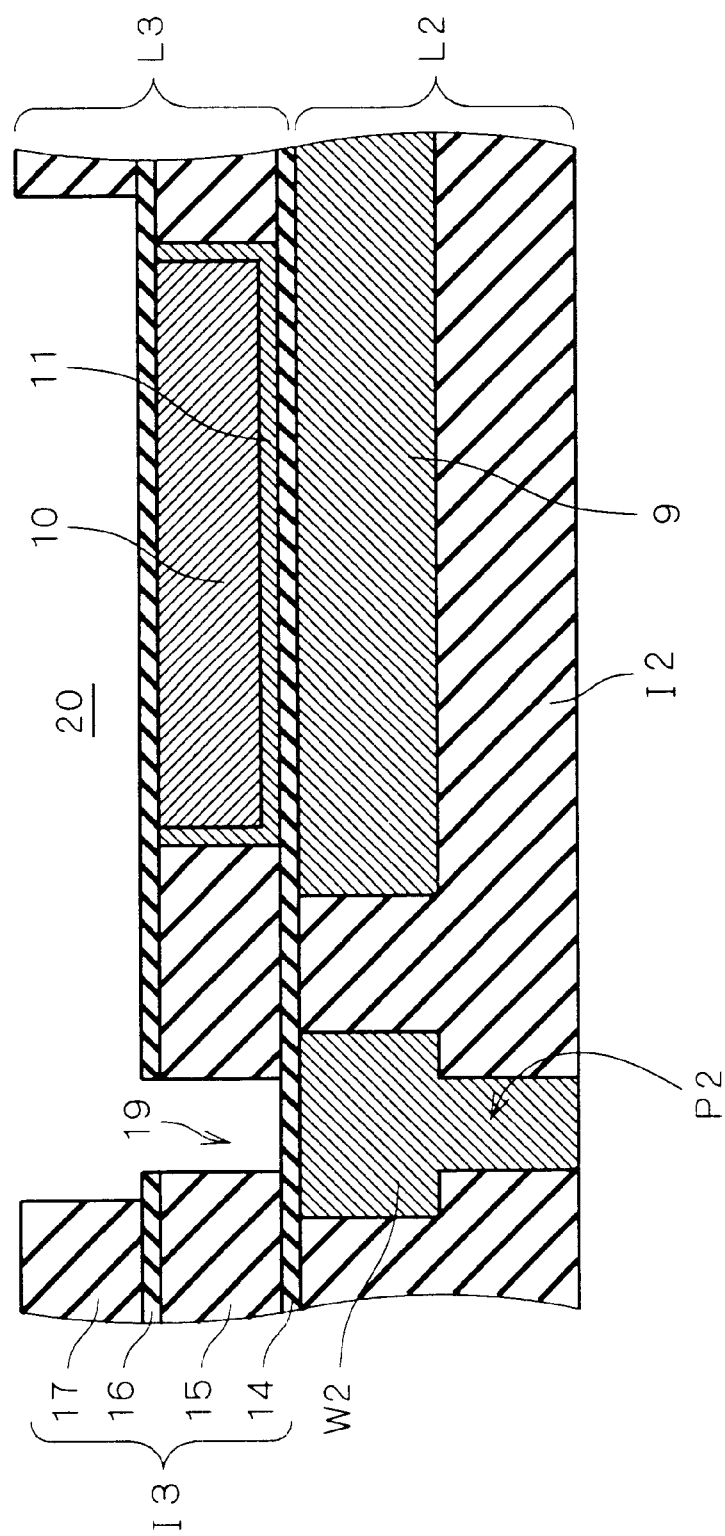
Figure 11:
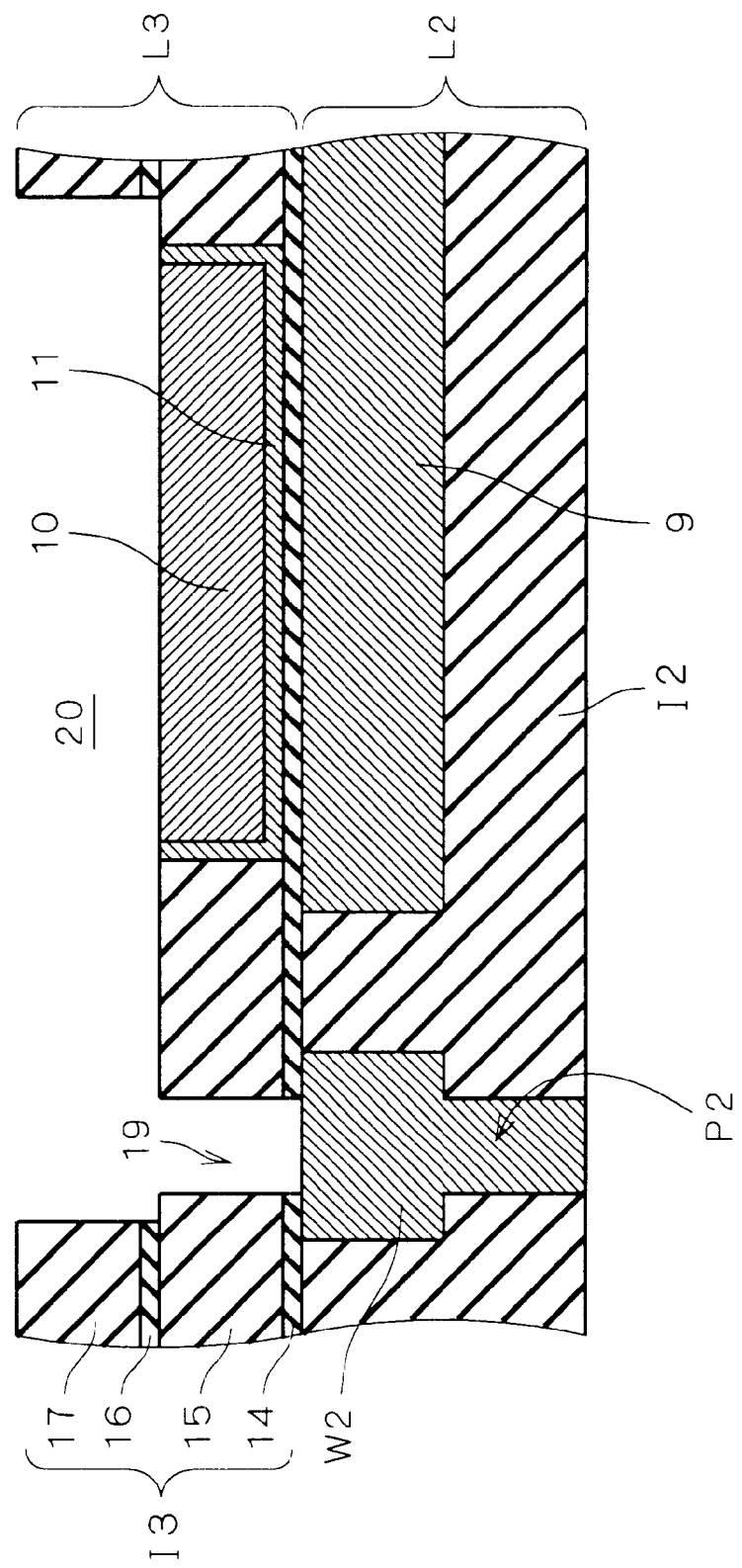

Next, referring to FIG. 10, the insulating film 17 is patterned by photolithography and anisotropic dry etching, to form an interconnection trench 20 having a portion overlapping the contact hole 19 in the insulating film 17. This photolithography is performed with a photomask having an opening pattern corresponding to the formation layout of the third-level wire W3. This anisotropic dry etching is performed under the condition of high selectivity for the materials of the insulating films 14 and 16. Next, referring to FIG. 11, a portion of the insulating film 16 which is not covered with the insulating film 17 and a portion of the insulating film 14 which is not covered with the insulating film 15 are removed by fall etchback, to expose the upper surface of the metal film 10 and the upper surface of the second-level wire W2.

Subsequently, the metal film 13 is entirely formed by sputtering. Then, the metal film 12 is entirely formed by plating to have a film thickness enough to fully fill the inside of the contact hole 19 and the inside of the interconnection trench 20. The metal films 12 and 13 are polished by CMP till an upper surface of the insulating film 17 is exposed, to planarize the surfaces of these metal and insulating films. Through the above process steps, the structure shown in FIG. 2 is obtained.

Thus, according to the structure of the semiconductor device and the method of manufacturing the same of the first preferred embodiment, the MIM-type capacitor can be formed in the dual damascene process to form the multi-level wire structure. Moreover, no additional complicate process step is needed and only one additional photomask to be used for forming the recess 18 in the step of FIG. 5 is needed.

Further, when Si$_3$N$_4$ or SiC is used for the insulating film 14, the insulating film 14 serves both as the antioxidizing film for the metal film 9 and the second-level wire W2 and as the capacitor dielectric film of the MIM-type capacitor. Therefore, the number of process steps is reduced as compared with the case where the antioxidizing film and the capacitor dielectric film are separately formed.

Furthermore, when a capacitor is used in a semiconductor integrated circuit, one of electrodes of the capacitor is connected to a power-supply wire and the other is connected to a grounding wire in most cases. In this case, depending on the polarity of electric field which is applied to the capacitor, ions in one electrode are accelerated by the electric field, going through the capacitor dielectric film and reaching the other electrode, to cause a leak between these electrodes. Therefore, in order to suppress such a leak, it is desirable that a barrier metal should be formed between the electrode to which a high voltage is applied and the capacitor dielectric film. Considering this, in the semiconductor device of the first preferred embodiment shown in FIG. 2, it is desirable that the second electrode having the metal film 11 serving as the barrier metal should be adopted as the electrode to which a high voltage is applied. This also applies to other preferred embodiments discussed later.

The Second Preferred Embodiment

Figure 12:
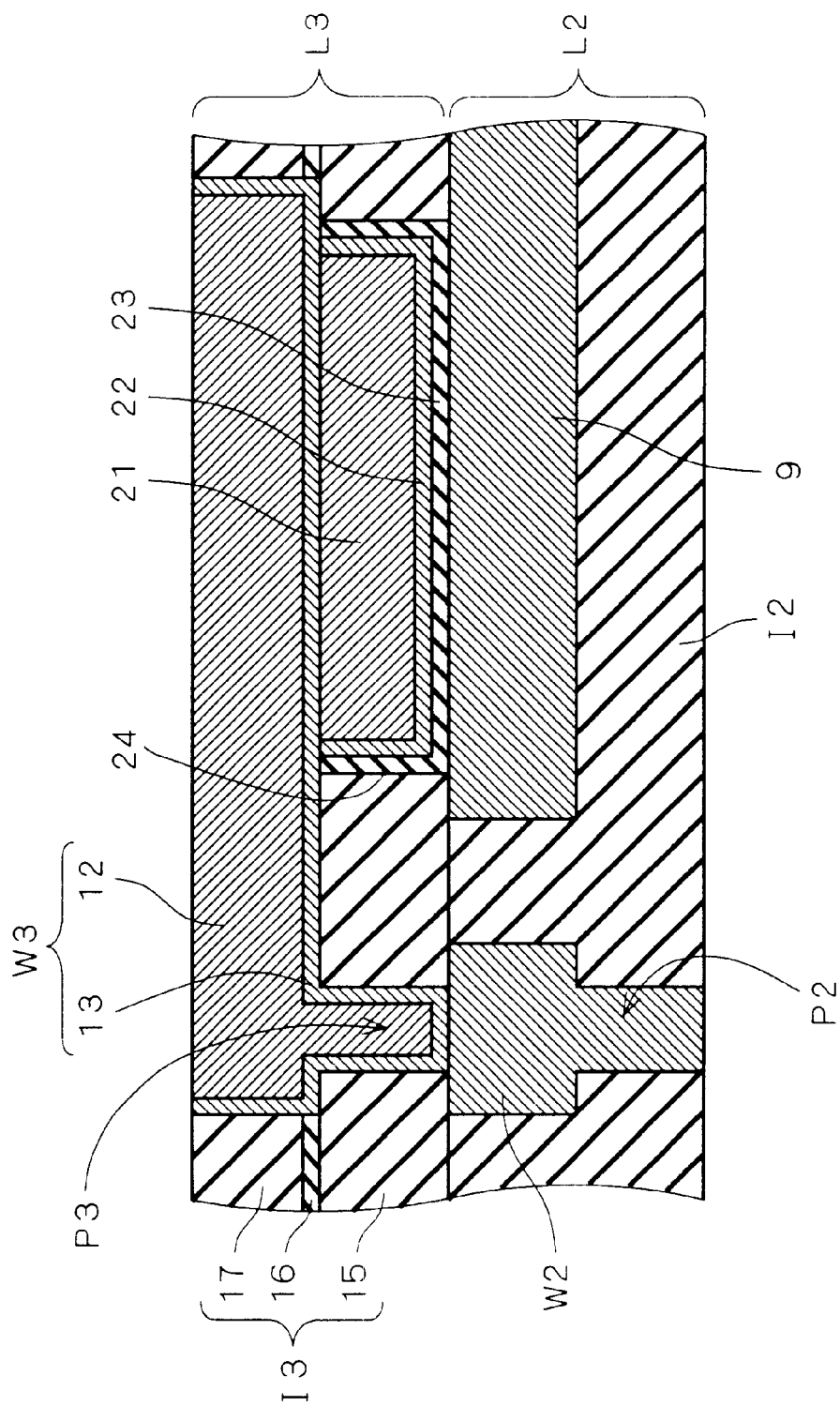
FIG. 12 is a cross section showing a structure of a semiconductor device in accordance with a second preferred embodiment of the present invention.
Figure 13:
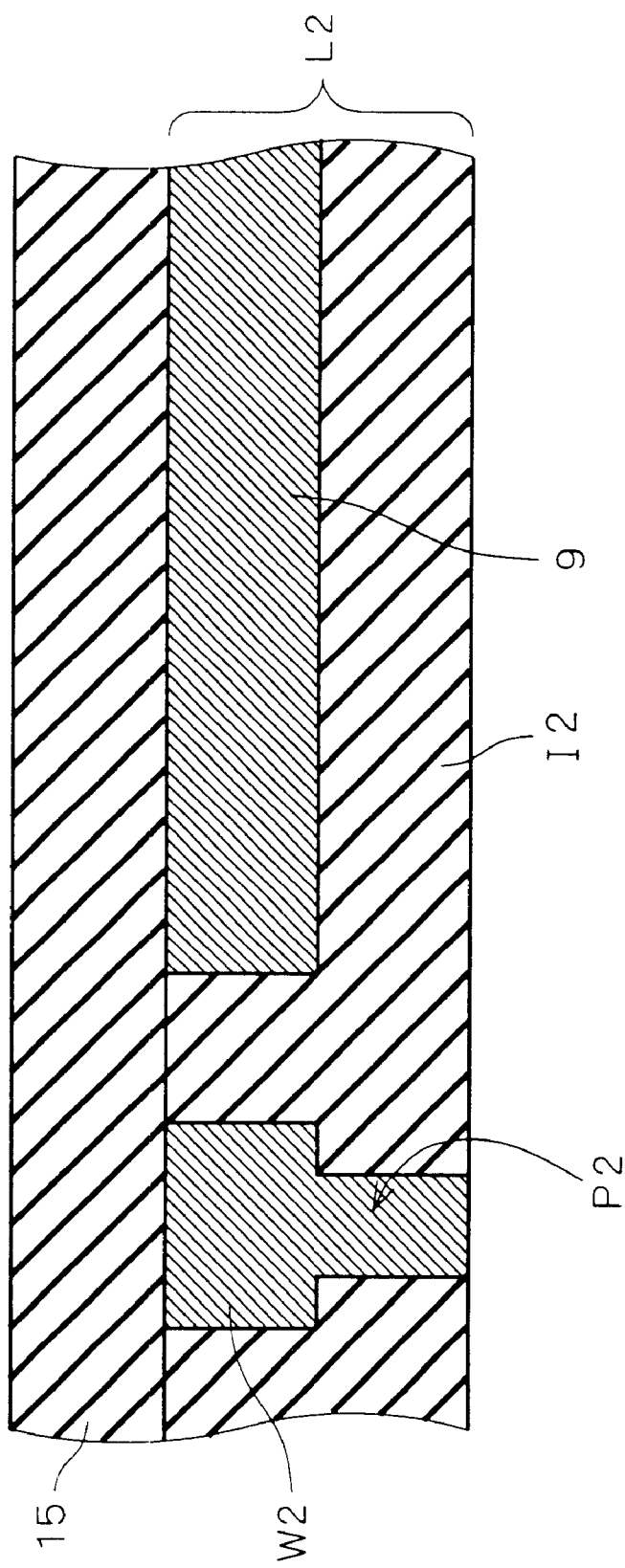
FIGS. 13 to 20 are cross sections showing a method of manufacturing a semiconductor device in accordance with the second preferred embodiment of the present invention step by step in sequence.

FIG. 12 is a cross section showing a structure of a semiconductor device in accordance with the second preferred embodiment of the present invention. The second interconnection layer L2 has the insulating film I2 and in the insulating film I2, the second-level wire W2 is formed by an etching process. Further, in the upper surface of the insulating film I2 formed is the metal film 9 serving as the first electrode of the MIM-type capacitor. In the second preferred embodiment, the materials of the second-level wire W2 and the metal film 9 are metals such as aluminum and tungsten.

The third interconnection layer L3 has the insulating film I3, and the insulating film I3 has a structure in which the insulating films 15 to 17 are layered on the upper surface of the second interconnection layer L2 in this order. In the insulating film 15 formed are an insulating film 23 serving as the capacitor dielectric film of the MIM-type capacitor and metal films 21 and 22 serving as the second electrode. Further, in the insulating film 15 formed is a recess 24 whose bottom surface is defined by an upper surface of the metal film 9. The insulating film 23 is formed on side surfaces and a bottom surface of the recess 24 and a portion of the insulating film 23 which is formed on the bottom surface of the recess 24 is in contact with the upper surface of the metal film 9. The metal film 22 is formed on the insulating film 23, and the metal film 21 is formed on the metal film 22. The insulating film 23 is made of $Si_3N_4$, SiC or the like, the metal film 21 is made of copper and the metal film 22 is made of TaN, Ta, TiN or the like. The metal film 22 serves as a barrier metal. A portion of the insulating film 23 which is sandwiched between the metal film 22 and the metal film 9 serves as the capacitor dielectric film of the MIM-type capacitor. The structure of the insulating films 16 and 17 and the third-level wire W3 is the same as shown in FIG. 2.

FIGS. 13 to 20 are cross sections showing a method of manufacturing the semiconductor device of FIG. 12 in accordance with the second preferred embodiment of the present invention step by step in sequence. First, referring to FIG. 13, the second-level wire W2 and the metal film 9 are formed in the insulating film I2 of the second interconnection layer L2 by an etching process. Specifically, an aluminum film is formed by sputtering to have a film thickness of about 100 to 1000 nm, and then the aluminum film is patterned by photolithography and anisotropic dry etching, to form the second-level wire W2 and the metal film 9. Subsequently, a space between the second-level wire W2 and the metal film 9 is filled with the insulating film I2 by CVD and CMP. Then, the insulating film 15 is formed by CVD to have a film thickness of about 100 to 1000 nm on the upper surface of the second interconnection layer L2. Further, the second-level wire W2 and the metal film 9 may be made of copper, and in this case, the insulating film 14 of $Si_3N_4$, SiC or the like is formed on the upper surface of the second interconnection layer L2 before the insulating film 15 is formed. This also applies to the third preferred embodiment discussed later.

Figure 14:
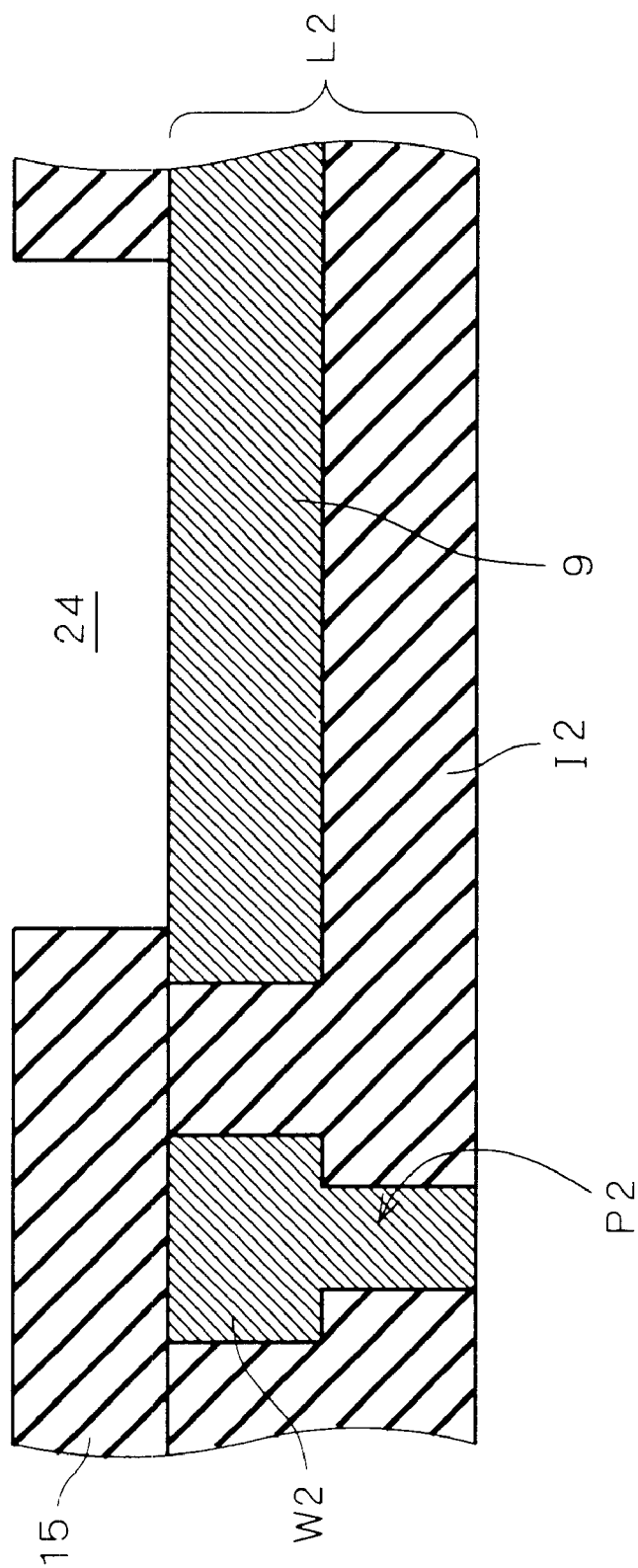

Next, referring to FIG. 14, the insulating film 15 is patterned by photolithography and anisotropic dry etching to form the recess 24 having the bottom surface defined by the upper surface of the metal film 9 in the insulating film 15. Further, when the insulating film 14 is formed on the upper surface of the second interconnection layer L2, the insulating film 14 is also removed in this process, to expose the upper surface of the metal film 9.

Figure 15:
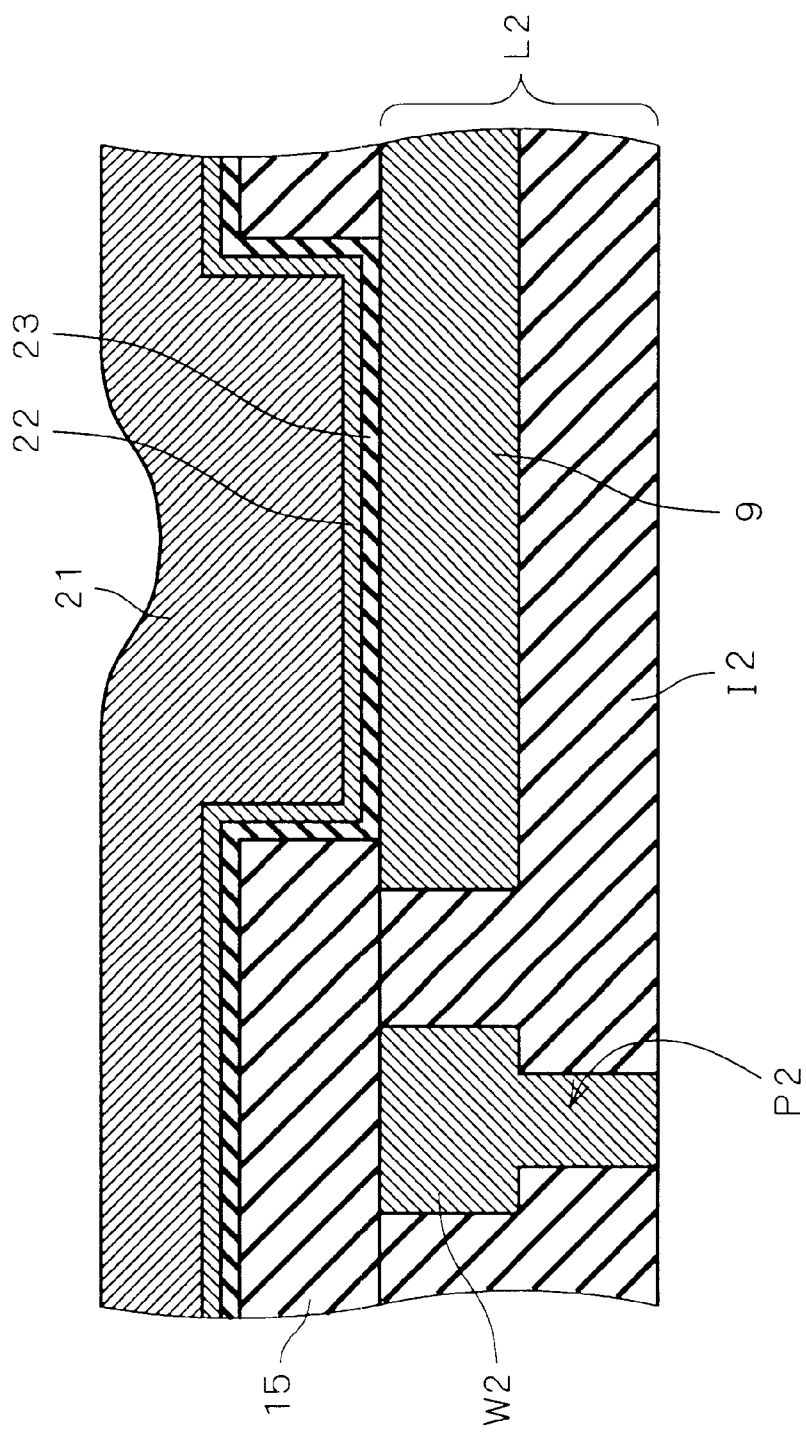
Figure 16:
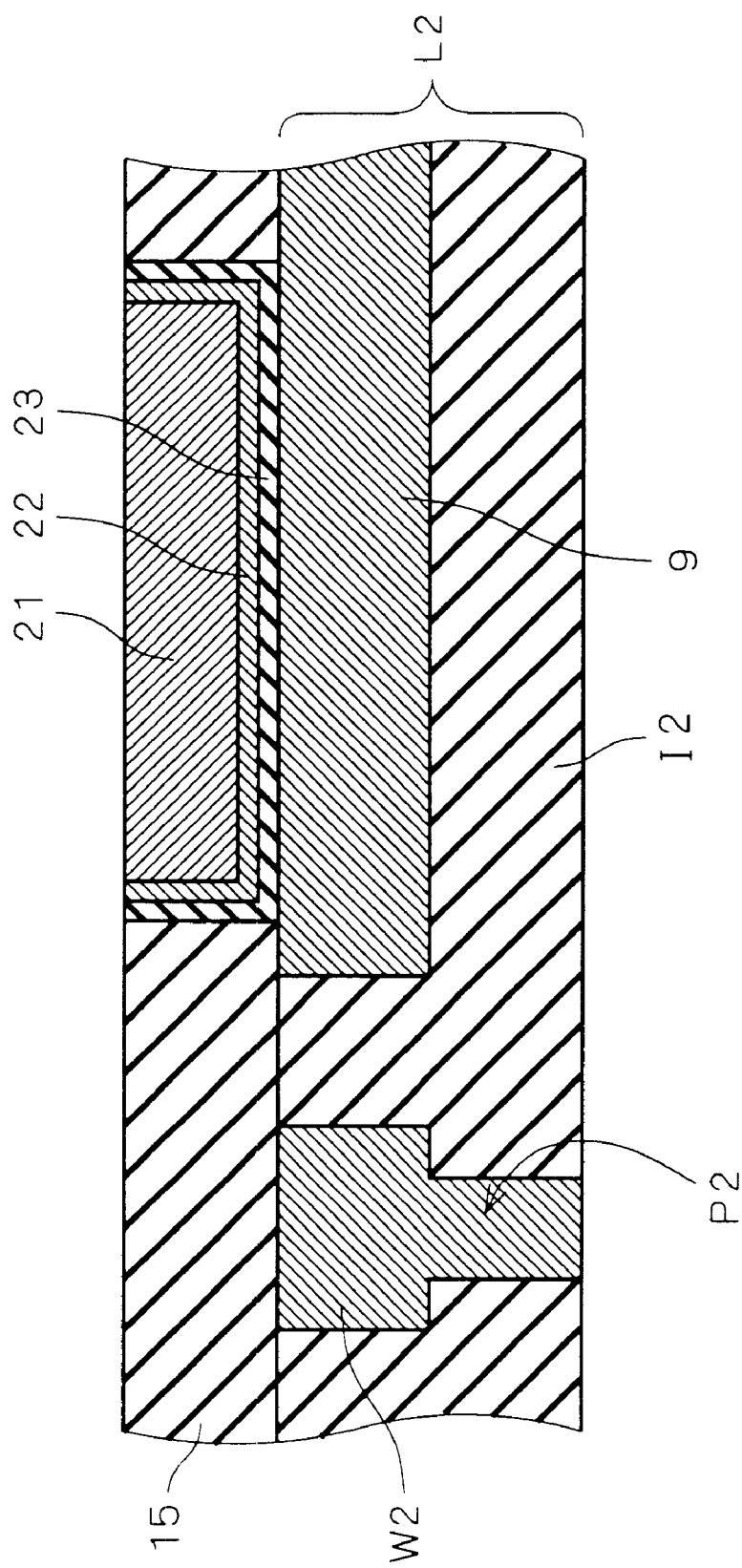

Next, referring to FIG. 15, the insulating film 23 is entirely formed by CVD to have a film thickness of about 50 to 100 nm. Specifically, the insulating film 23 is formed on the upper surface of the insulating film 15 and the side surfaces and the bottom surface of the recess 24. Subsequently, the metal film 22 is entirely formed by sputtering to have a film thickness of about 10 to 100 nm. Then, the metal film 21 is entirely formed by plating to have a film thickness enough to fully fill the inside of the recess 24. Next, referring to FIG. 16, the metal films 21 and 22 and the insulating film 23 are polished by CMP till the upper surface of the insulating film 15 is exposed to planarize the surfaces of these metal and insulating films.

Figure 17:
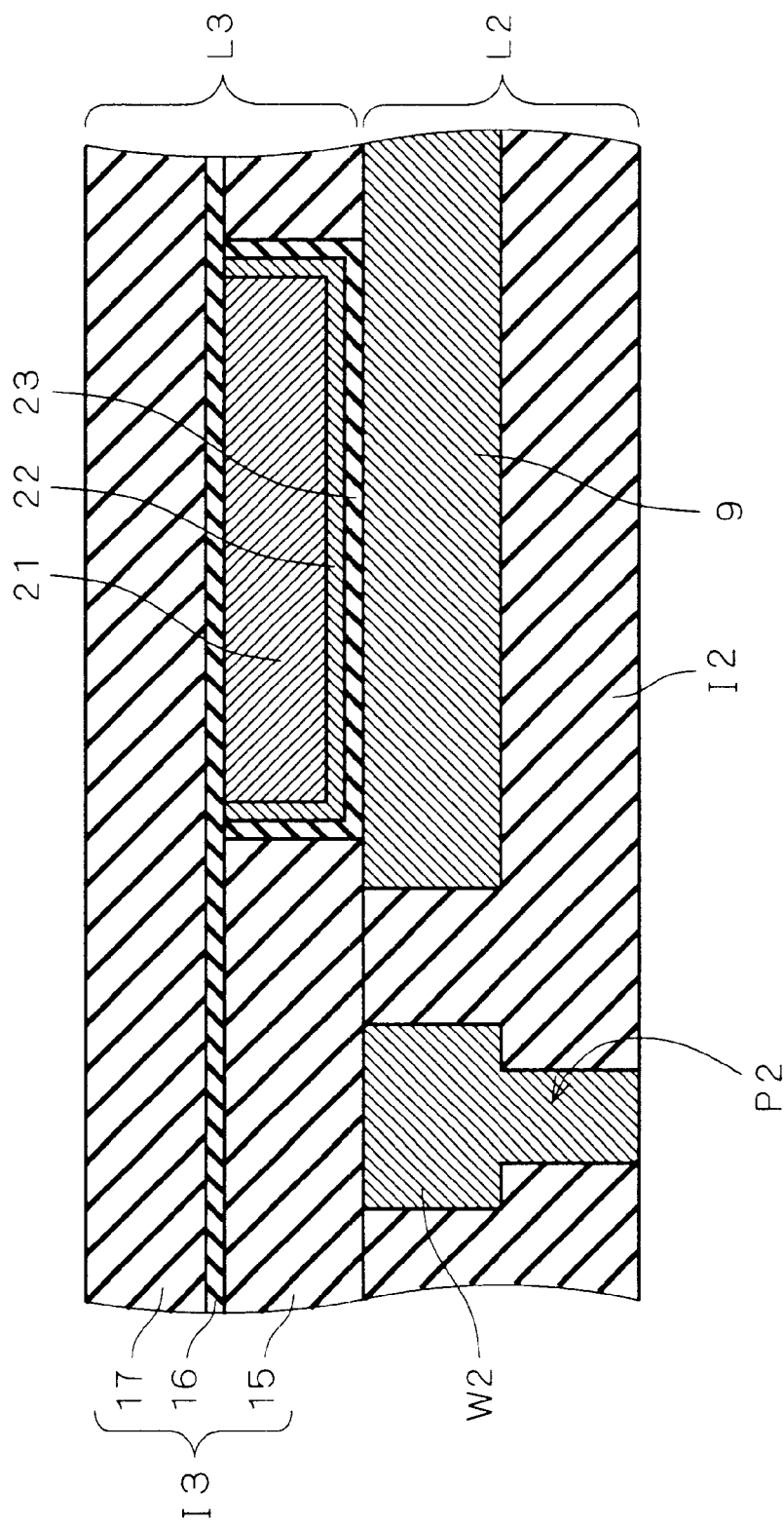
Figure 18:
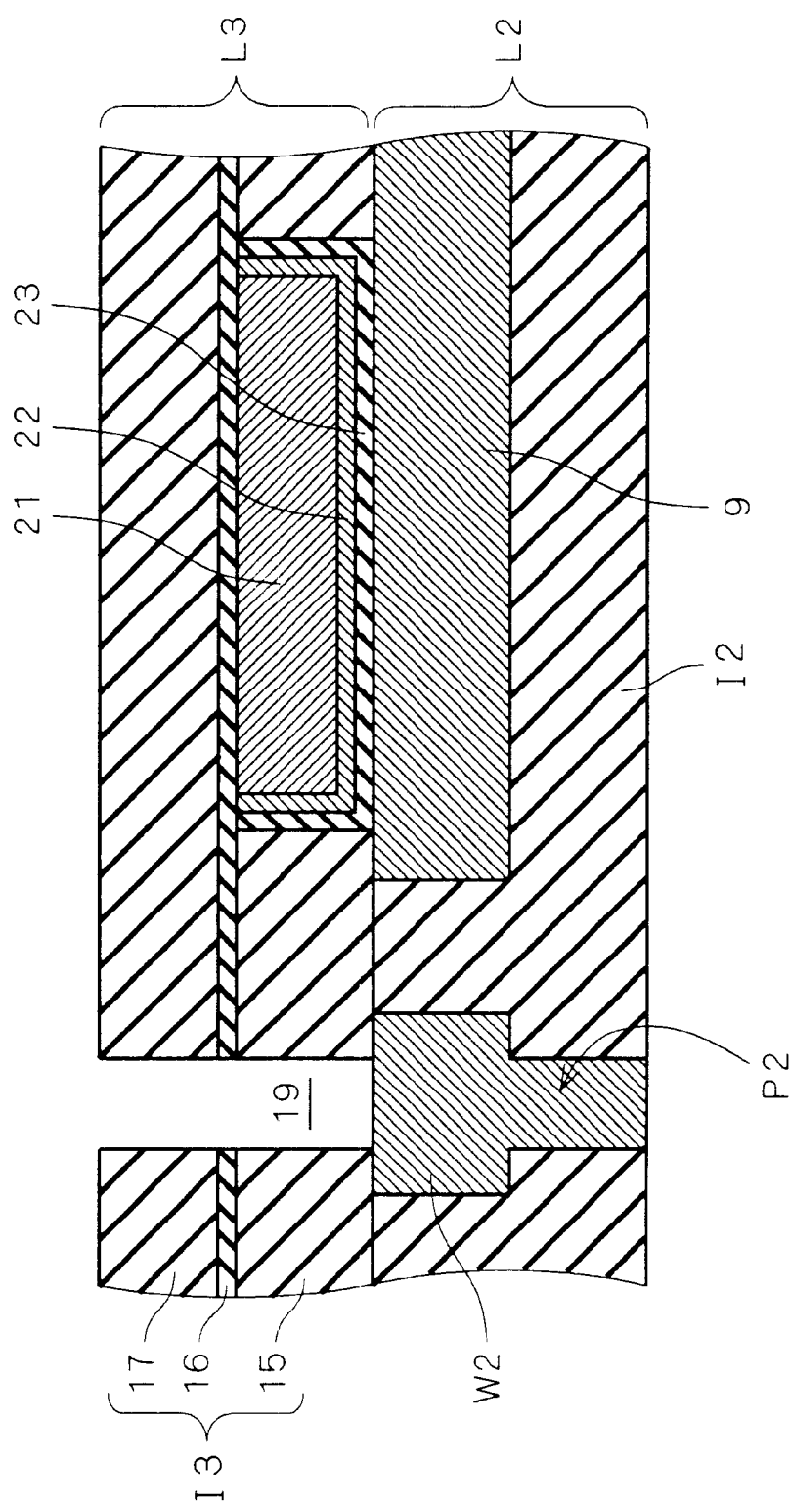
Figure 19:
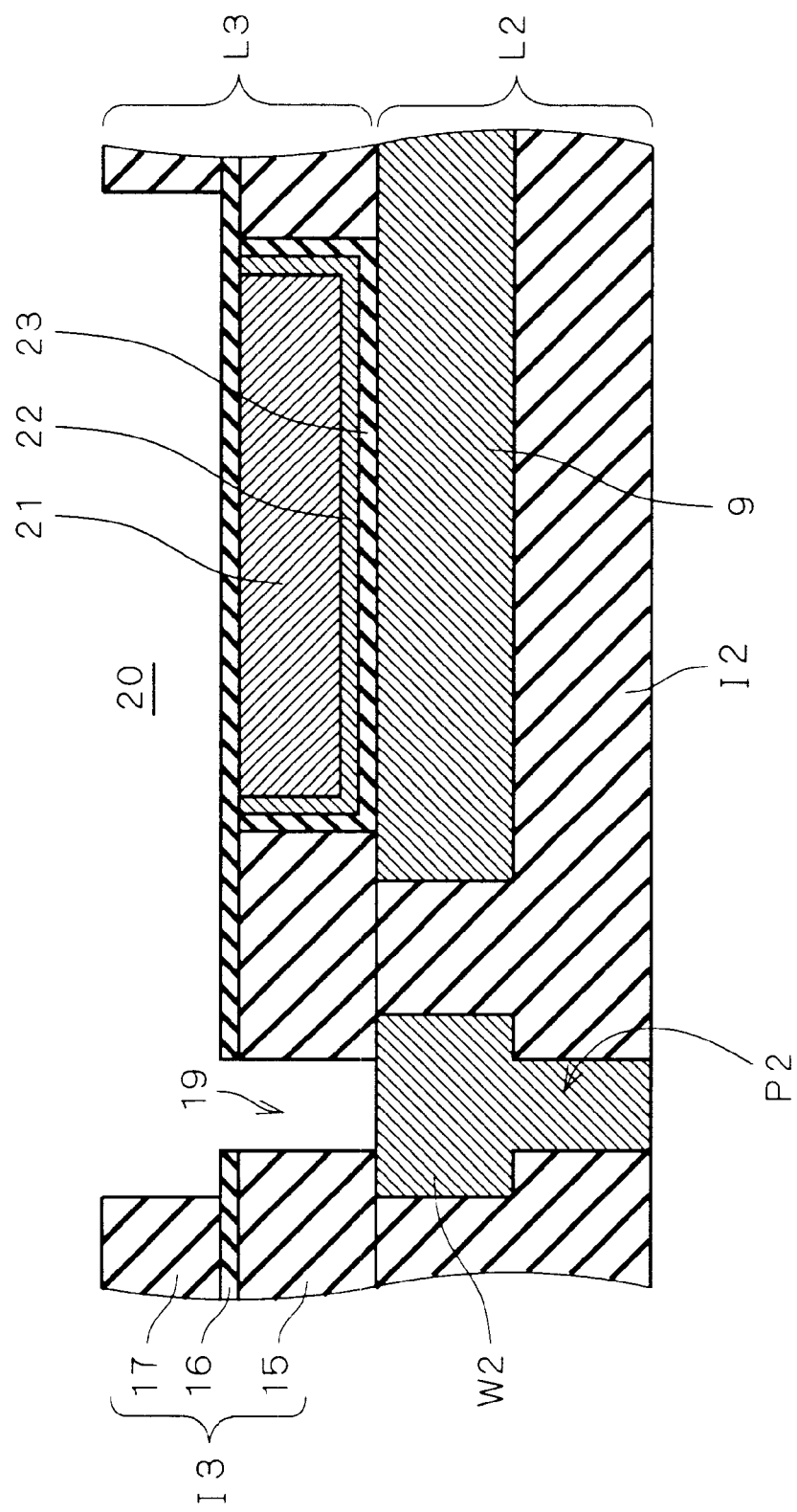
Figure 20:
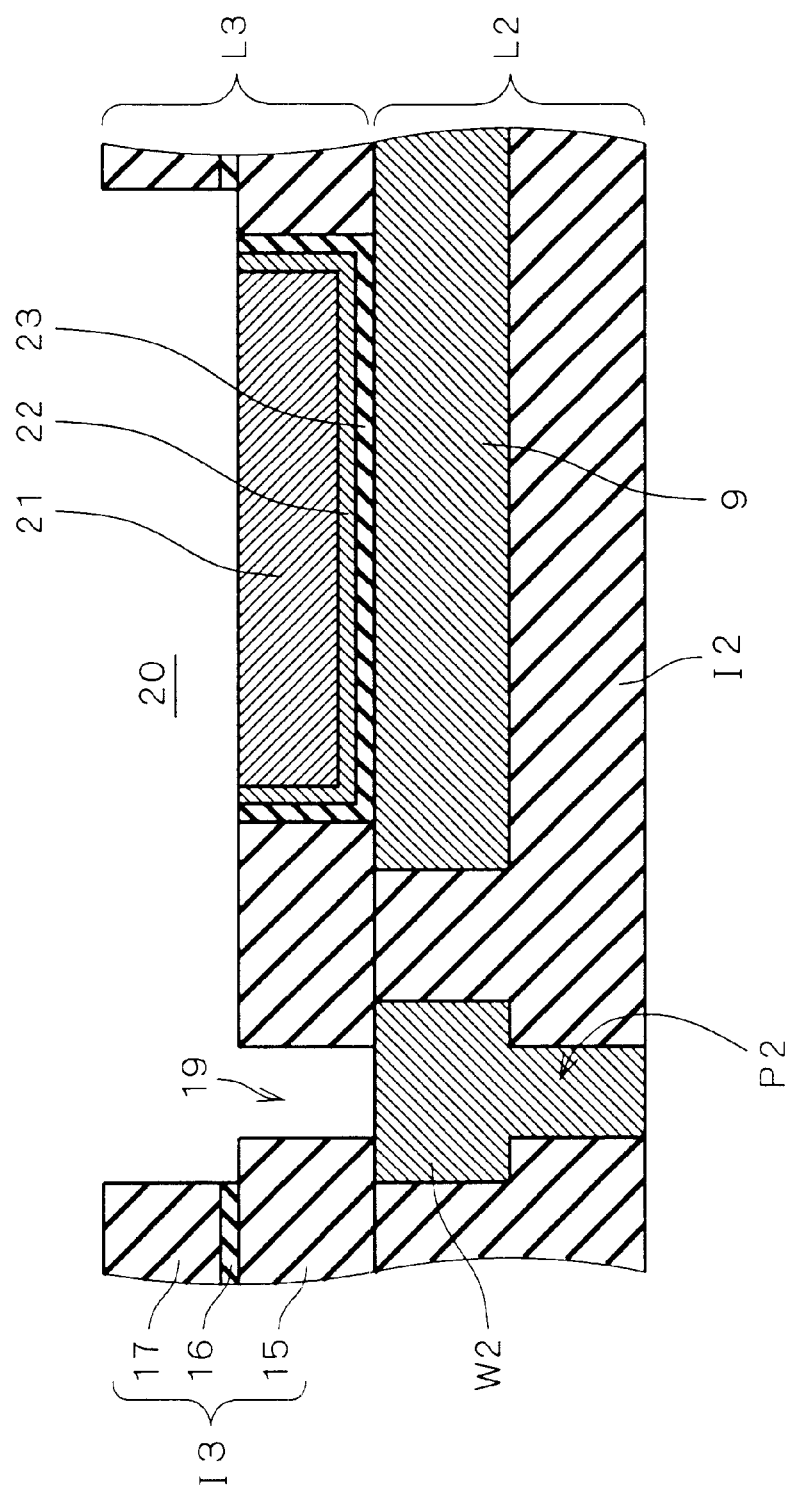

Next, referring to FIG. 17, the insulating films 16 and 17 are entirely formed by CVD in this order. Next, referring to FIG. 18, portions of the insulating films 17, 16 and 15 which are positioned above the second-level wire W2 are etched by photolithography and anisotropic dry etching in this order, to form the contact hole 19. This exposes the upper surface of the second-level wire W2. Next, referring to FIG. 19, the insulating film 17 is patterned by photolithography and anisotropic dry etching, to form the interconnection trench 20 in the insulating film 17. This anisotropic dry etching is performed under the condition of high selectivity for the material of the insulating film 16. Next, referring to FIG. 20, a portion of the insulating film 16 which is not covered with the insulating film 17 is removed by full etchback, to expose an upper surface of the metal film 21.

Subsequently, the metal film 13 is entirely formed by sputtering, and then the metal film 12 is entirely formed by plating to have a film thickness enough to fully fill the inside of the contact hole 19 and the inside of the interconnection trench 20. The metal films 12 and 13 are polished by CMP till the upper surface of the insulating film 17 is exposed, to planarize the surfaces of these metal and insulating films. Through the above process steps, the structure shown in FIG. 12 is obtained.

Thus, according to the structure of the semiconductor device and the method of manufacturing the same of the second preferred embodiment, the MIM-type capacitor can be formed in the multi-level wire structure in the dual damascene process with no additional complicate process step, like in the first preferred embodiment.

Further, in the first preferred embodiment, the insulating film 14 serving as the capacitor dielectric film is slightly removed by the overetching in the etching for forming the recess 18. In contrast to this, in the method of manufacturing a semiconductor device of the second preferred embodiment, since the film thickness of the capacitor dielectric film is completely equal to that of the insulating film 23, variation in film thickness of the capacitor dielectric film can be suppressed and a high-performance capacitor of less variation in capacitor capacitance can be thereby obtained.

The Third Preferred Embodiment

Figure 21:
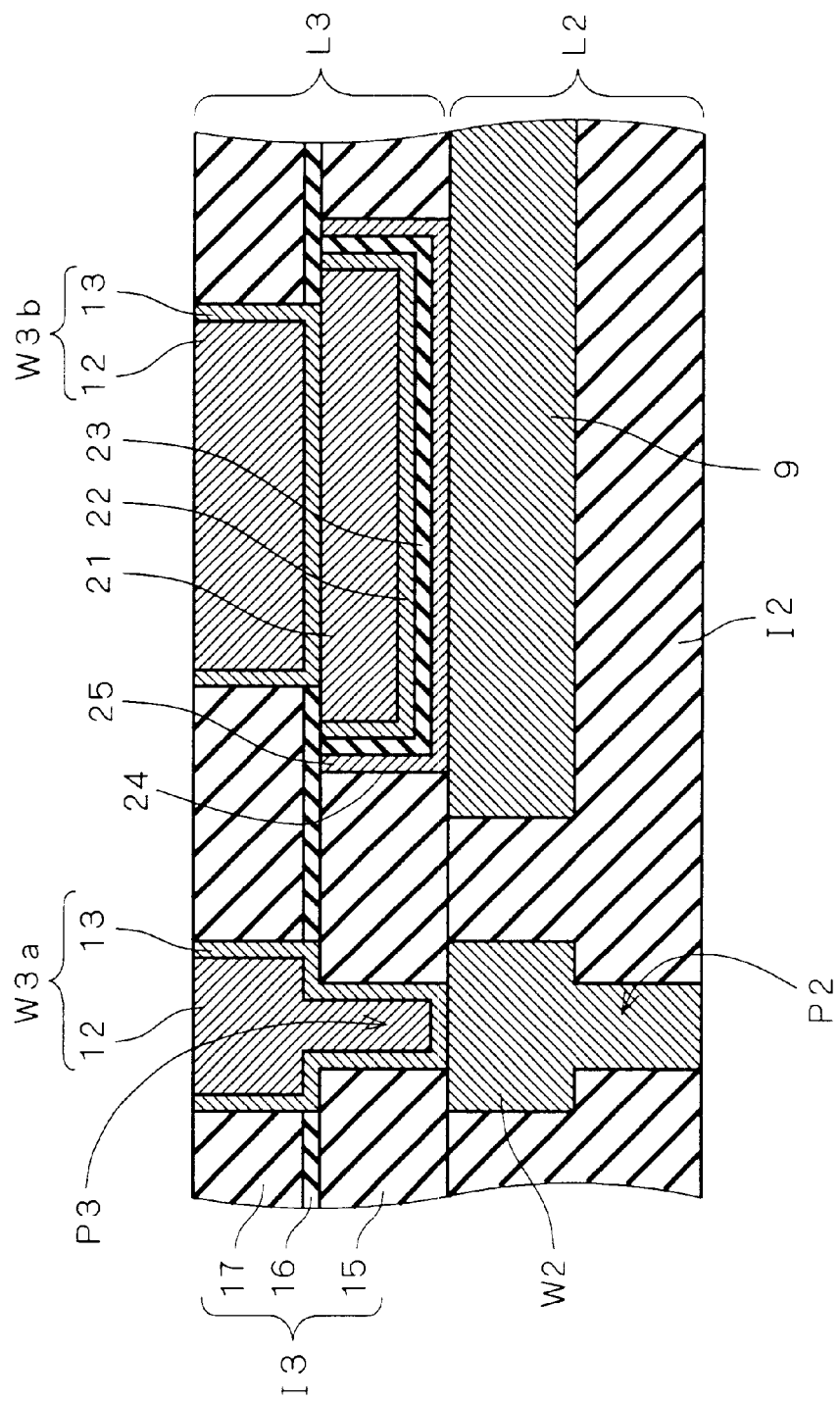
FIG. 21 is a cross section showing a structure of a semiconductor device in accordance with a third preferred embodiment of the present invention.
Figure 22:
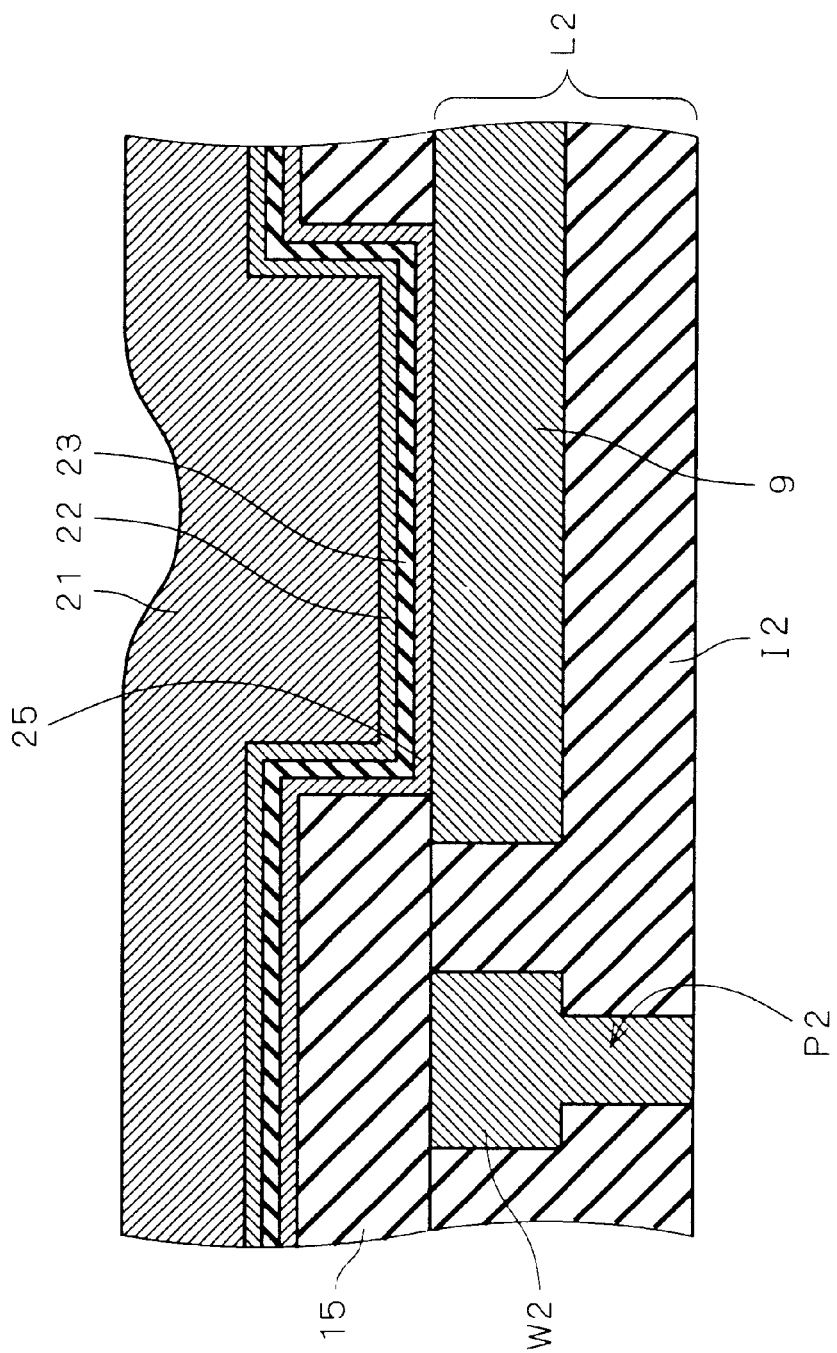
FIGS. 22 to 27 are cross sections showing a method of manufacturing a semiconductor device in accordance with the third preferred embodiment of the present invention step by step in sequence.
Figure 23:
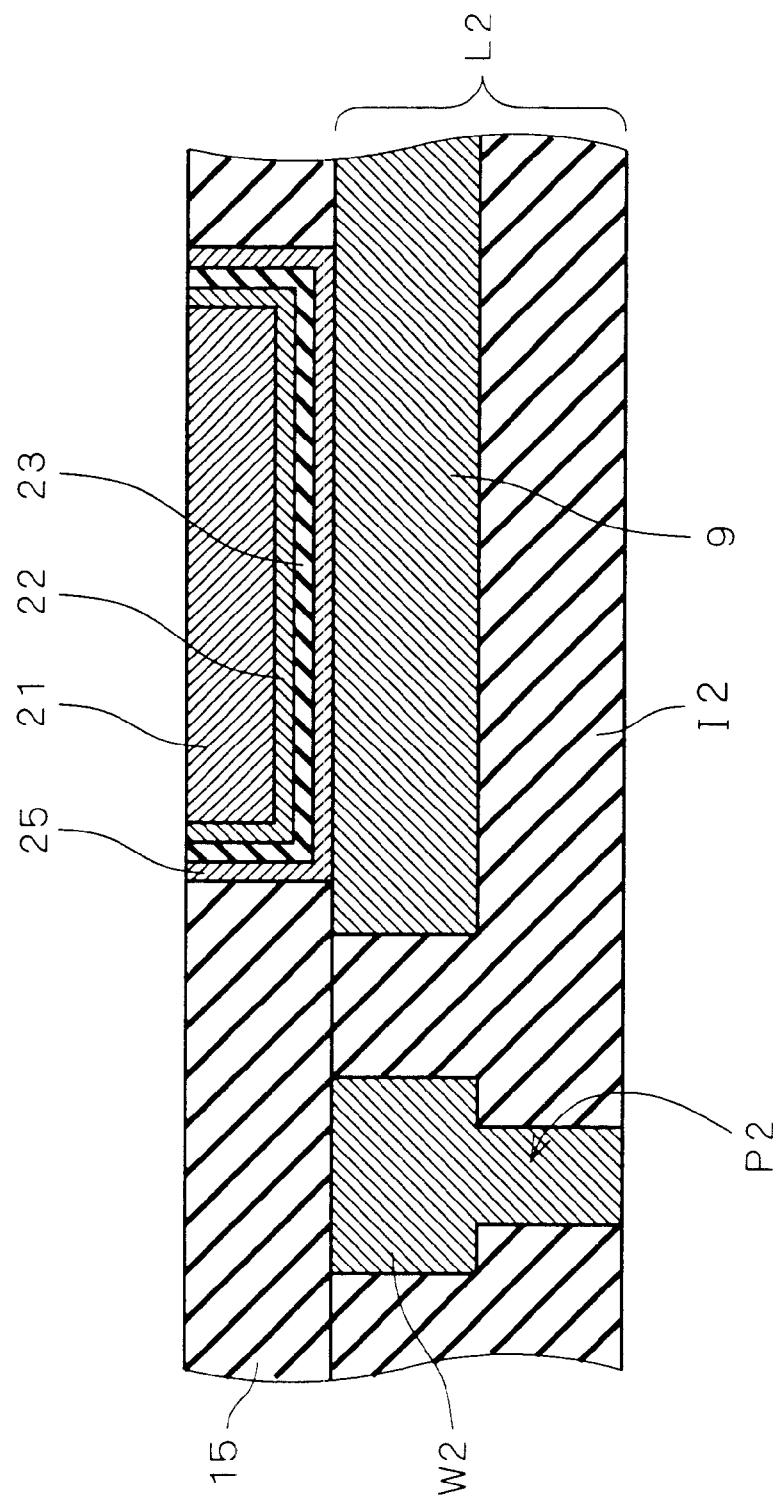

FIG. 21 is a cross section showing a structure of a semiconductor device in accordance with the third preferred embodiment of the present invention. The structure of the second interconnection layer L2 is the same as that of the second preferred embodiment shown in FIG. 12. The third interconnection layer L3 has the insulating film I3, and the insulating film I3 has a structure in which the insulating films 15 to 17 are layered on the upper surface of the second interconnection layer L2 in this order. In the insulating film 15, the recess 24 is formed, and in the recess 24, a metal film 25 is formed on the side surfaces and the bottom surface of the recess 24, the insulating film 23 is formed on the metal film 25, the metal film 22 is formed on the insulating film 23 and the metal film 21 is formed on the metal film 22. In the third preferred embodiment, the metal film 25 is made of TaN, Ta, TiN or the like. A portion of the metal film 25 which is formed on the bottom surface of the recess 24 is in contact with the upper surface of the metal film 9, and the metal film 25 serves as part of the first electrode of the MIM-type capacitor. A portion of the insulating film 23 which is sandwiched between the metal film 22 and the metal film 25 serves as the capacitor dielectric film of the MIM-type capacitor. In the insulating films 16 and 17, a third-level wire W3b having the metal films 12 and 13 is formed on the upper surface of the metal film 21. In the insulating film I3, a third-level wire W3a having the metal films 12 and 13 is formed. The third-level wire W3a has the interconnection portion in its upper portion and the plug portion P3 in its lower portion. The plug portion P3 is connected to the second-level wire W2.

FIGS. 22 to 27 are cross sections showing a method of manufacturing the semiconductor device of FIG. 21 in accordance with the third preferred embodiment of the present invention step by step in sequence. First, the structure of FIG. 14 is obtained through the same steps as discussed in the second preferred embodiment. Next, referring to FIG. 22, the metal film 25 is entirely formed by sputtering to have a film thickness of about 10 to 100 nm. Specifically, the metal film 25 is formed on the upper surface of the insulating film 15 and the side surfaces and the bottom surface of the recess 24. Subsequently, the insulating film 23, the metal film 22 and the metal film 21 are entirely formed in this order by the same method as discussed in the second preferred embodiment. Next, referring to FIG. 23, the metal films 21, 22 and 25 and the insulating film 23 are polished by CMP till the upper surface of the insulating film 15 is exposed to planarize the surfaces of these metal and insulating films.

Figure 24:
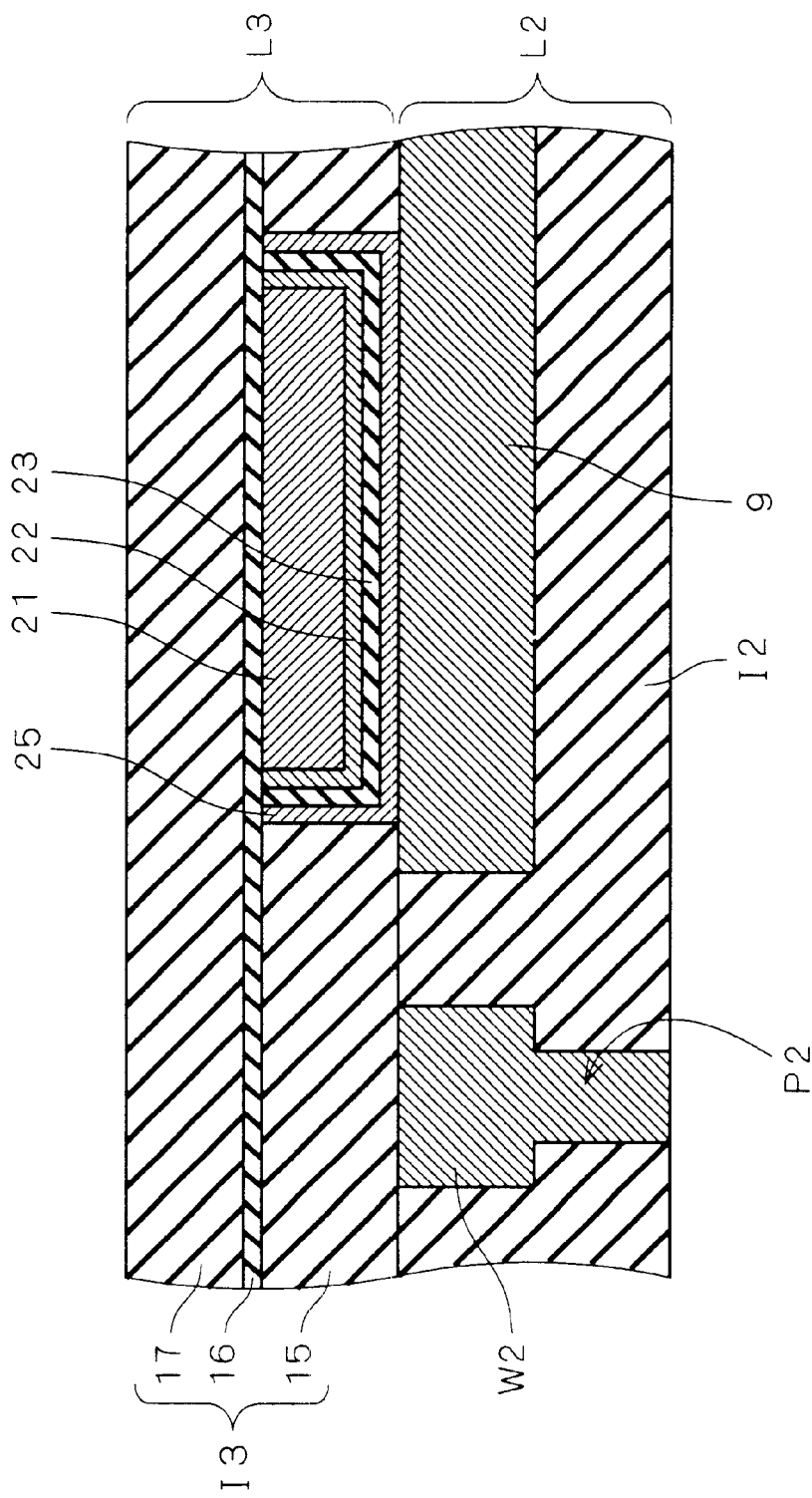
Figure 25:
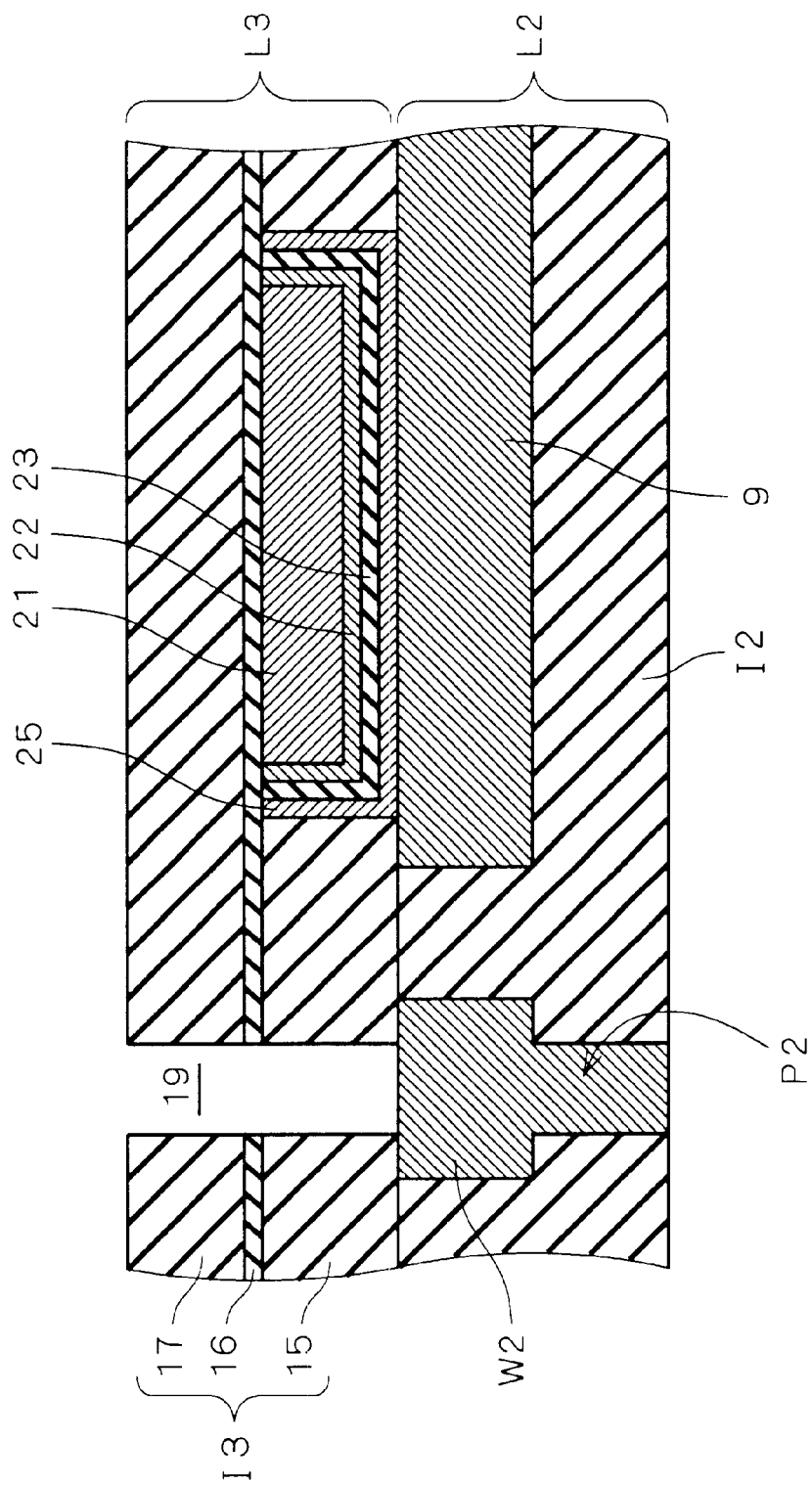
Figure 26:
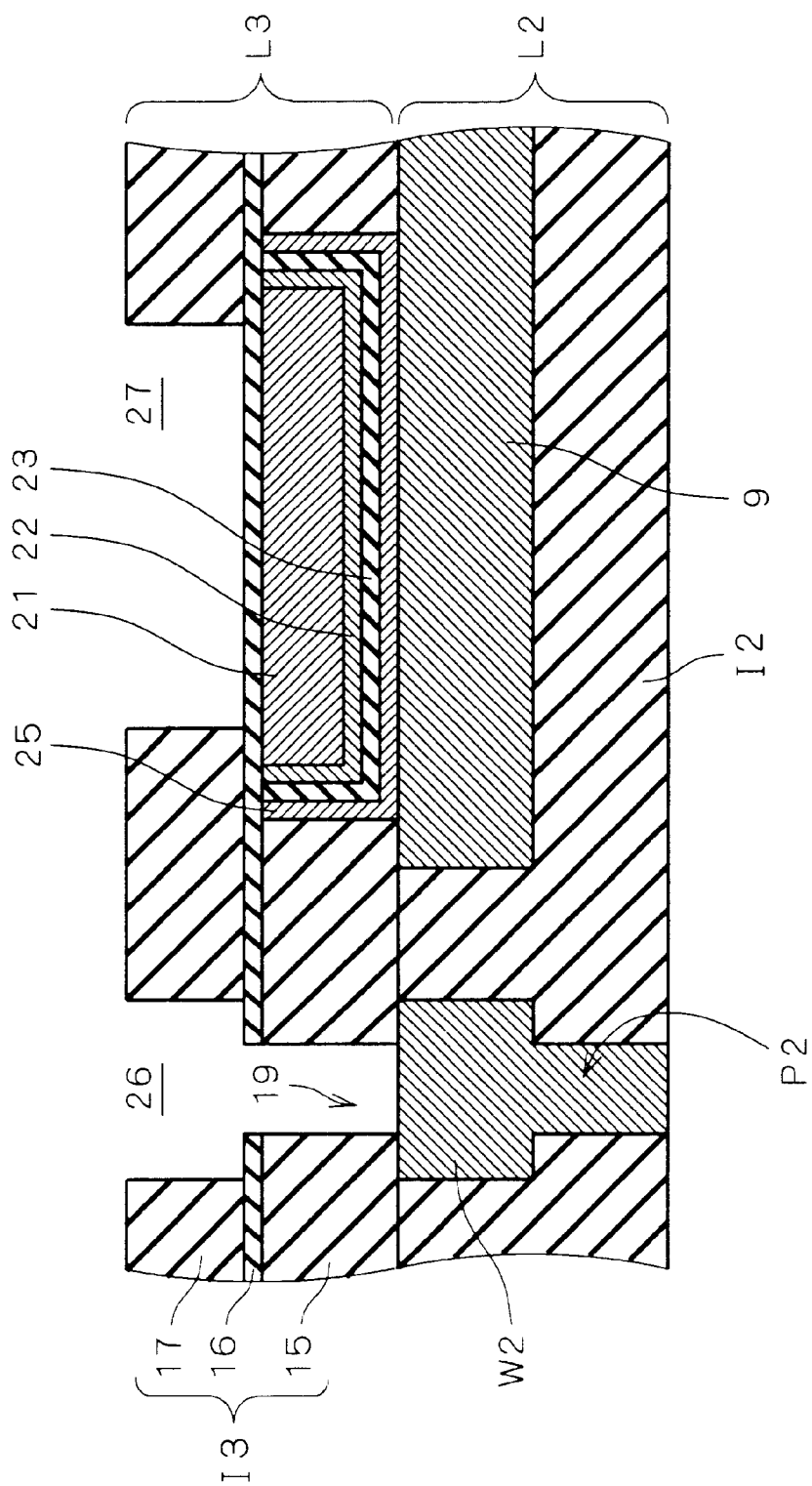
Figure 27:
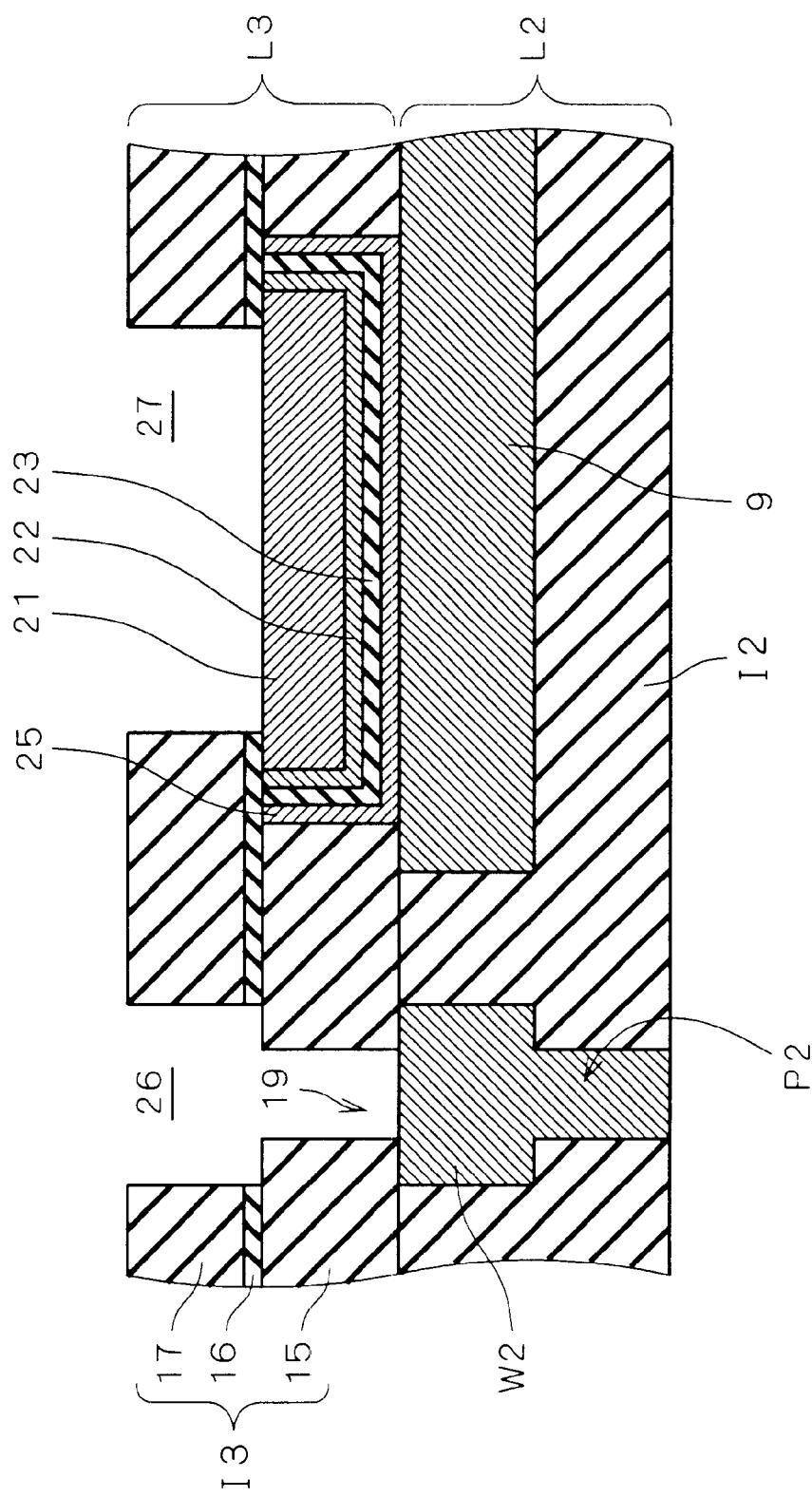

Next, referring to FIG. 24, the insulating films 16 and 17 are entirely formed by CVD in this order. Next, referring to FIG. 25, the insulating films 17, 16 and 15 are partially etched by photolithography and anisotropic dry etching in this order, to form the contact hole 19. Next, referring to FIG. 26, the insulating film 17 is patterned by photolithography and anisotropic dry etching, to form the interconnection trenches 26 and 27 in the insulating film 17. The interconnection trench 26 partially overlaps the contact hole 19, and the interconnection trench 27 is formed above the metal film 21. Next, referring to FIG. 27, a portion of the insulating film 16 which is not covered with the insulating film 17 is removed by full etchback, to expose the upper surface of the metal film 21.

Subsequently, the metal film 13 is entirely formed by sputtering, and then the metal film 12 is entirely formed by plating to have a film thickness enough to fully fill the inside of the contact hole 19 and the inside of the interconnection trenches 26 and 27. Then, the metal films 12 and 13 are polished by CMP till the upper surface of the insulating film 17 is exposed, to planarize the surfaces of these metal and insulating films. Through the above process steps, the structure shown in FIG. 21 is obtained.

Thus, according to the structure of the semiconductor device and the method of manufacturing the same of the third preferred embodiment, the MIM-type capacitor can be formed in the multi-level wire structure in the dual damascene process with no additional complicate process step, like in the first preferred embodiment.

Further, the metal film 25 serving as part of the first electrode of the MIM-type capacitor is formed not only on the bottom surface but also on the side surfaces of the recess 24. Therefore, the area in which the first electrode and second electrode are opposed to each other is enlarged and the capacitor capacitance is thereby increased as compared with the semiconductor devices of the first and second preferred embodiments. For example, when the upper surface of the recess 24 is of 10 $\mu$m square and the depth thereof is 1.0 $\mu$m, the facing area of the first electrode and the second electrode in the third preferred embodiment increases by about 40% as compared with the first and second preferred embodiments. Accordingly, the capacitor capacitance also increases by about 40%.

The Fourth Preferred Embodiment

Figure 28:
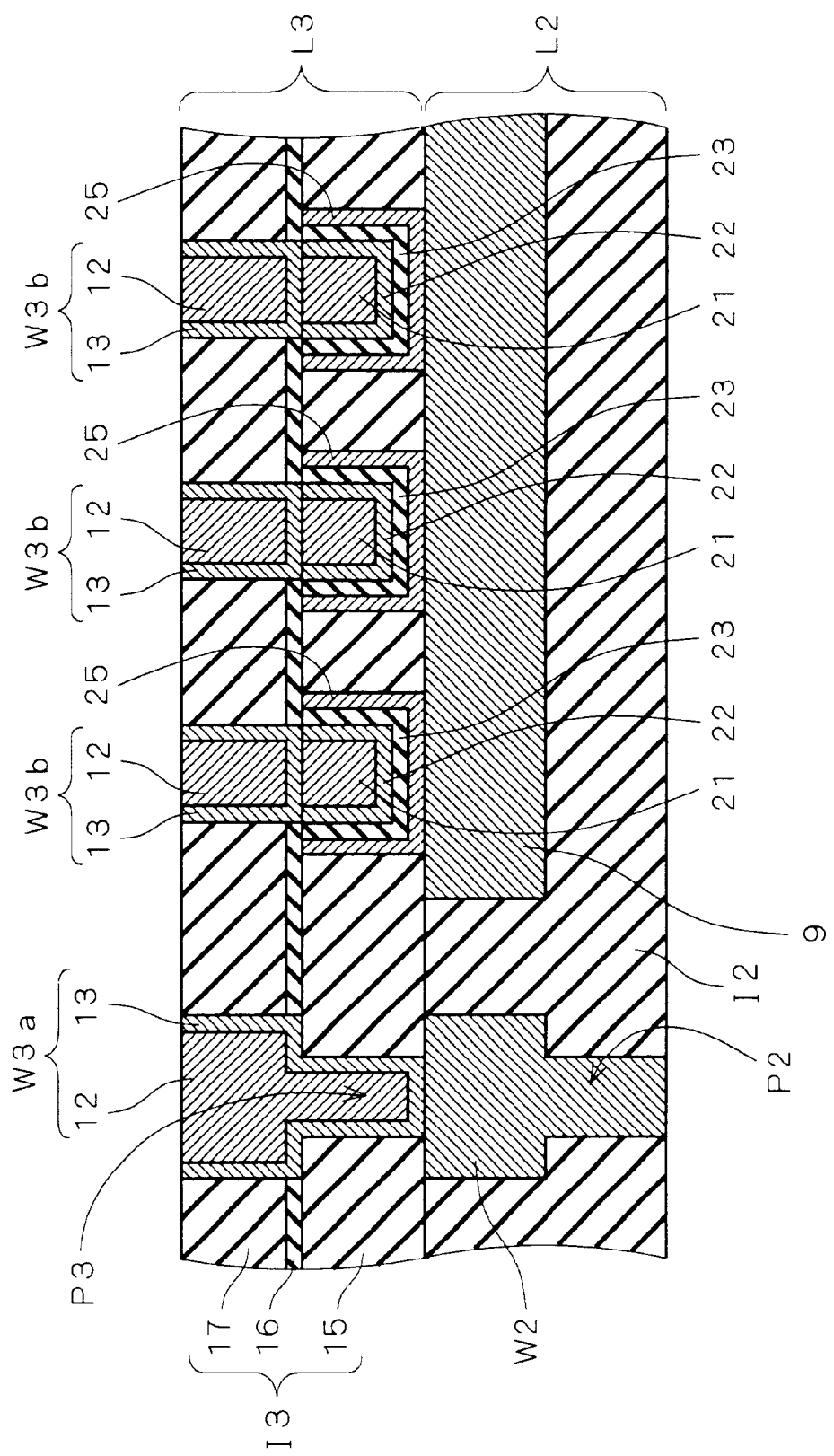
FIG. 28 is a cross section showing a structure of a semiconductor device in accordance with a fourth preferred embodiment of the present invention.

FIG. 28 is a cross section showing a structure of a semiconductor device in accordance with the fourth preferred embodiment of the present invention. The semiconductor device of the fourth preferred embodiment is based on the structure of the semiconductor device of the third preferred embodiment shown in FIG. 21 and the structure of the MIM-type capacitor is improved. The structure having the metal films 21 and 22 which serve as the second electrode of the MIM-type capacitor, the insulating film 23 which serves as the capacitor dielectric film thereof and the metal film 25 serving as part of the first electrode thereof is divided into a plurality of ones (three in the case of FIG. 28). A plurality of divided metal films 25 are connected in common to the metal film 9. Further, the third-level wire W3b connected to the second electrode of the MIM-type capacitor is divided into a plurality of wires and a plurality of divided third-level wires W3b are connected to a plurality of divided second electrodes, respectively. The third-level wires W3b are electrically connected to one another with a metal wire formed in the interconnection layer of the upper layer.

Figure 29:
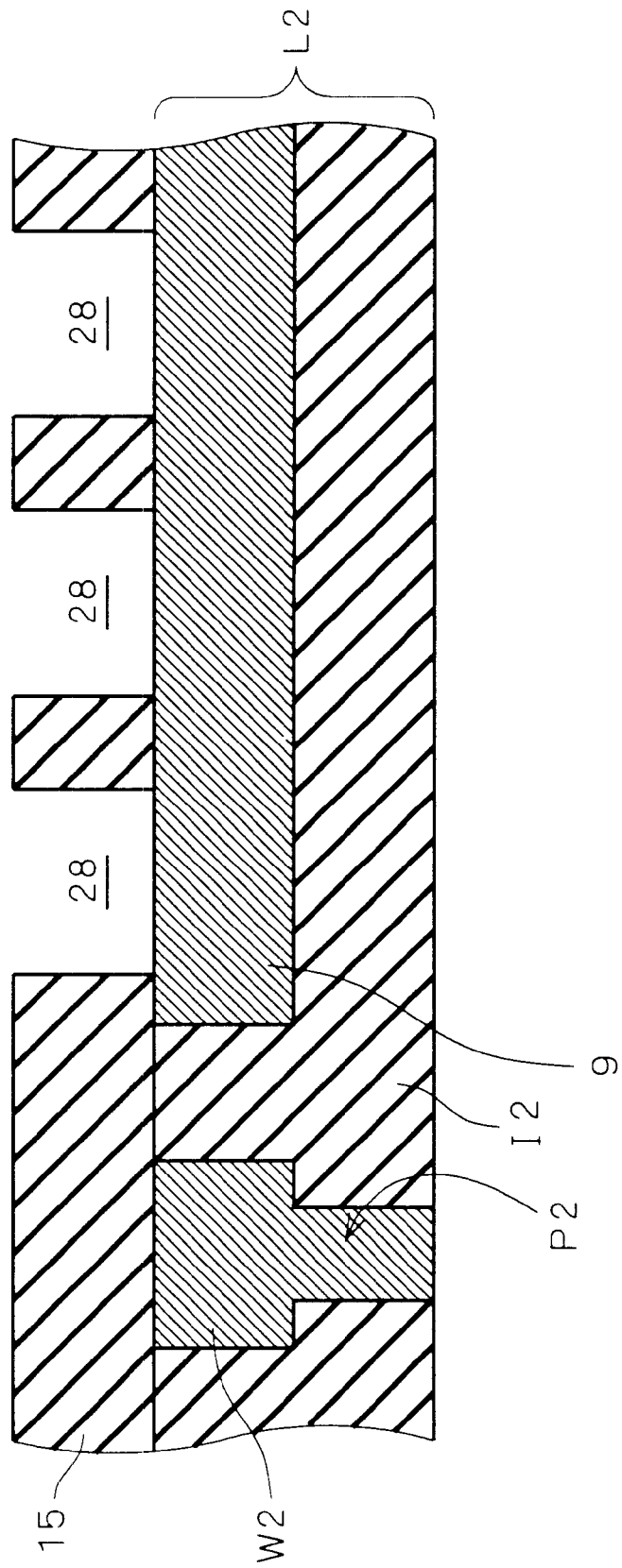
FIG. 29 is a cross section showing a process step in a method of manufacturing a semiconductor device in accordance with the fourth preferred embodiment of the present invention.

FIG. 29 is a cross section showing a process step in a method of manufacturing a semiconductor device in accordance with the fourth preferred embodiment of the present invention. Referring to FIG. 29, a plurality of divided recesses 28 are formed, instead of forming one recess 24 in the step of FIG. 14. Thus, a plurality of divided second electrodes, capacitor dielectric films and metal films 25 can be formed in a plurality of recesses 28, respectively.

Thus, according to the structure of the semiconductor device and the method of manufacturing the same of the fourth preferred embodiment, the MIM-type capacitor can be formed in the multi-level wire structure in the dual damascene process with no additional complicate process step, like in the first preferred embodiment.

Further, by each dividing the second electrode, capacitor dielectric film and the metal film 25 into a plurality of ones, the total area in which the first electrodes and the second electrodes are opposed to each other are enlarged and the capacitor capacitance is further increased, as compared with the semiconductor device of the third preferred embodiment.

The Fifth Preferred Embodiment

Figure 30:
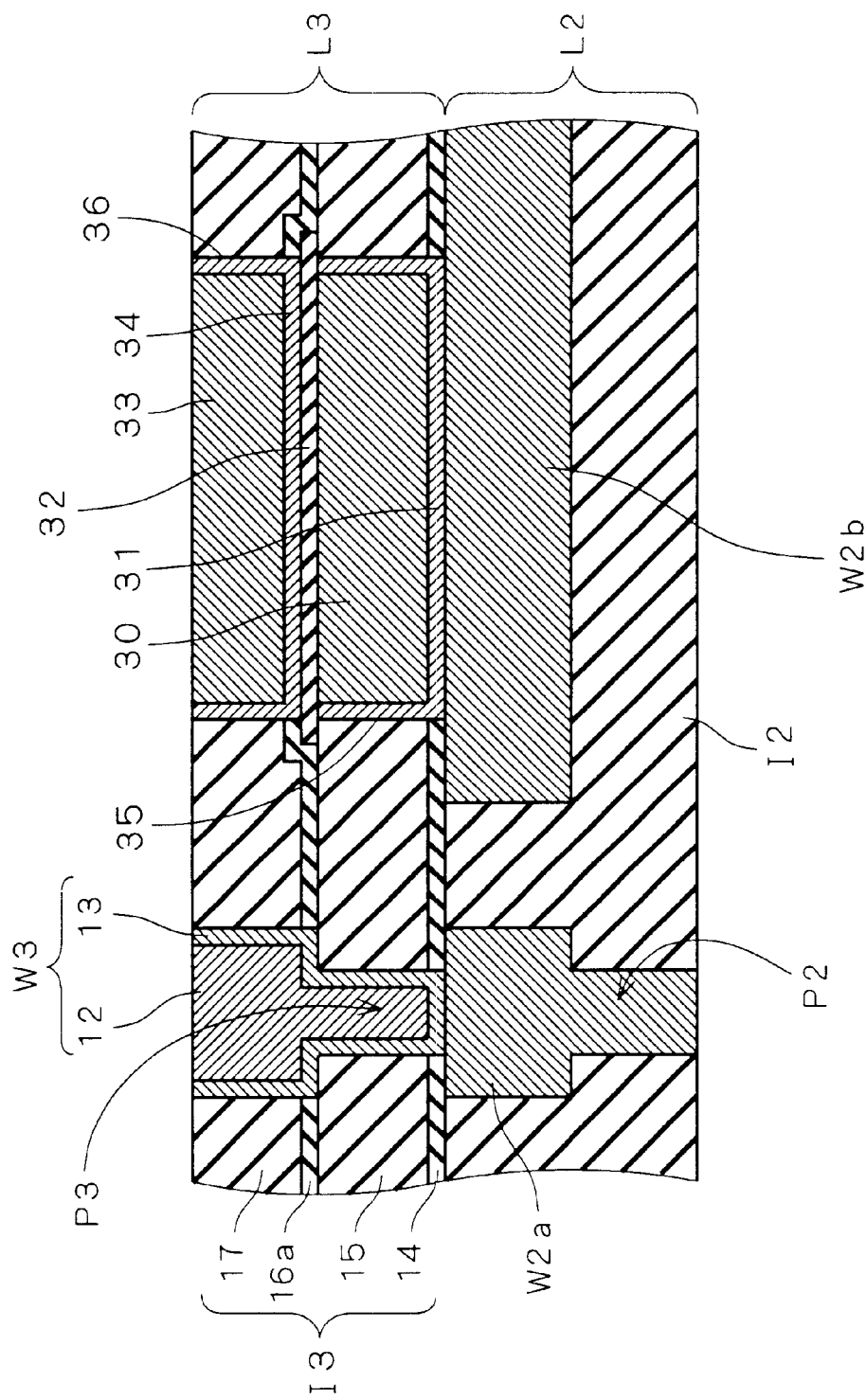
FIG. 30 is a cross section showing a structure of a semiconductor device in accordance with a fifth preferred embodiment of the present invention.

FIG. 30 is a cross section showing a structure of a semiconductor device in accordance with the fifth preferred embodiment of the present invention. The second interconnection layer L2 has the insulating film I2 and in the insulating film I2, the second-level wires W2a and W2b are formed by a damascene process. In the fifth preferred embodiment, the second-level wires W2a and W2b are made of copper. The third interconnection layer L3 is formed on the upper surface of the second interconnection layer L2. The third interconnection layer L3 has the insulating film I3 having the same film thickness as the insulating film I2 has. The insulating film I3 has a structure in which the insulating films 14, 15, 16a and 17 are layered on the upper surface of the second interconnection layer L2 in this order. The insulating film 14 is made of $Si_3N_4$, SiC or the like, serving as an antioxidizing film for the second-level wires W2a and W2b.

The insulating film 15 is made of a silicon oxide film, an SiOC film or the like. In the insulating films 14 and 15 formed are a recess 35 having a bottom surface defined by an upper surface of the second-level wire W2b and the first electrode of the MIM-type capacitor formed in the recess 35. The first electrode has a metal film 31 formed on side surfaces and the bottom surface of the recess 35 and a metal film 30 formed on the metal film 31. The metal film 30 is made of copper. The metal film 31 is made of TaN, Ta, TiN or the like, serving as a barrier metal for the metal film 30 made of copper.

In an upper surface of the metal film 30 formed is an insulating film 32 serving as the capacitor dielectric film of the MIM-type capacitor. The insulating film 32 is made of $Si_3N_4$, SiC or the like, also serving as an antioxidizing film for the metal film 30 made of copper. In the insulating film 17 formed is a recess 36 having a bottom surface defined by an upper surface of the metal film 32. In the recess 36, the second electrode of the MIM-type capacitor is formed. The second electrode has a metal film 34 formed on side surfaces and the bottom surface of the recess 36 and a metal film 33 formed on the metal film 34. The metal film 33 is made of copper. The metal film 34 is made of TaN, Ta, TiN or the like, serving as a barrier metal for the metal film 33 made of copper. The insulating film 17 is made of a silicon oxide film, an SiOC film or the like. The insulating film 16a is made of a material different from the material of the metal film 32. The structure of the third-level wire W3 is the same as that of the third-level wire W3a shown in FIG. 21.

FIGS. 31 to 38 are cross sections showing a method of manufacturing the semiconductor device of FIG. 30 in accordance with the fifth preferred embodiment of the present invention step by step in sequence. First, referring to FIG. 31, the second-level wires W2a and W2b are formed in the insulating film I2 of the second interconnection layer L2 by a damascene process. Subsequently, the insulating films 14 and 15 are entirely formed by CVD on the upper surface of the second interconnection layer L2.

Figure 32:
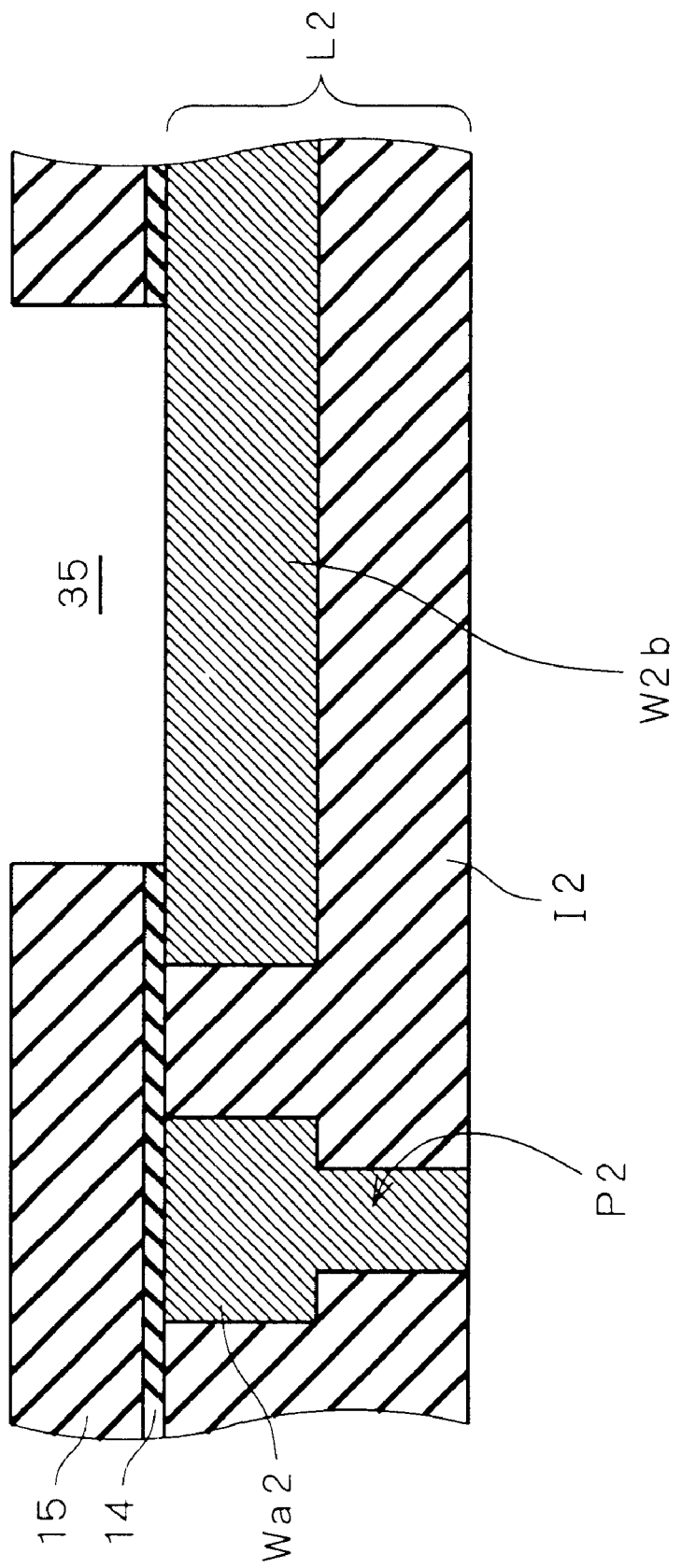

Next, referring to FIG. 32, the insulating films 14 and 15 are patterned by photolithography and anisotropic dry etching to form the recess 35 having the bottom surface defined by the upper surface of the second-level wire W2b in the insulating films 14 and 15. This photolithography is performed with a photomask having an opening pattern corresponding to the formation layout of the first electrode of the MIM-type capacitor.

Figure 33:
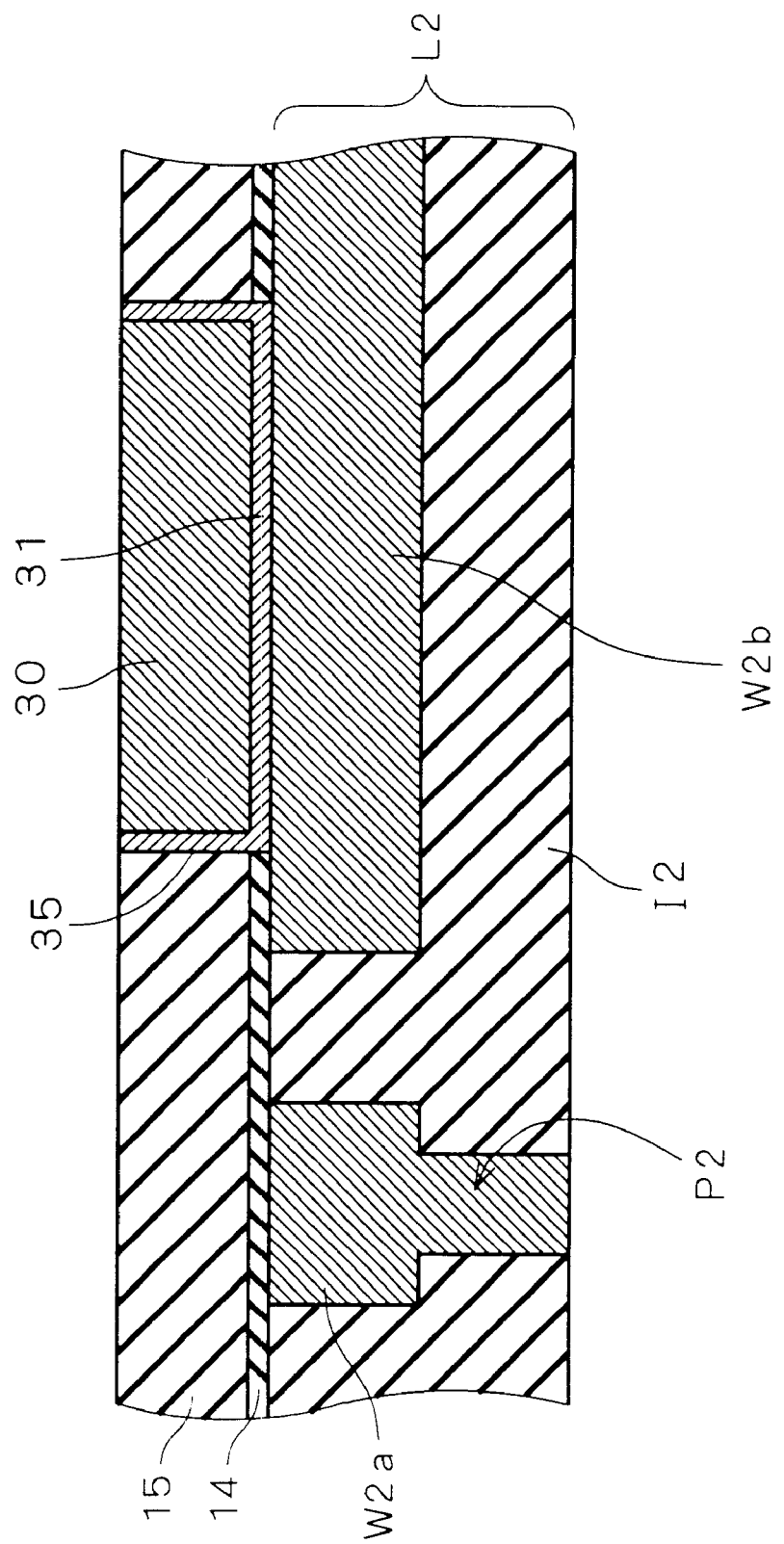

Next, referring to FIG. 33, the metal film 31 is entirely formed by sputtering to have a film thickness of about 10 to 100 nm. Subsequently, the metal film 30 is entirely formed by plating to have a film thickness enough to filly fill the inside of the recess 35. Then, the metal films 30 and 31 are polished by CMP till the upper surface of the insulating film 15 is exposed, to planarize the surfaces of these metal and insulating films. Through this step, the first electrode having the metal films 30 and 31 is formed in the recess 35.

Figure 34:
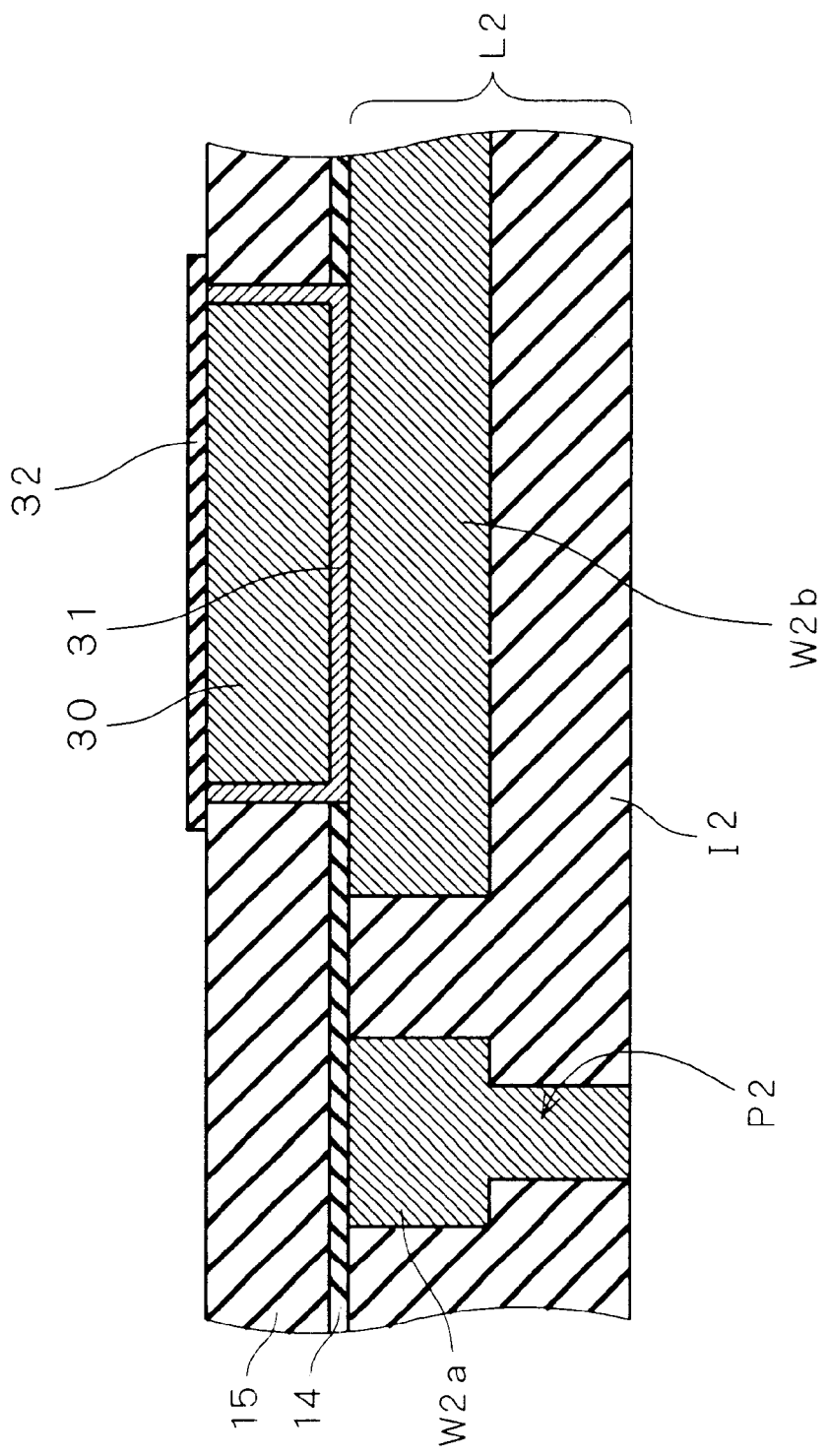
Figure 35:
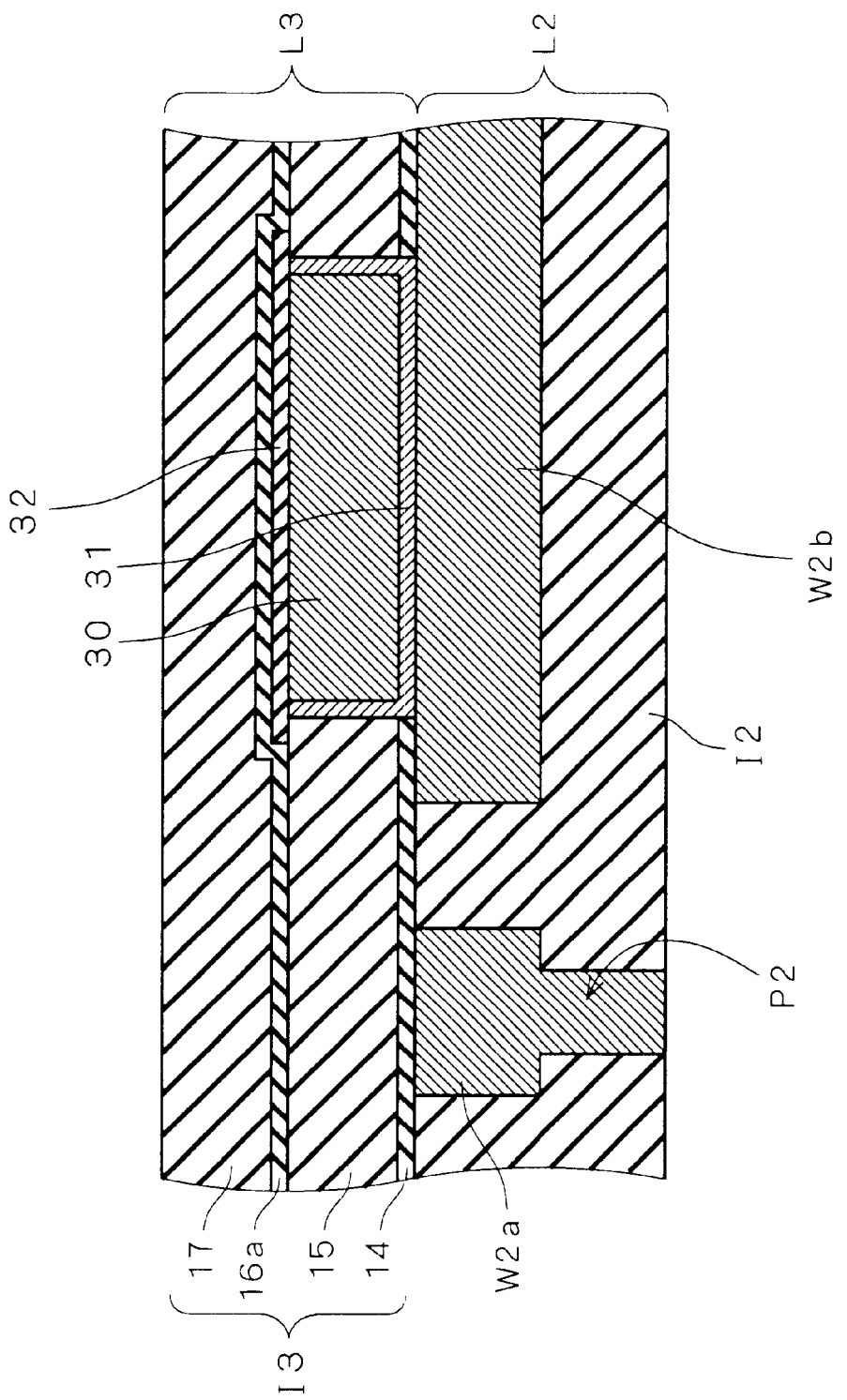
Figure 36:
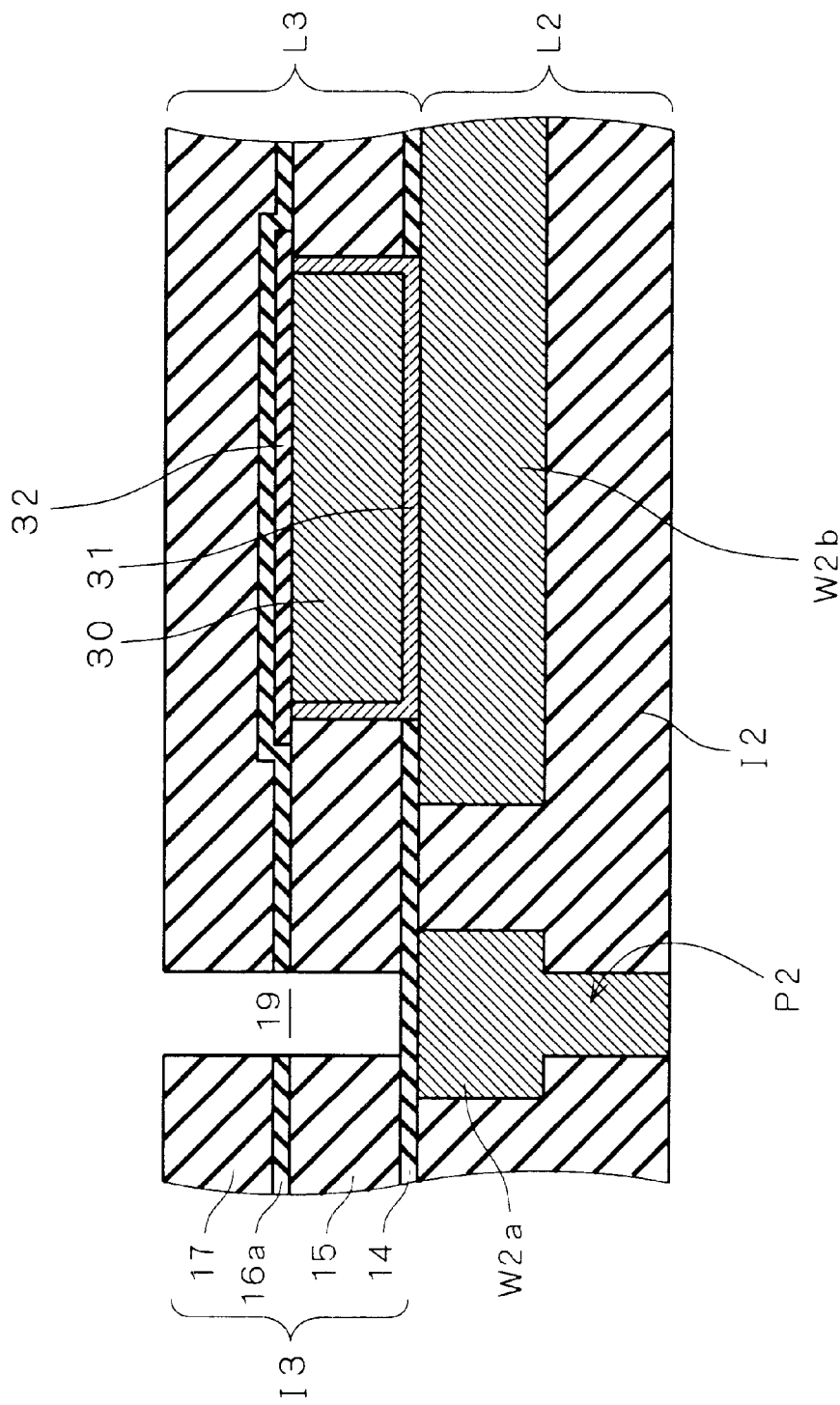

Next, referring to FIG. 34, the insulating film 32 is entirely formed by CVD to have a film thickness of about 50 to 100 nm. Subsequently, the insulating film 32 is patterned by photolithography and anisotropic dry etching to leave the insulating film 32 only on the first electrode of the MIM-type capacitor. Next, referring to FIG. 35, the insulating films 16a and 17 are entirely formed by CVD. Next, referring to FIG. 36, the insulating films 17, 16a and 15 are partially etched by photolithography and anisotropic dry etching in this order, to form the contact hole 19. This anisotropic dry etching for the insulating film 15 is performed under the condition of high selectivity for the material of the insulating film 14.

Figure 37:
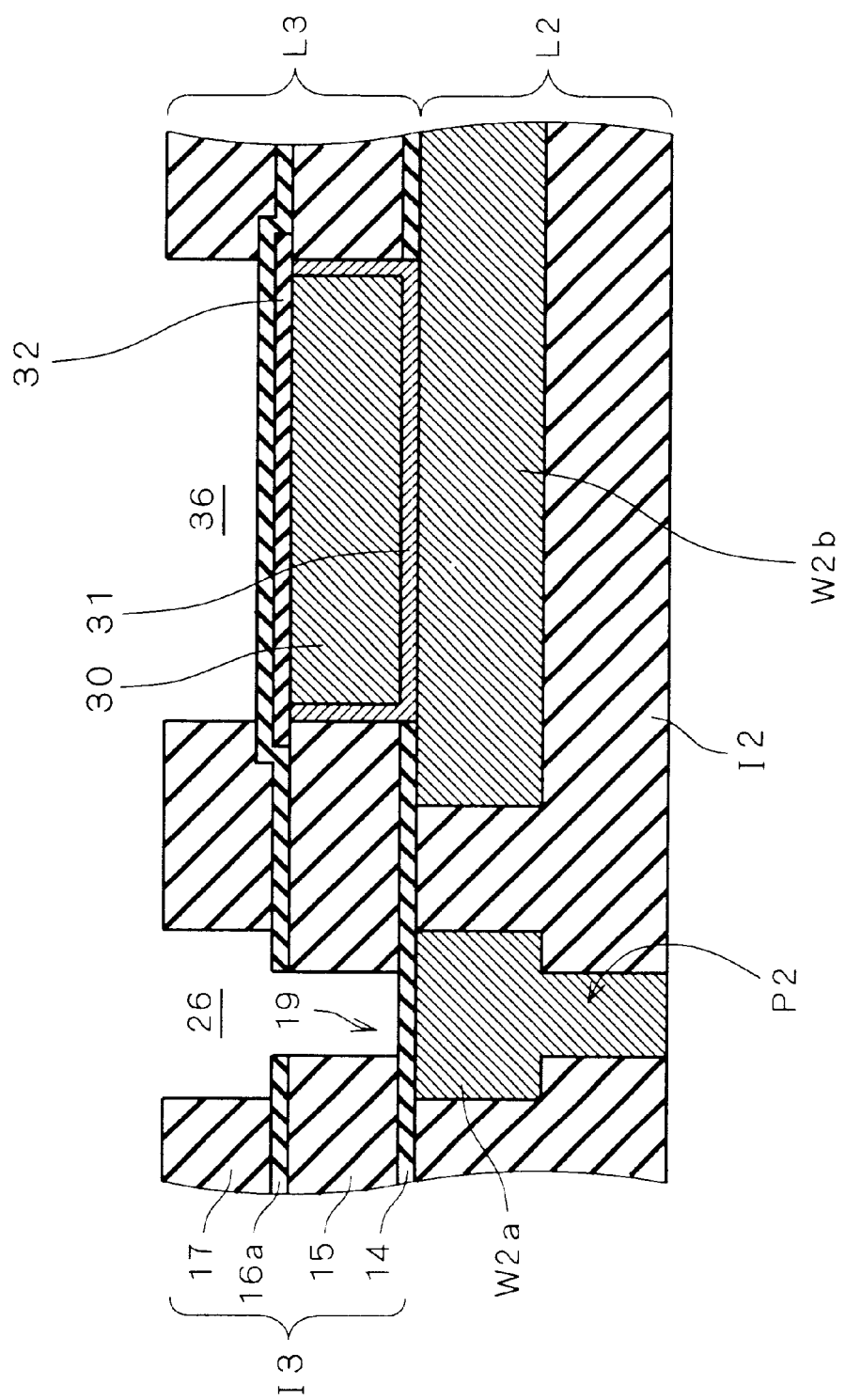

Next, referring to FIG. 37, the insulating film 17 is patterned by photolithography and anisotropic dry etching, to form the interconnection trench 26 partially overlapping the contact hole 19 and the recess 36 above the first electrode of the MIM-type capacitor. In this anisotropic dry etching, the insulating film 16a serves as an etching stopper for the anisotropic dry etching.

Figure 38:
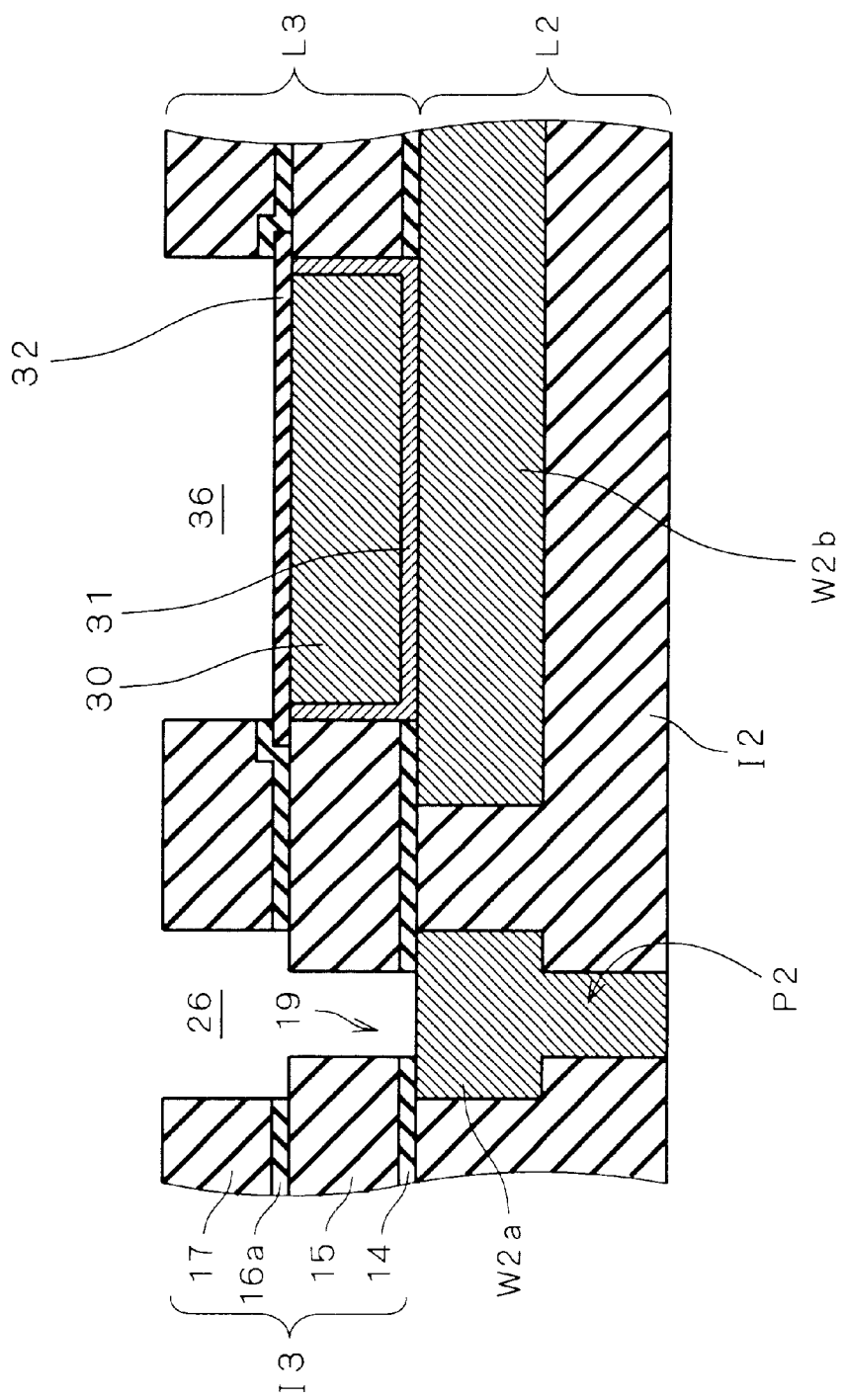

Next, referring to FIG. 38, a portion of the insulating film 14 which is not covered with the insulating film 15 is removed by full etchback, to expose the upper surface of the second-level wire W2a. Subsequently, a portion of the insulating film 16a which is not covered with the insulating film 17 is removed by full etchback, to expose an upper surface of the insulating film 32.

Subsequently, the metal films 13 and 34 are entirely formed by sputtering. Then, the metal films 12 and 33 are entirely formed by plating to have a film thickness enough to fully fill the inside of the contact hole 19, the inside of the interconnection trench 26 and the inside of the recess 36. These metal films are polished by CMP till the upper surface of the insulating film 17 is exposed, to planarize the surfaces of these metal and insulating films. Through the above process steps, the structure shown in FIG. 30 is obtained.

Thus, according to the structure of the semiconductor device and the method of manufacturing the same of the fifth preferred embodiment, the MIM-type capacitor can be formed in the multi-level wire structure in the dual damascene process with no additional complicate process step, like in the first preferred embodiment.

Further, since the insulating film 32 serving as the antioxidizing film for the metal film 30 also serves as the capacitor dielectric film, the number of process steps is reduced as compared with the case where the antioxidizing film and the capacitor dielectric film are separately formed.

Furthermore, the insulating film 16a is formed in advance on the insulating film 32 serving as the capacitor dielectric film and the insulating film 16a is used as an etching stopper when the anisotropic dry etching is performed to form the recess 36 in the step of FIG. 37 Therefore, since it is possible to prevent part of the insulating film 32 from being removed by overetching of the anisotropic dry etching, a high-performance capacitor of less variation in capacitor capacitance can be obtained.

The Sixth Preferred Embodiment

Figure 39:
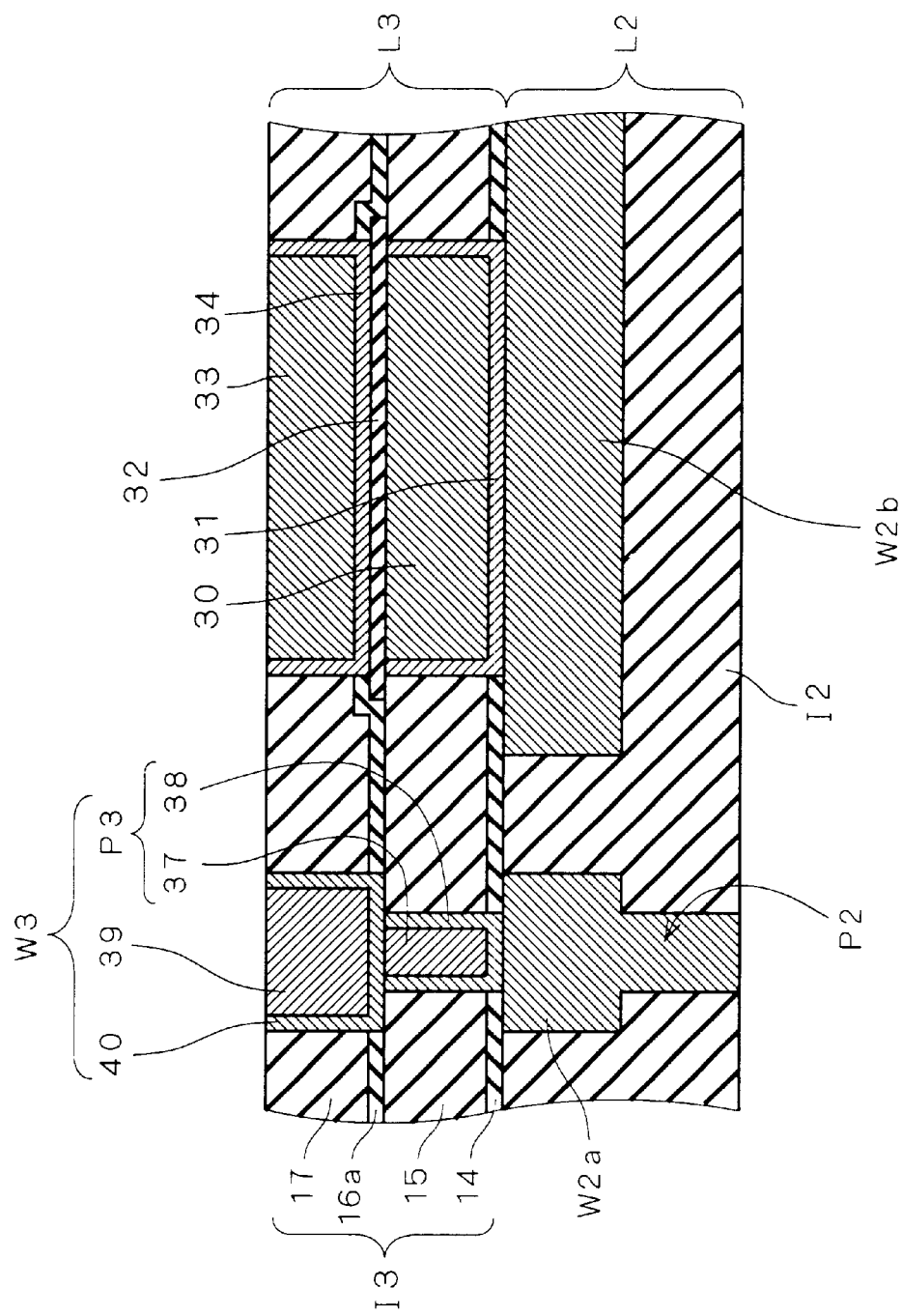
FIG. 39 is a cross section showing a structure of a semiconductor device in accordance with a sixth preferred embodiment of the present invention.
Figure 40:
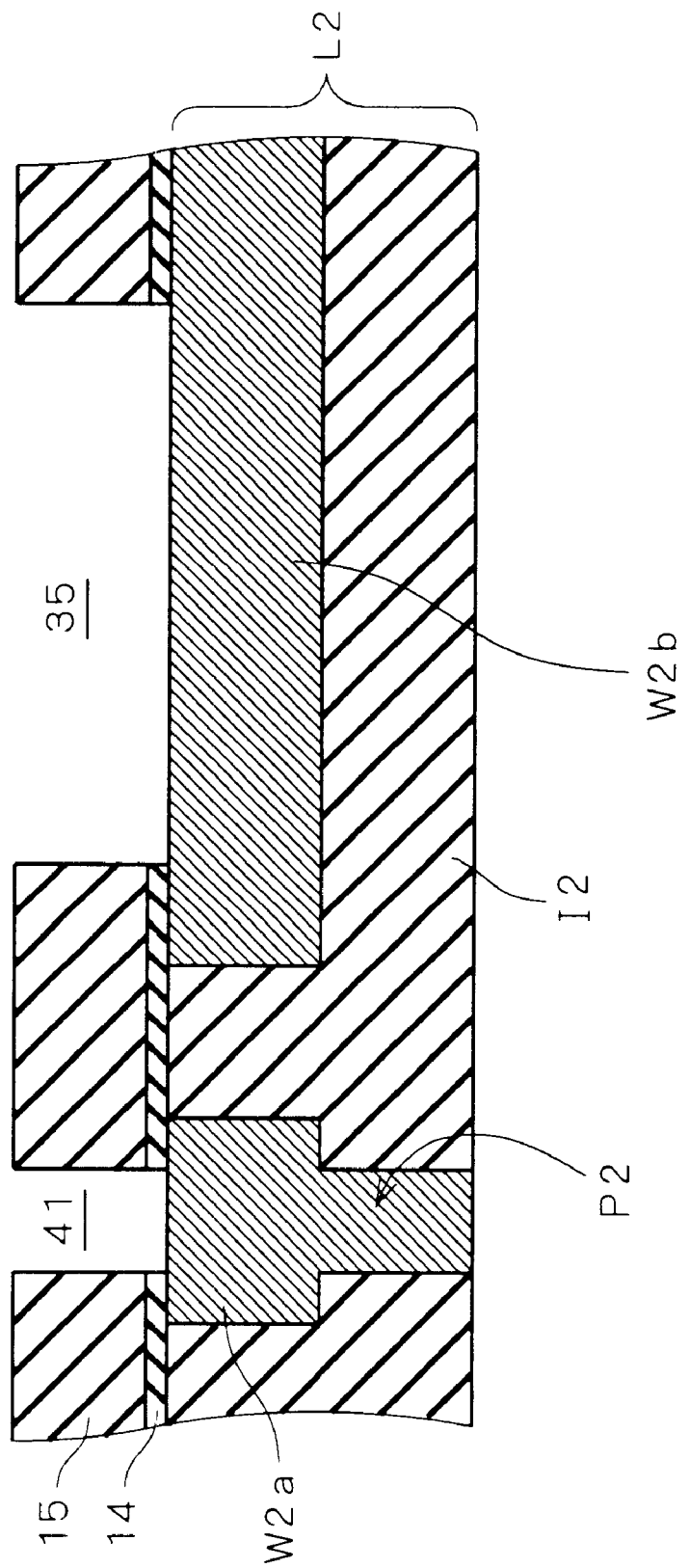
FIGS. 40 to 44 are cross sections showing a method of manufacturing a semiconductor device in accordance with the sixth preferred embodiment of the present invention step by step in sequence.

FIG. 39 is a cross section showing a structure of a semiconductor device in accordance with the sixth preferred embodiment of the present invention. In comparison with the semiconductor device of the fifth preferred embodiment shown in FIG. 30, the semiconductor device of the sixth preferred embodiment has a different structure of the third-level wire W3. In the semiconductor device of the sixth preferred embodiment, the third-level wire W3 separately has the interconnection portion consisting of metal films 39 and 40 and the plug portion P3 consisting of metal films 37 and 38. The metal films 37 and 39 are made of copper. The metal films 38 and 40 are made of TaN, Ta, TiN or the like, serving as barrier metals for the metal films 37 and 39 made of copper, respectively. Other structure of the semiconductor device of the sixth preferred embodiment is the same as that of the semiconductor device of the above-discussed fifth preferred embodiment.

Figure 31:
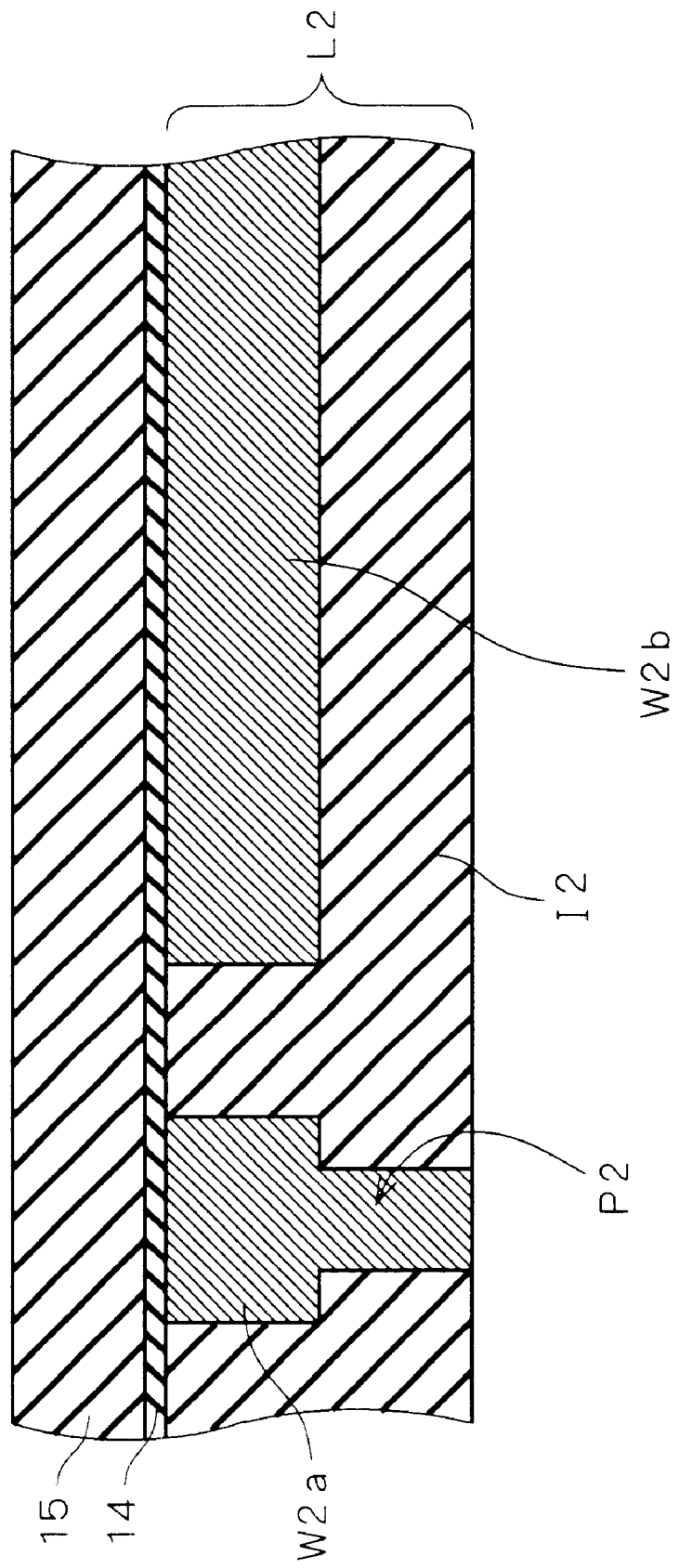
FIGS. 31 to 38 are cross sections showing a method of manufacturing a semiconductor device in accordance with the fifth preferred embodiment of the present invention step by step in sequence.

FIGS. 40 to 44 are cross sections showing a method of manufacturing the semiconductor device of FIG. 39 in accordance with the sixth preferred embodiment of the present invention step by step in sequence. First, the structure of FIG. 31 is obtained through the same steps as discussed in the fifth preferred embodiment. Next, referring to FIG. 40, the insulating films 14 and 15 are patterned by photolithography and anisotropic dry etching to form a contact hole 41 and the recess 35. By forming the contact hole 41, the upper surface of the second-level wire W2a is exposed.

Figure 41:
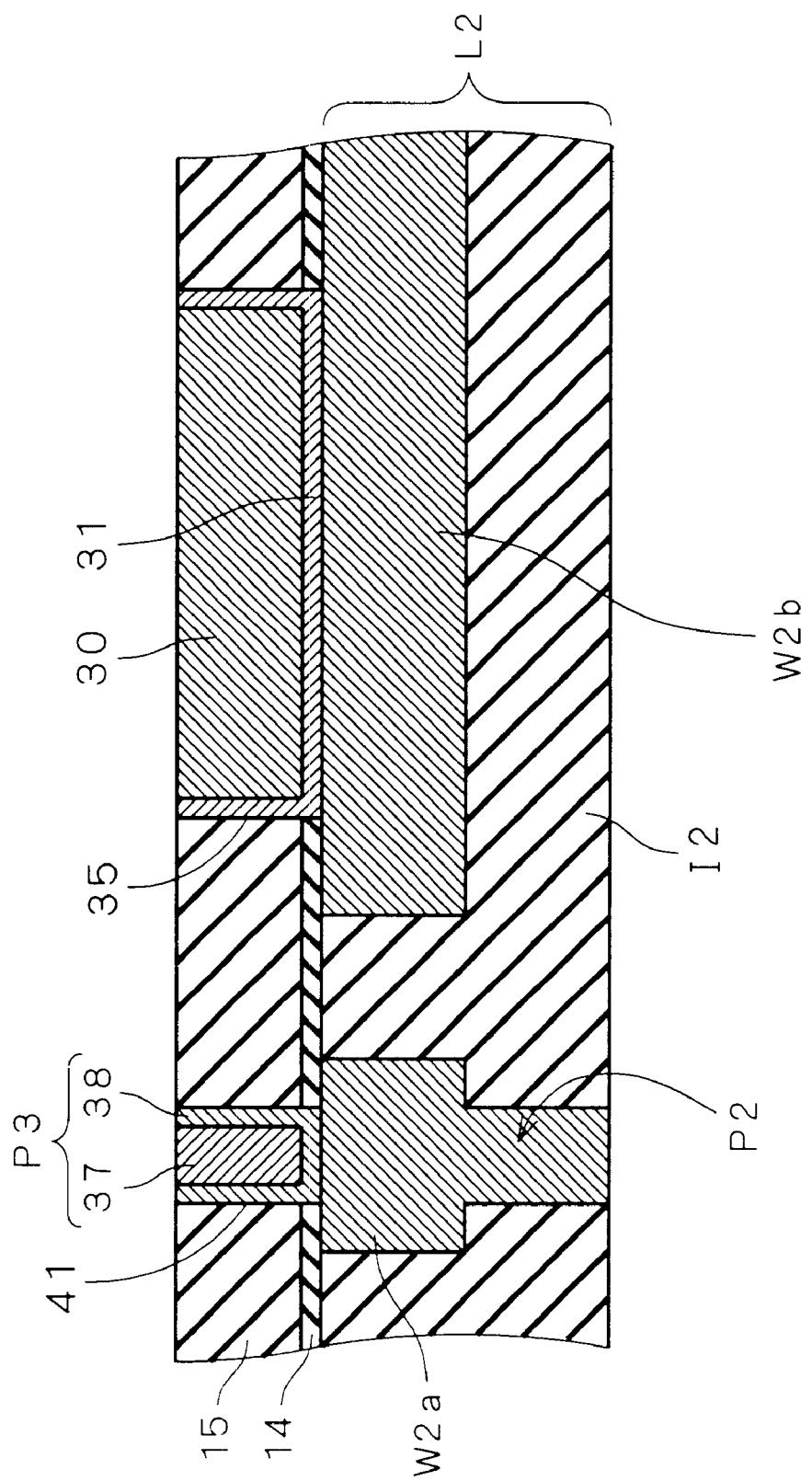

Next, referring to FIG. 41, the metal films 31 and 38 are entirely formed by sputtering. Subsequently, the metal films 30 and 37 are entirely formed by plating to have a film thickness enough to fully fill the inside of the contact hole 41 and the recess 35. Then, these metal films are polished by CMP till the upper surface of the insulating film 15 is exposed, to planarize the surfaces of these metal and insulating films. Through this step formed are the plug portion P3 having the metal films 37 and 38 which is buried in the contact hole 41 and the first electrode having the metal films 30 and 31 which is buried in the recess 35.

Figure 42:
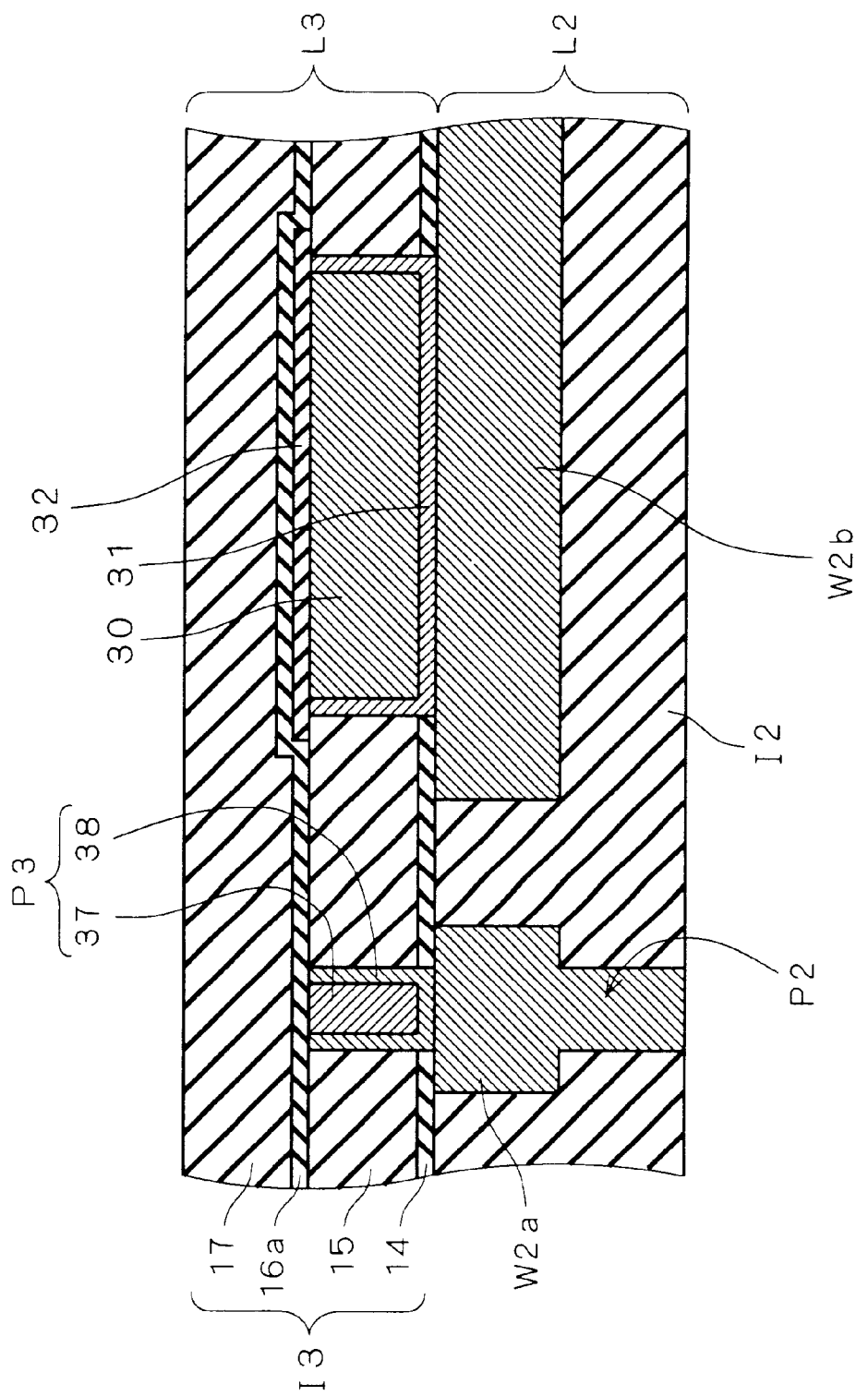

Next, referring to FIG. 42, the insulating films 32, 16a and 17 are formed through the same step as discussed in the fifth preferred embodiment. In the sixth preferred embodiment, the insulating film 16a also has a function as an antioxidizing film and by forming the insulating film 16a, oxidation of an upper surface of the plug portion P3 can be prevented. Considering the selectivity in etching, however, it is necessary to form the insulating film 16a of a material different from that of the insulating film 32.

Figure 43:
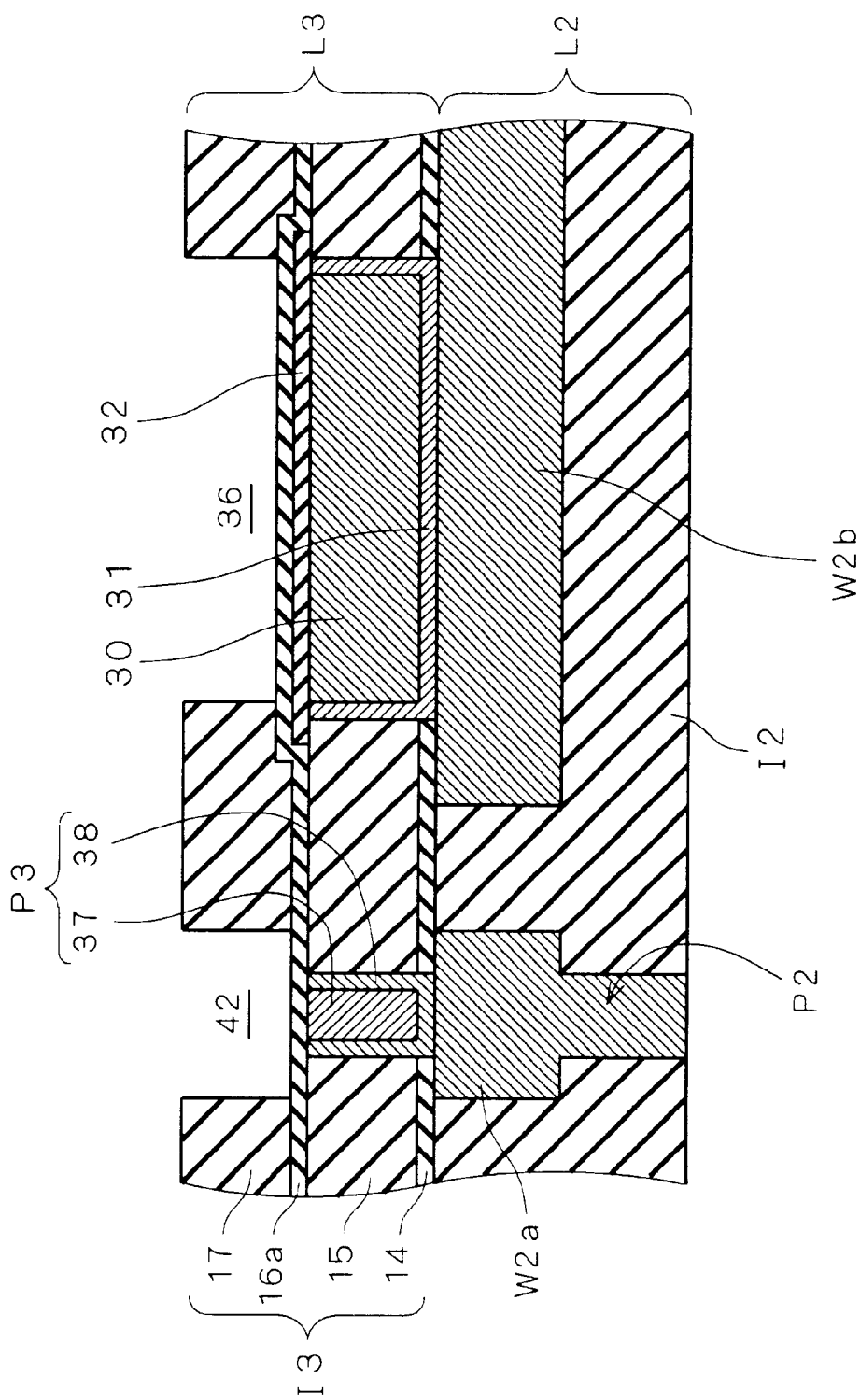
Figure 44:
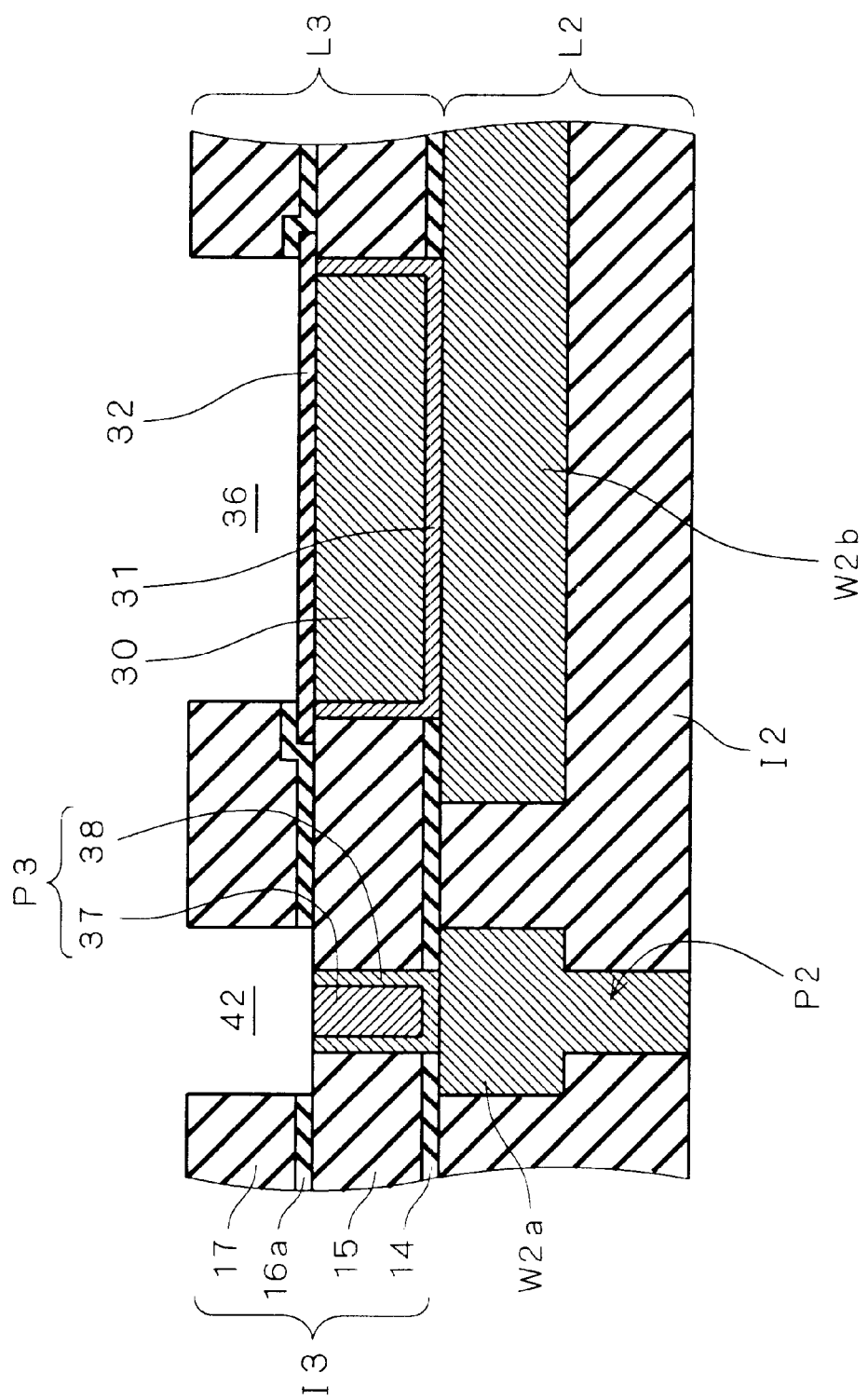

Next, referring to FIG. 43, the insulating film 17 is patterned by photolithography and anisotropic dry etching, to form an interconnection trench 42 above the plug portion P3 and the recess 36 above the second electrode. Like in the fifth preferred embodiment, the insulating film 16a serves as an etching stopper for the anisotropic dry etching. Next, referring to FIG. 44, a portion of the insulating film 16a which is not covered with the insulating film 17 is removed by full etchback, to expose the upper surface of the plug portion P3 and the upper surface of the metal film 32.

Subsequently, the metal films 40 and 34 are entirely formed by sputtering. Then, the metal films 39 and 33 are entirely formed by plating to have a film thickness enough to fully fill the inside of the interconnection trench 42 and the inside of the recess 36. These metal films are polished by CMP till the upper surface of the insulating film 17 is exposed, to planarize the surfaces of these metal and insulating films. Through the above process steps, the structure shown in FIG. 39 is obtained.

Thus, according to the structure of the semiconductor device and the method of manufacturing the same of the sixth preferred embodiment, the MIM-type capacitor can be formed in the multi-level wire structure with no additional complicate process step, and the same effect as discussed in the fifth preferred embodiment can be achieved, even by a single damascene process in which the interconnection portion and the plug portion are separately formed.

The Seventh Preferred Embodiment

Figure 45:
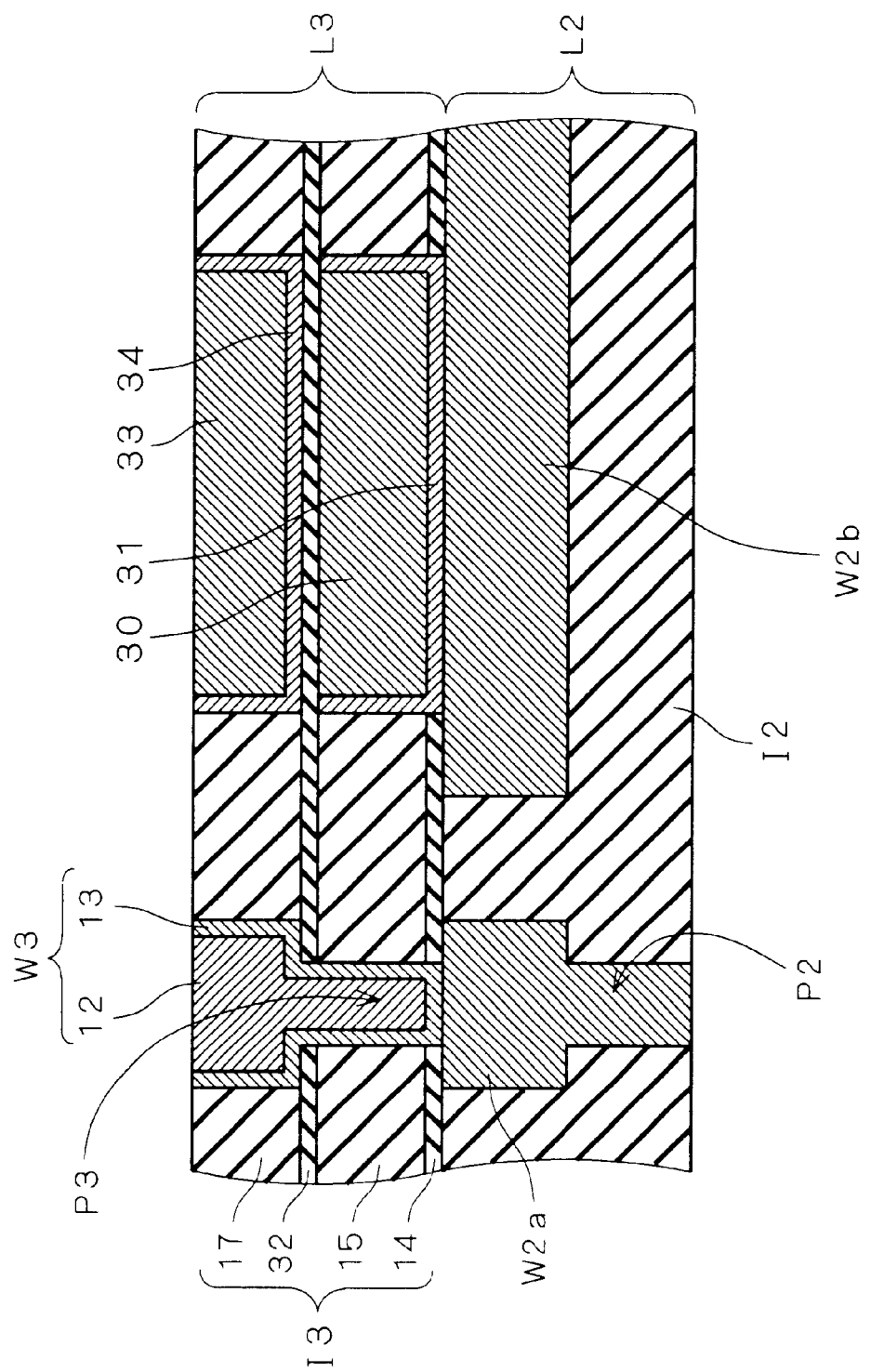
FIG. 45 is a cross section showing a structure of a semiconductor device in accordance with a seventh preferred embodiment of the present invention.
Figure 46:
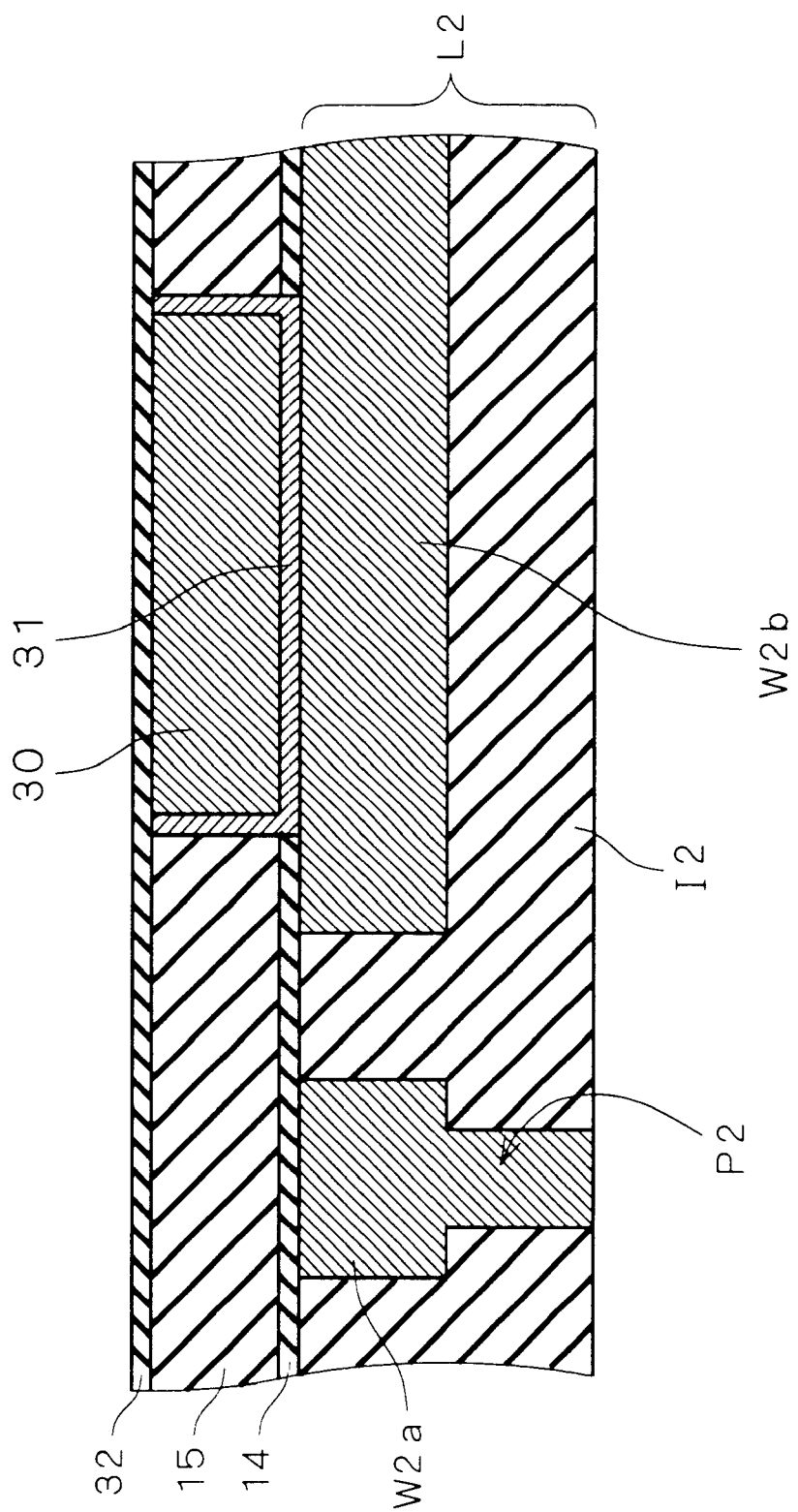
FIGS. 46 to 49 are cross sections showing a method of manufacturing a semiconductor device in accordance with the seventh preferred embodiment of the present invention step by step in sequence.
Figure 47:
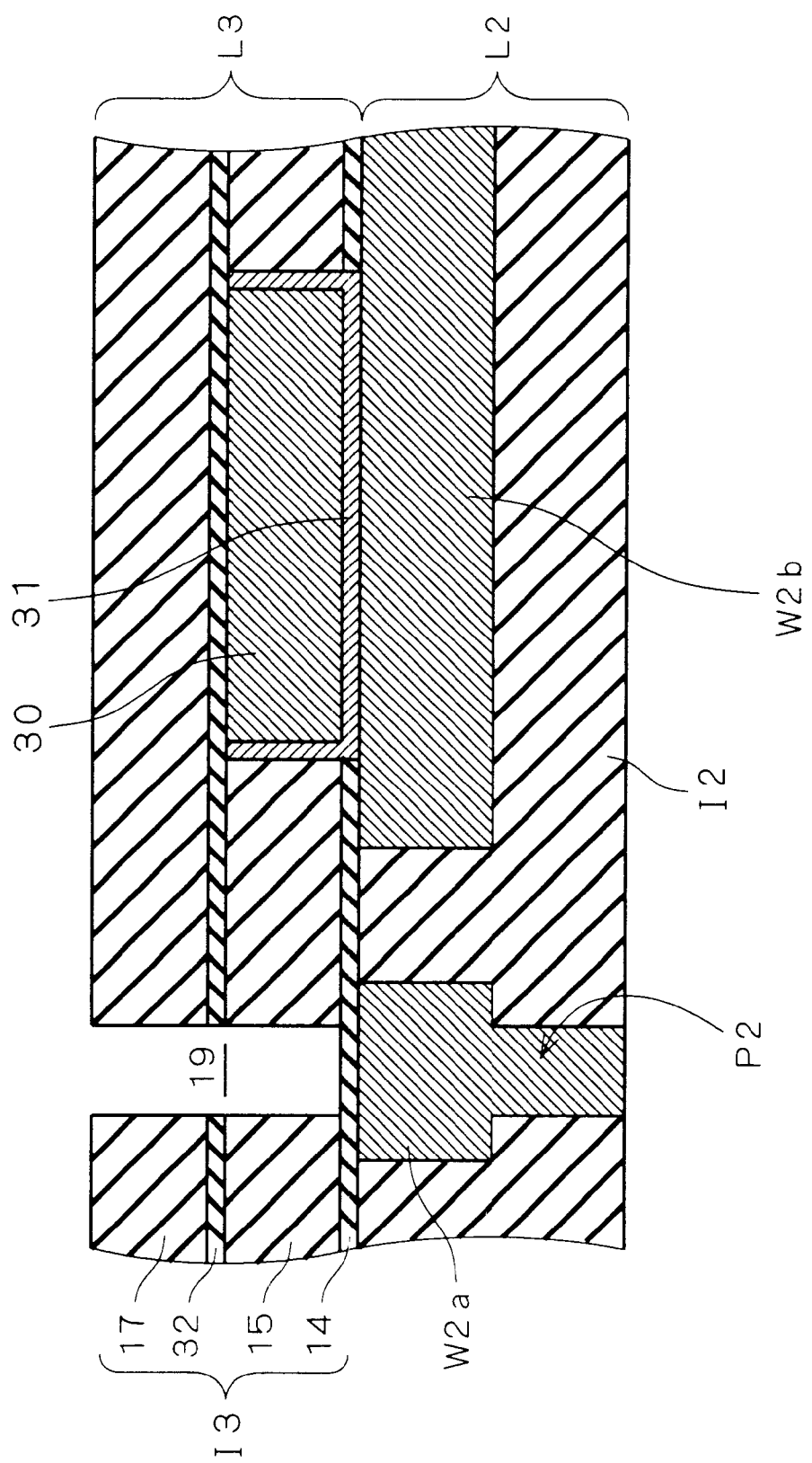
Figure 48:
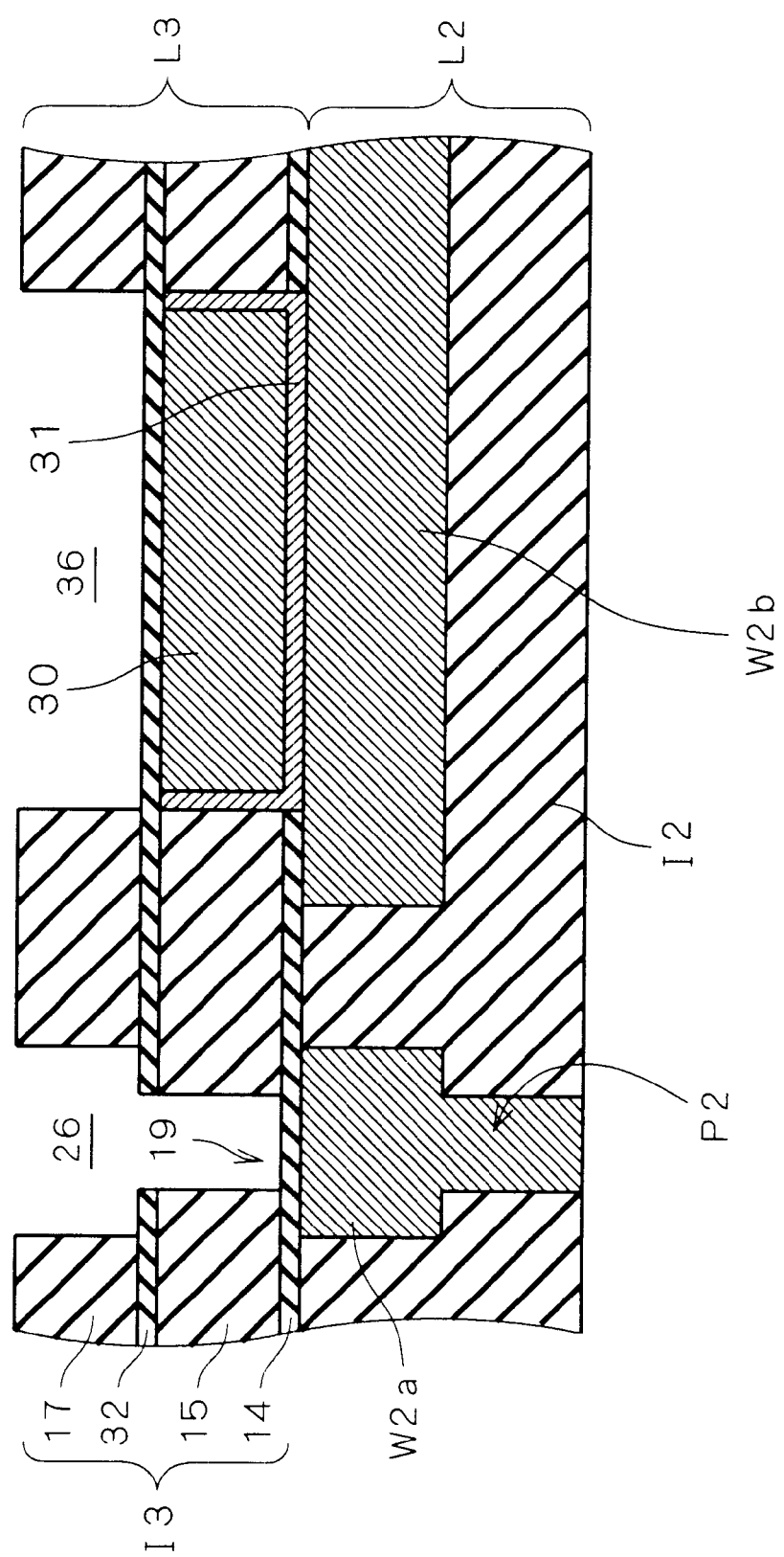
Figure 49:
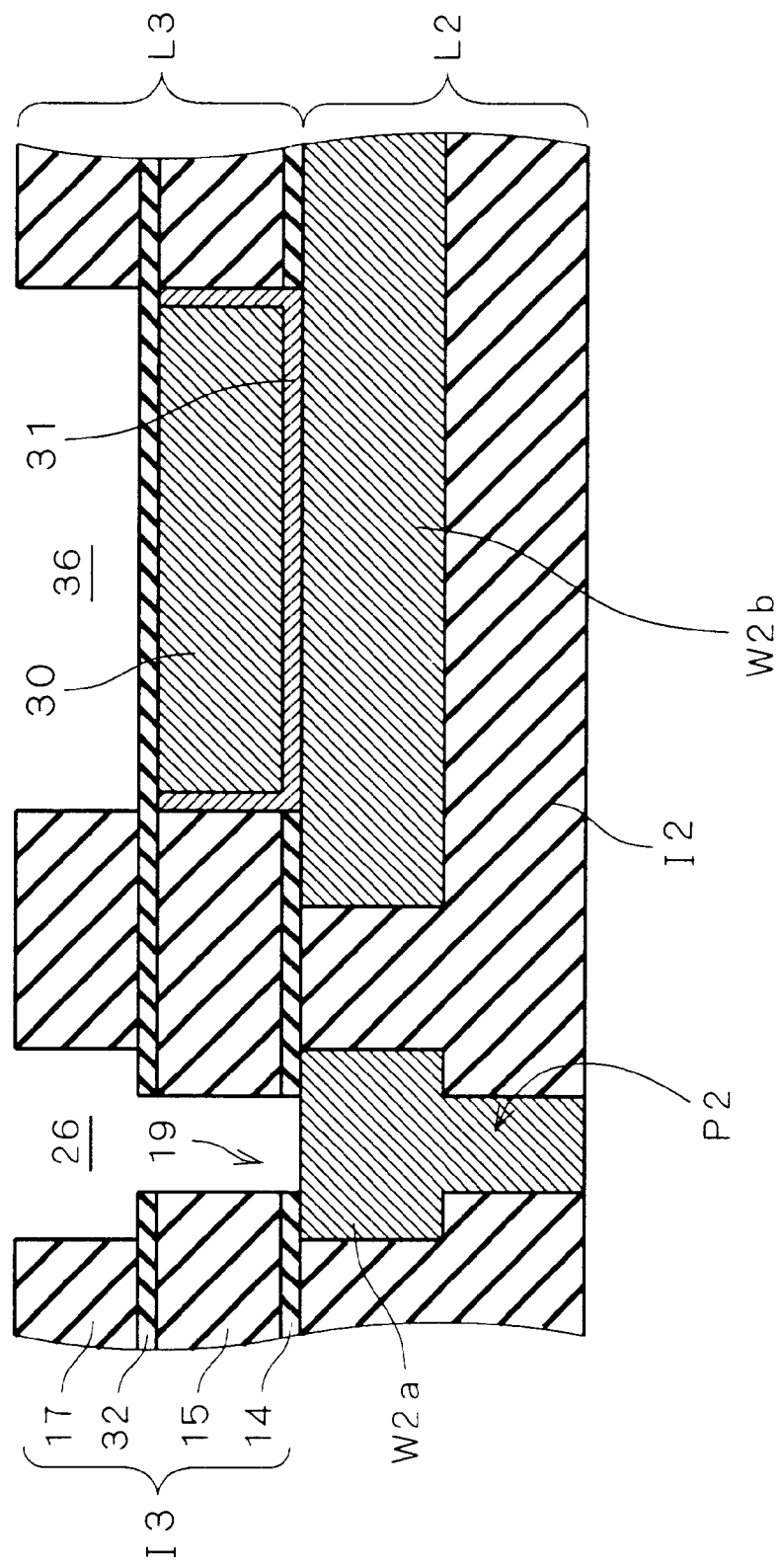

FIG. 45 is a cross section showing a structure of a semiconductor device in accordance with the seventh preferred embodiment of the present invention. In comparison with the semiconductor device of the fifth preferred embodiment shown in FIG. 30, the semiconductor device of the seventh preferred embodiment has no insulating film 16a and has a different structure of the insulating film 32 serving as the capacitor dielectric film. In the semiconductor device of the seventh preferred embodiment, the insulating film 32 is formed not only on the first electrode of the MIM-type capacitor but also on the insulating film 15. The insulating film 32 is made of a material different from that of the insulating film 14, and a portion of the insulating film 32 which is sandwiched between the first electrode and the second electrode serves as the capacitor dielectric film. Other structure of the semiconductor device of the seventh preferred embodiment is the same as that of the semiconductor device of the above-discussed fifth preferred embodiment.

FIGS. 46 to 49 are cross sections showing a method of manufacturing the semiconductor device of FIG. 45 in accordance with the seventh preferred embodiment of the present invention step by step in sequence. First, the structure of FIG. 33 is obtained. through the same steps as discussed in the fifth preferred embodiment. Next, referring to FIG. 46, the insulating film 32 is entirely formed by CVD. Next, referring to FIG. 47, the insulating film 17 is entirely formed by CVD. Subsequently, the contact hole 19 is formed by photolithography and anisotropic dry etching. Next, referring to FIG. 48, the interconnection trench 26 and the recess 36 are formed in the insulating film 17 by photolithography and anisotropic dry etching. Next, referring to FIG. 49, a portion of the insulating film 14 which is not covered with the insulating film 15 is removed by full etchback, to expose the upper surface of the second-level wire W2a.

Subsequently, the metal films 13 and 34 are entirely formed by sputtering. Then, the metal films 12 and 33 are entirely formed by plating to have a film thickness enough to fully fill the inside of the contact hole 19, the inside of the interconnection trench 26 and the recess 36. These metal films are polished by CMP till the upper surface of the insulating film 17 is exposed, to planarize the surfaces of these metal and insulating films. Through the above process steps, the structure shown in FIG. 45 is obtained.

Thus, according to the structure of the semiconductor device and the method of manufacturing the same of the seventh preferred embodiment, the MIM-type capacitor can be formed in the multi-level wire structure in the dual damascene process with no additional complicate process step, like in the fifth preferred embodiment.

Further, since the insulating film 32 serving as the antioxidizing film for the metal film 30 also serves as the capacitor dielectric film, the number of process steps is reduced as compared with the case where the antioxidizing film and the capacitor dielectric film are separately formed.

Moreover, since the step for patterning the insulating film 32 (FIG. 34) and the step for forming the insulating film 16a (FIG. 35) are not performed, the number of process steps is reduced as compared with the method of the fifth preferred embodiment. By forming the insulating film 16a serving as an etching stopper on the insulating film 32, however, it is possible to achieve the above effect of the fifth preferred embodiment that the degree of overetching on the insulating film 32 can be reduced.

The Eighth Preferred Embodiment

Figure 50:
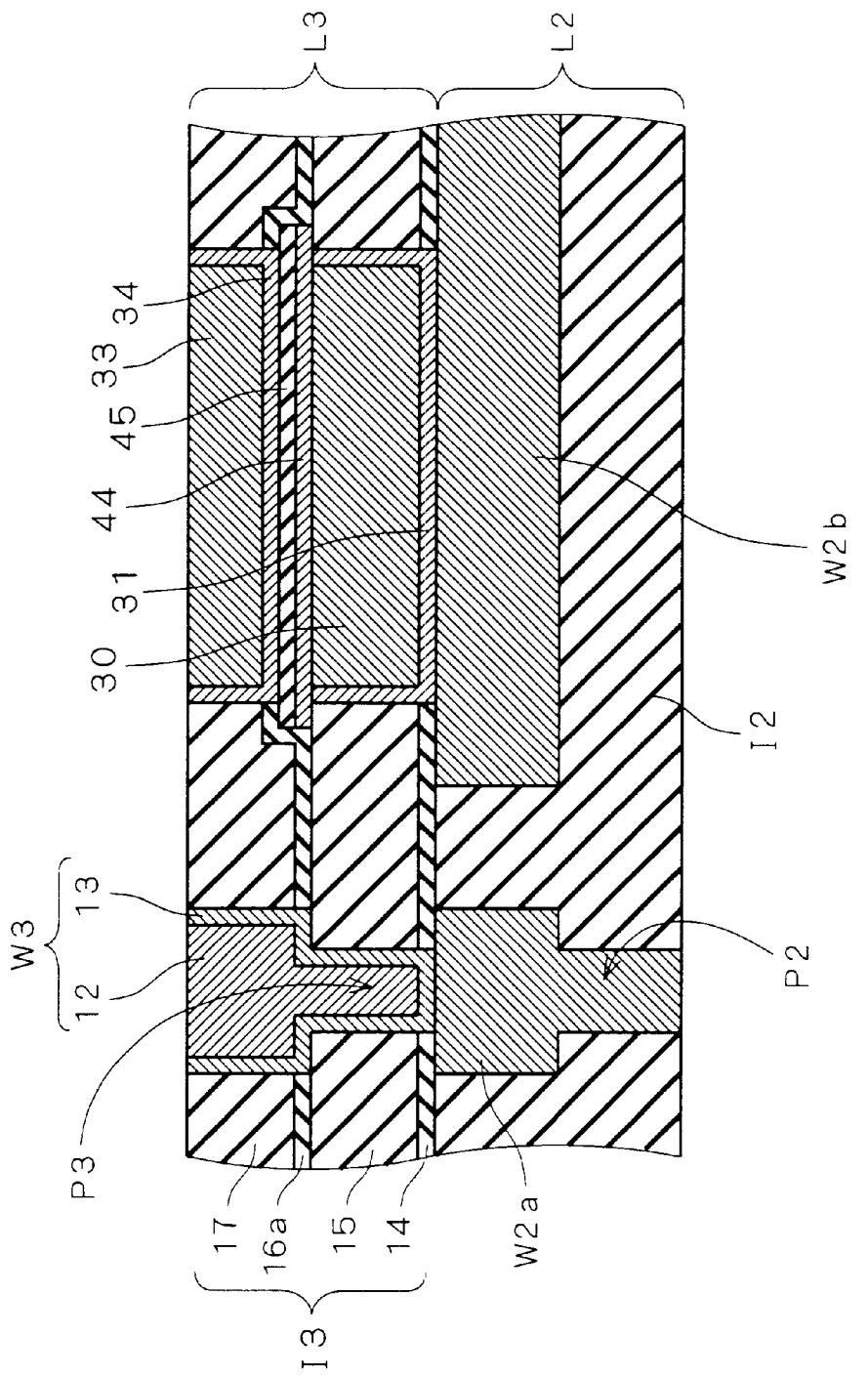
FIG. 50 is a cross section showing a structure of a semiconductor device in accordance with an eighth preferred embodiment of the present invention.
Figure 51:
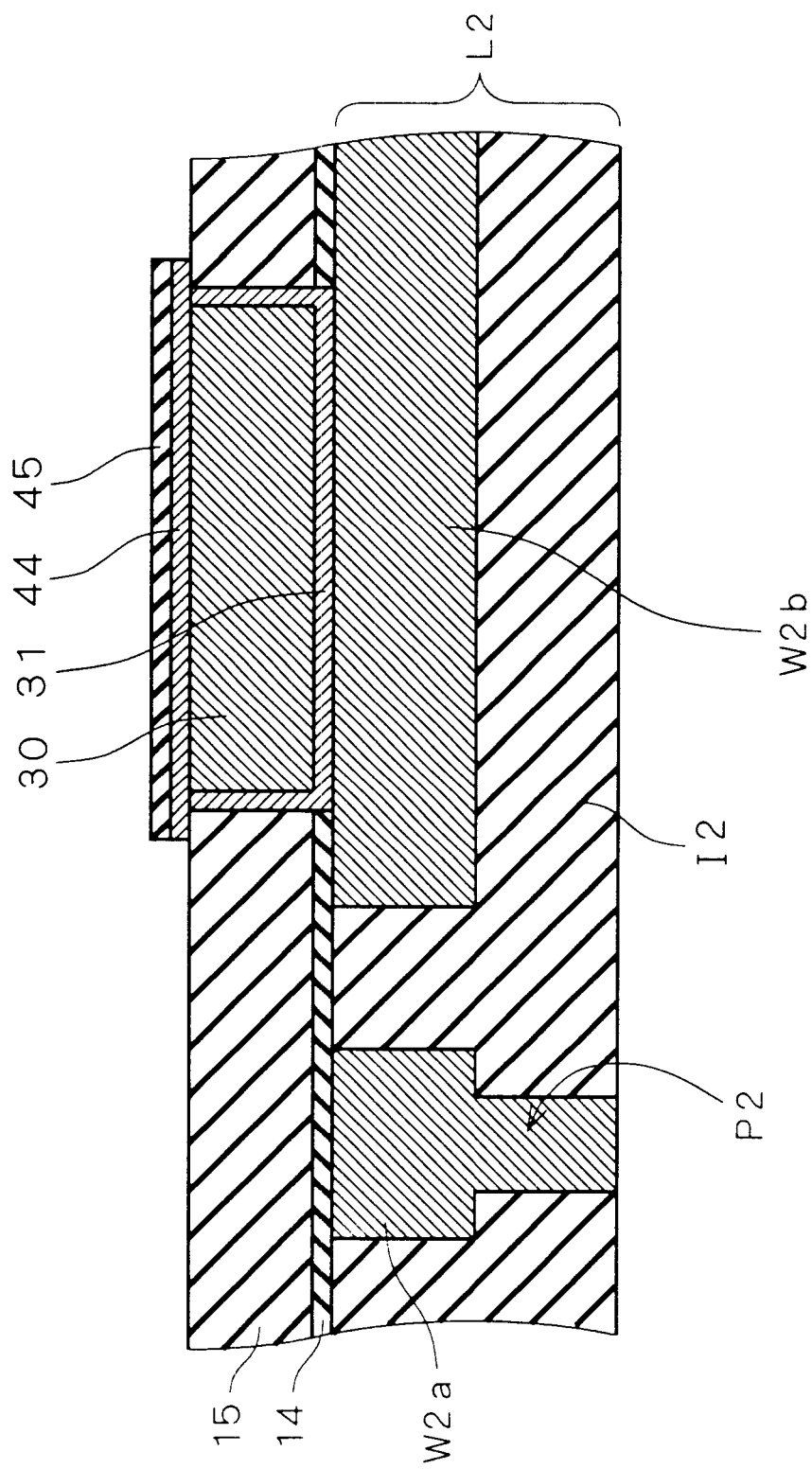
FIGS. 51 to 54 are cross sections showing a method of manufacturing a semiconductor device in accordance with the eighth preferred embodiment of the present invention step by step in sequence.

FIG. 50 is a cross section showing a structure of a semiconductor device in accordance with the eighth preferred embodiment of the present invention. In the semiconductor device of the eighth preferred embodiment, a metal film 44 is formed on the upper surface of the first electrode of the MIM-type capacitor, and an insulating film 45 is formed on the metal film 44. The second electrode is formed on the insulating film 45. The metal film 44 is made of TaN, Ta, TiN or the like, serving as a barrier metal for the metal film 30 made of copper. The insulating film 45 is made of a material having higher dielectric constant than $Si_3N4$ or SiC which is the material of the insulating film 32. Other structure of the semiconductor device of the eighth preferred embodiment is the same as that of the semiconductor device of the above-discussed fifth preferred embodiment shown in FIG. 30.

FIGS. 51 to 54 are cross sections showing a method of manufacturing the semiconductor device of FIG. 50 in accordance with the eighth preferred embodiment of the present invention step by step in sequence. First, the structure of FIG. 33 is obtained through the same steps as discussed in the fifth preferred embodiment. Next, referring to FIG. 51, the metal film 44 is entirely formed by sputtering. Subsequently, the insulating film 45 is entirely formed by CVD. Then, the metal film 44 and the insulating film 45 are patterned by photolithography and anisotropic dry etching, to leave these films only on the first electrode of the MIM-type capacitor.

Figure 52:
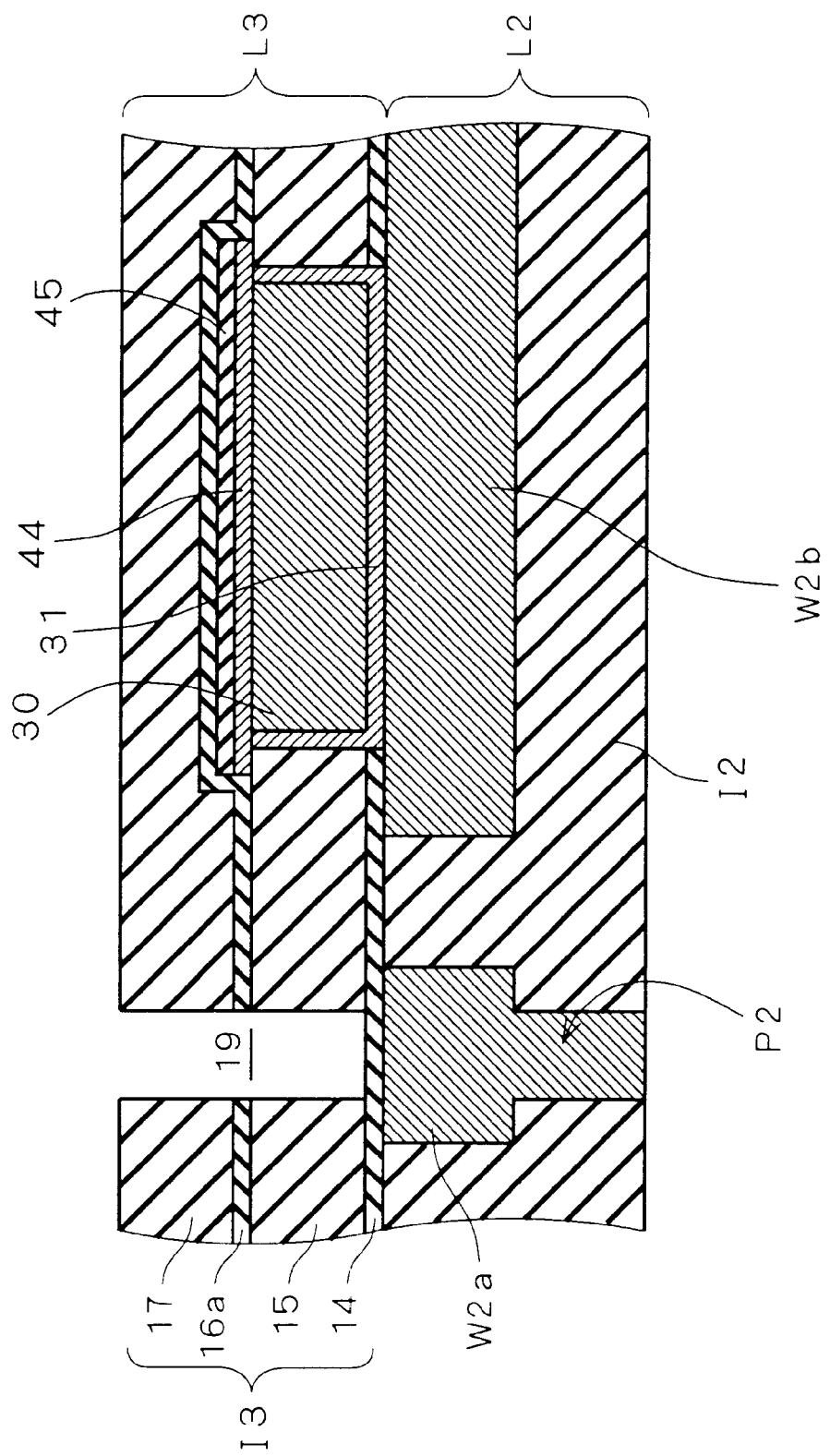

Next, referring to FIG. 52, the insulating films 16a and 17 are entirely formed by CVD in this order. Subsequently, the contact hole 19 is formed by photolithography and anisotropic dry etching. Next, referring to FIG. 53, the interconnection trench 26 and the recess 36 are formed in the insulating film 17 by photolithography and anisotropic dry etching. In this anisotropic dry etching, the insulating film 16a serves as an etching stopper. Next, referring to FIG. 54, a portion of the insulating film 14 which is not covered with the insulating film 15 is removed by full etchback, to expose the upper surface of the second-level wire W2a. Subsequently, a portion of the insulating film 16a which is not covered with the insulating film 17 is removed by full etchback, to expose an upper surface of the insulating film 45.

Subsequently, the metal films 13 and 34 are entirely formed by sputtering. Then, the metal films 12 and 33 are entirely formed by plating to have a film thickness enough to fully fill the inside of the contact hole 19, the inside of the interconnection trench 26 and the recess 36. These metal films are polished by CMP till the upper surface of the insulating film 17 is exposed, to planarize the surfaces of these metal and insulating films. Through the above process steps, the structure shown in FIG. 50 is obtained.

Thus, according to the structure of the semiconductor device and the method of manufacturing the same of the eighth preferred embodiment, the MIM-type capacitor can be formed in the multi-level wire structure in the dual damascene process with no additional complicate process step, like in the fifth preferred embodiment.

Figure 53:
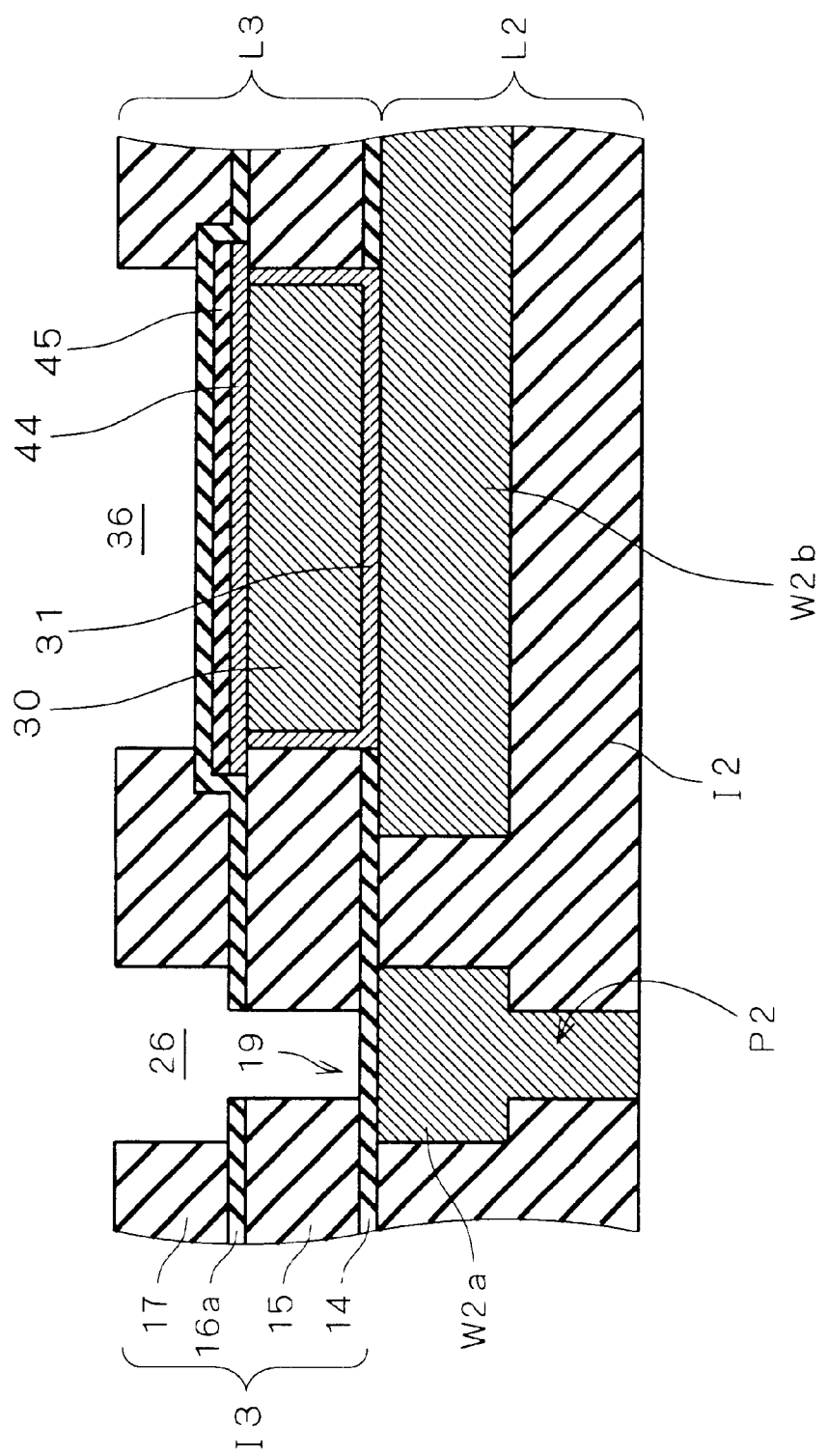
Figure 54:
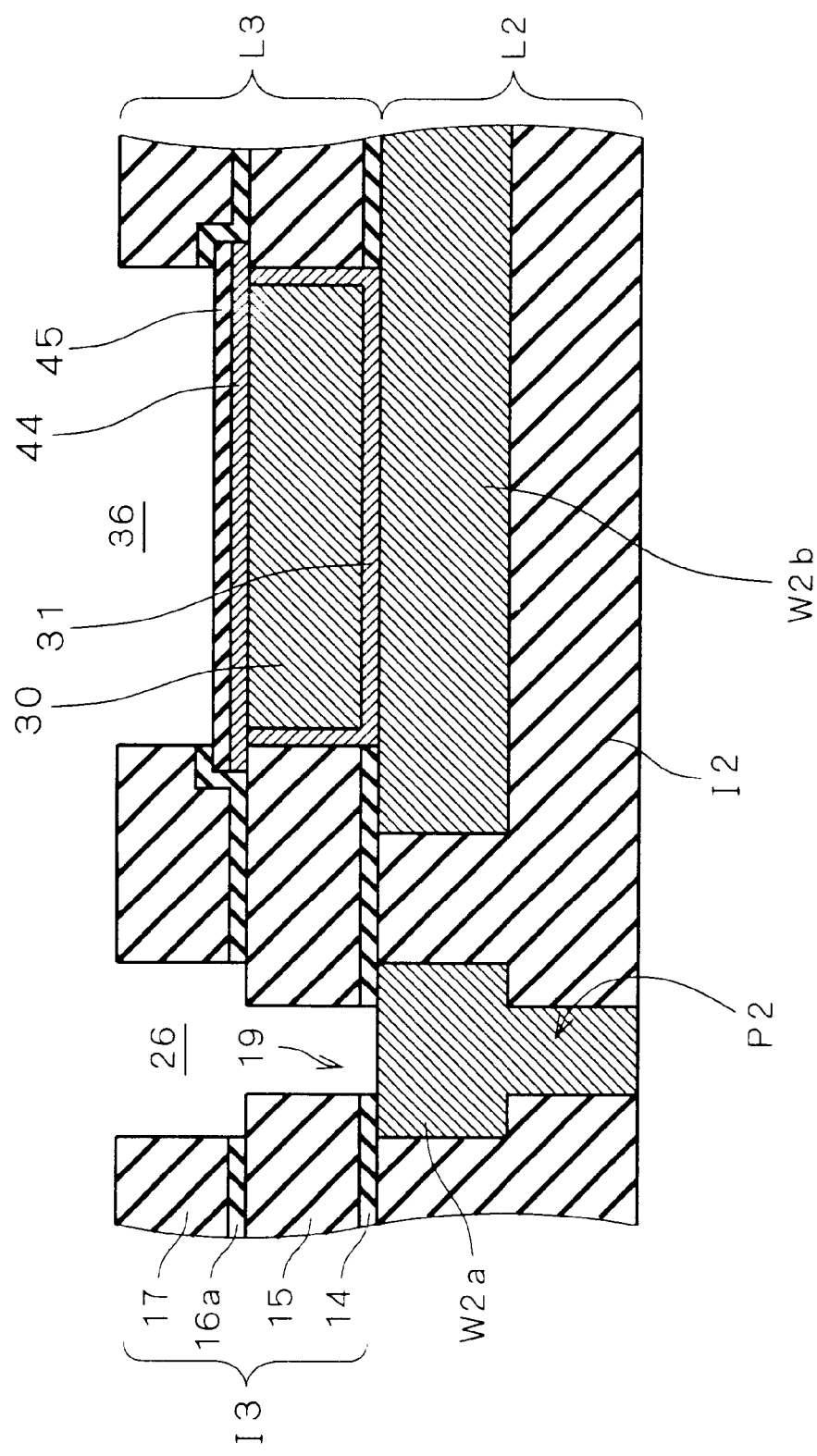

Further, the insulating film 16a is used as an etching stopper when the anisotropic dry etching is performed to form the recess 36 in the step of FIG. 53. Therefore, since it is possible to prevent part of the insulating film 45 from being removed by overetching of the anisotropic dry etching, a high-performance capacitor of less variation in capacitor capacitance can be obtained.

Furthermore, the metal film 44 serving as a barrier metal is formed on the upper surface of the metal film 30 made of copper and the insulating film 45 is formed on the metal film 44, not directly on the metal film 30. Therefore, an insulating film made of a material, other than $Si_3N_4$ or SiC, having higher dielectric constant than $Si_3N_4$ or SiC can be used for the insulating film 45, and as a result, it is possible to increase capacitor capacitance.

The Ninth Preferred Embodiment

Figure 55:
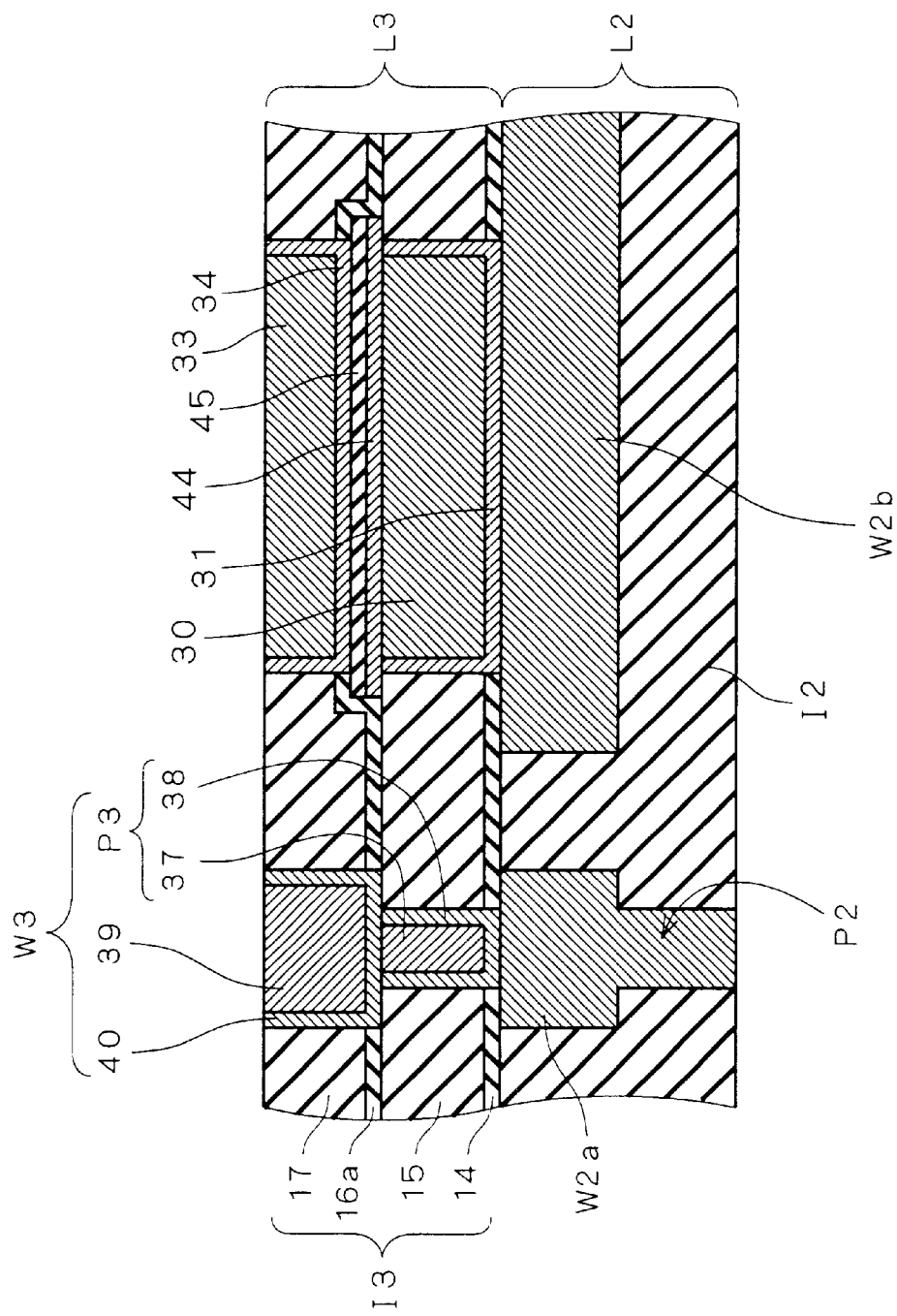
FIG. 55 is a cross section showing a structure of a semiconductor device in accordance with a ninth preferred embodiment of the present invention.
Figure 56:
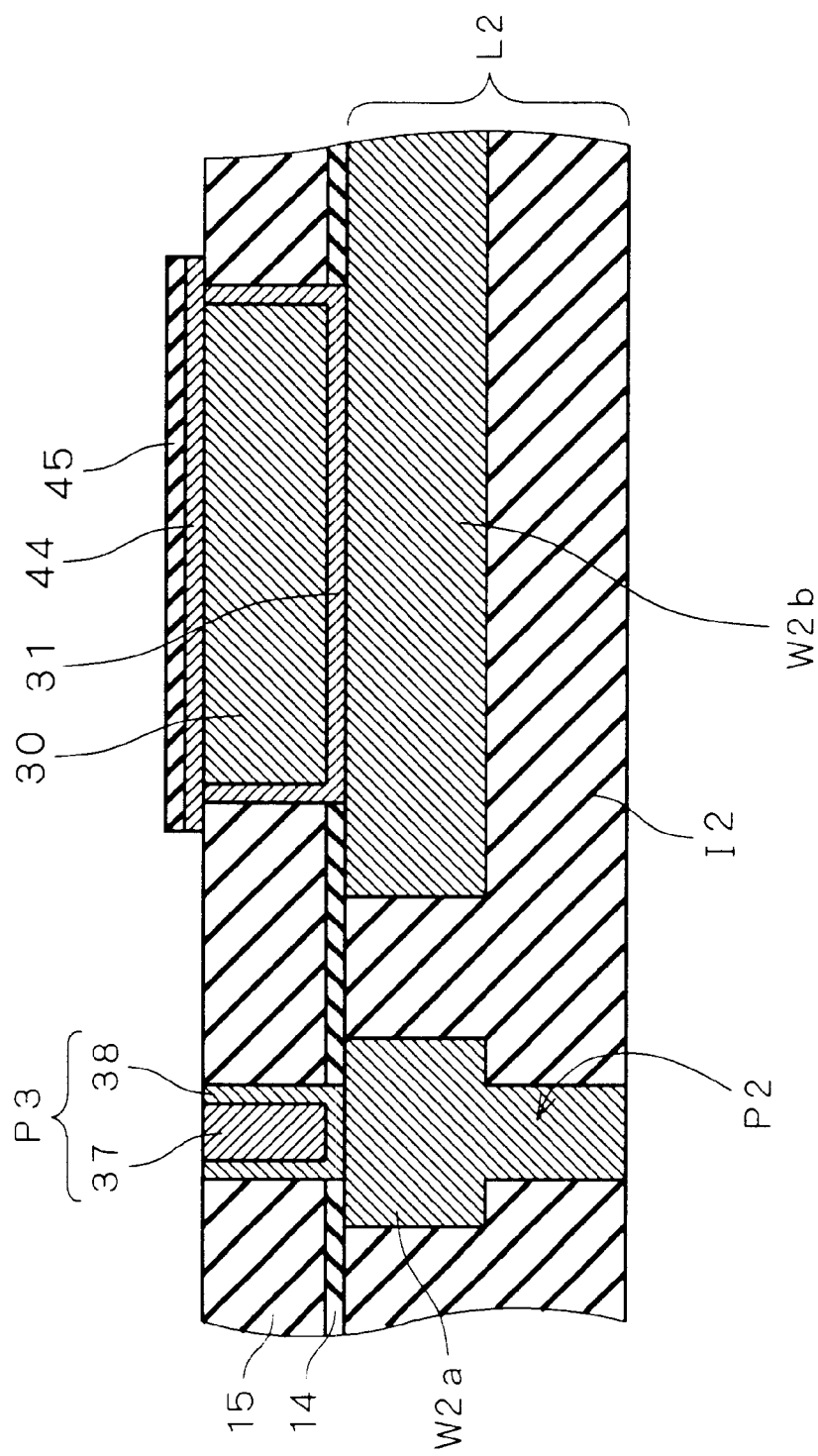
FIGS. 56 to 59 are cross sections showing a method of manufacturing a semiconductor device in accordance with the ninth preferred embodiment of the present invention step by step in sequence.

FIG. 55 is a cross section showing a structure of a semiconductor device in accordance with the ninth preferred embodiment of the present invention. In comparison with the semiconductor device of the eighth preferred embodiment shown in FIG. 50, the semiconductor device of the ninth preferred embodiment has a different structure of the third-level wire W3. In the semiconductor device of the ninth preferred embodiment, the third-level wire W3 separately has the interconnection portion consisting of the metal films 39 and 40 and the plug portion P3 consisting of the metal films 37 and 38. Other structure of the semiconductor device of the ninth preferred embodiment is the same as that of the semiconductor device of the above-discussed eighth preferred embodiment.

FIGS. 56 to 59 are cross sections showing a method of manufacturing the semiconductor device of FIG. 55 in accordance with the ninth preferred embodiment of the present invention step by step in sequence. First, the structure of FIG. 41 is obtained through the same steps as discussed in the sixth preferred embodiment. Next, referring to FIG. 56, the metal film 44 is entirely formed by sputtering. Subsequently, the metal film 45 is entirely formed by CVD. Then, the metal film 44 and the insulating film 45 are patterned by photolithography and anisotropic dry etching, to leave these films only on the first electrode of the MIM-type capacitor.

Figure 57:
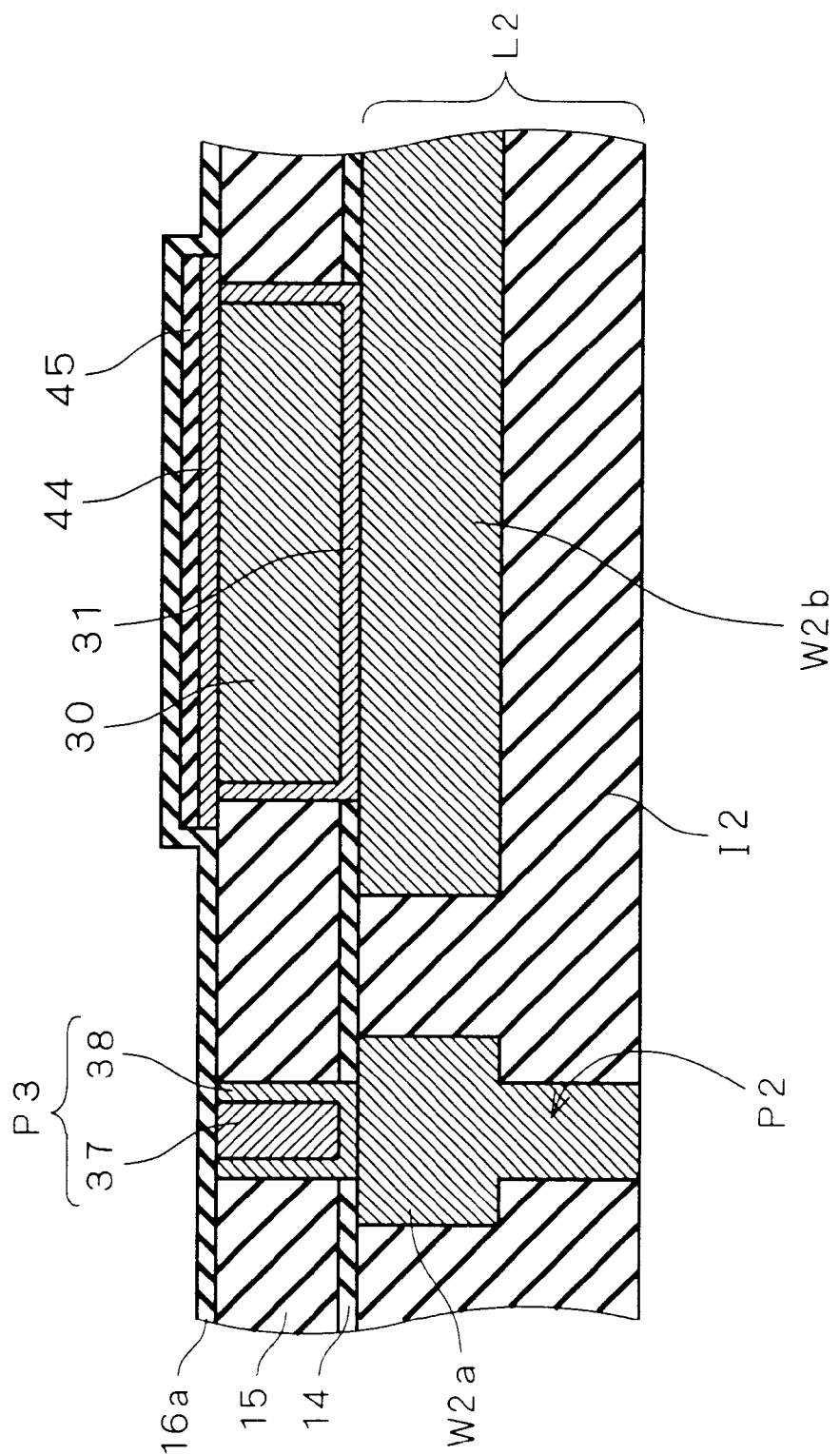
Figure 58:
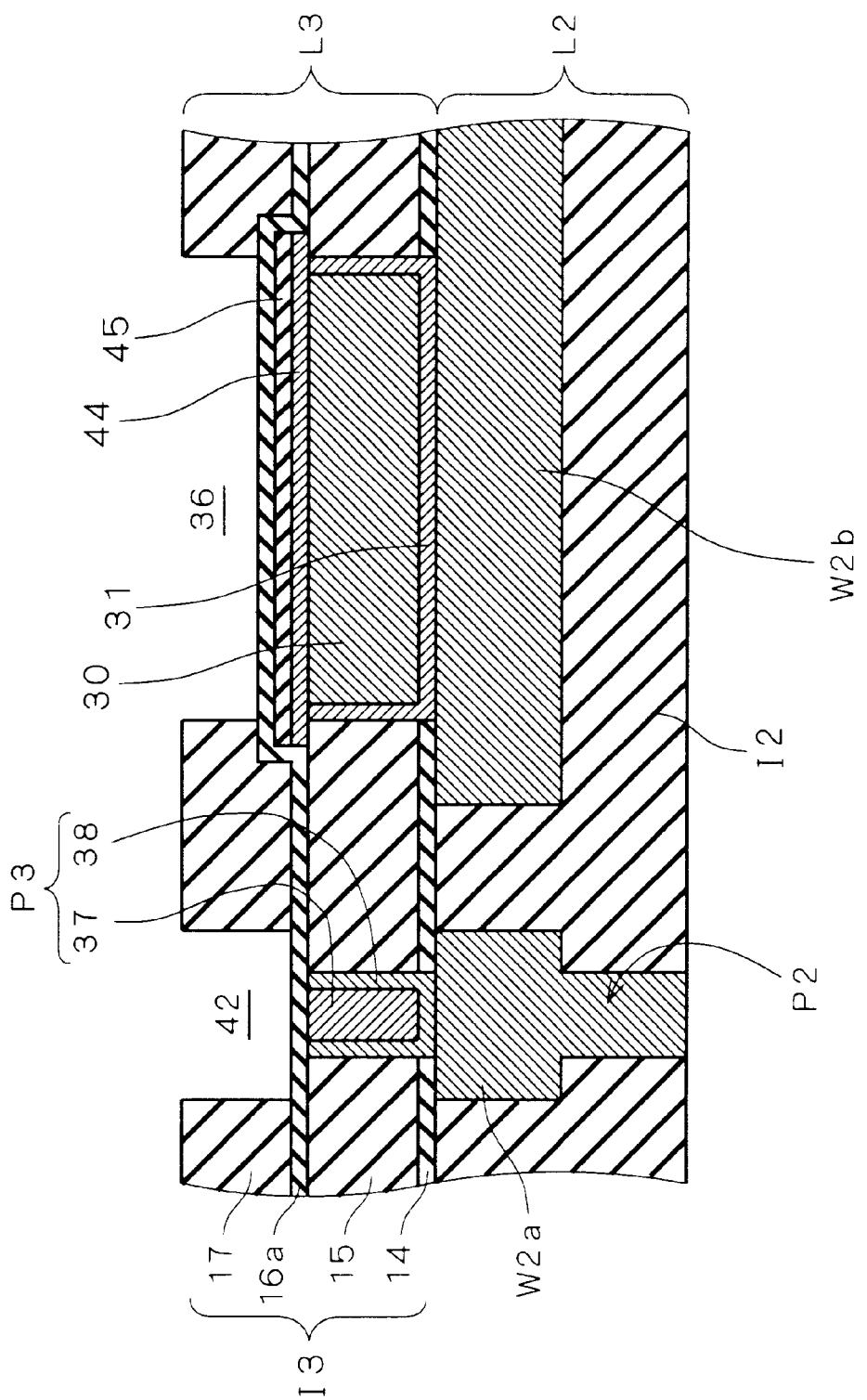
Figure 59:
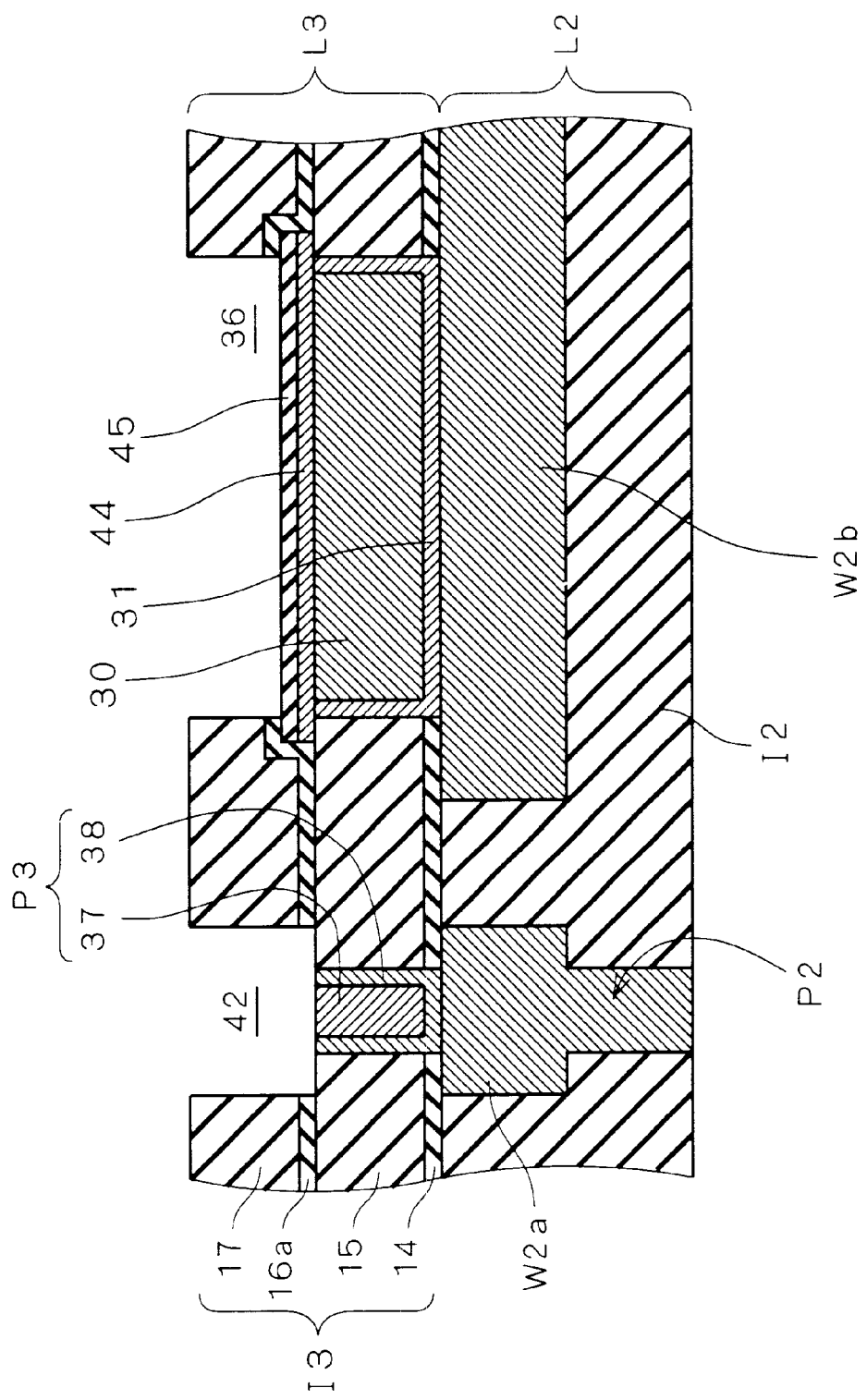

Next, referring to FIG. 57, the insulating film 16a is entirely formed by CVD. Next, referring to FIG. 58, the insulating film 17 is entirely formed by CVD. Subsequently, the interconnection trench 42 and the recess 36 are formed by photolithography and anisotropic dry etching. Next, referring to FIG. 59, a portion of the insulating film 16a which is not covered with the insulating film 17 is removed by full etchback, to expose the upper surface of the plug portion P3 and an upper surface of the insulating film 45.

Subsequently, the metal films 40 and 34 are entirely formed by sputtering. Then, the metal films 39 and 33 are entirely formed by plating to have a film thickness enough to fully fill the inside of the interconnection trench 42 and the inside of the recess 36. These metal films are polished by CMP till the upper surface of the insulating film 17 is exposed, to planarize the surfaces of these metal and insulating films. Through the above process steps, the structure shown in FIG. 55 is obtained.

Thus, according to the structure of the semiconductor device and the method of manufacturing the same of the ninth preferred embodiment, the MIM-type capacitor can be formed in the multi-level wire structure with no additional complicate process step, and the same effect as discussed in the eighth preferred embodiment can be achieved, even by a single damascene process in which the interconnection portion and the plug portion are separately formed.

The Tenth Preferred Embodiment

Figure 60:
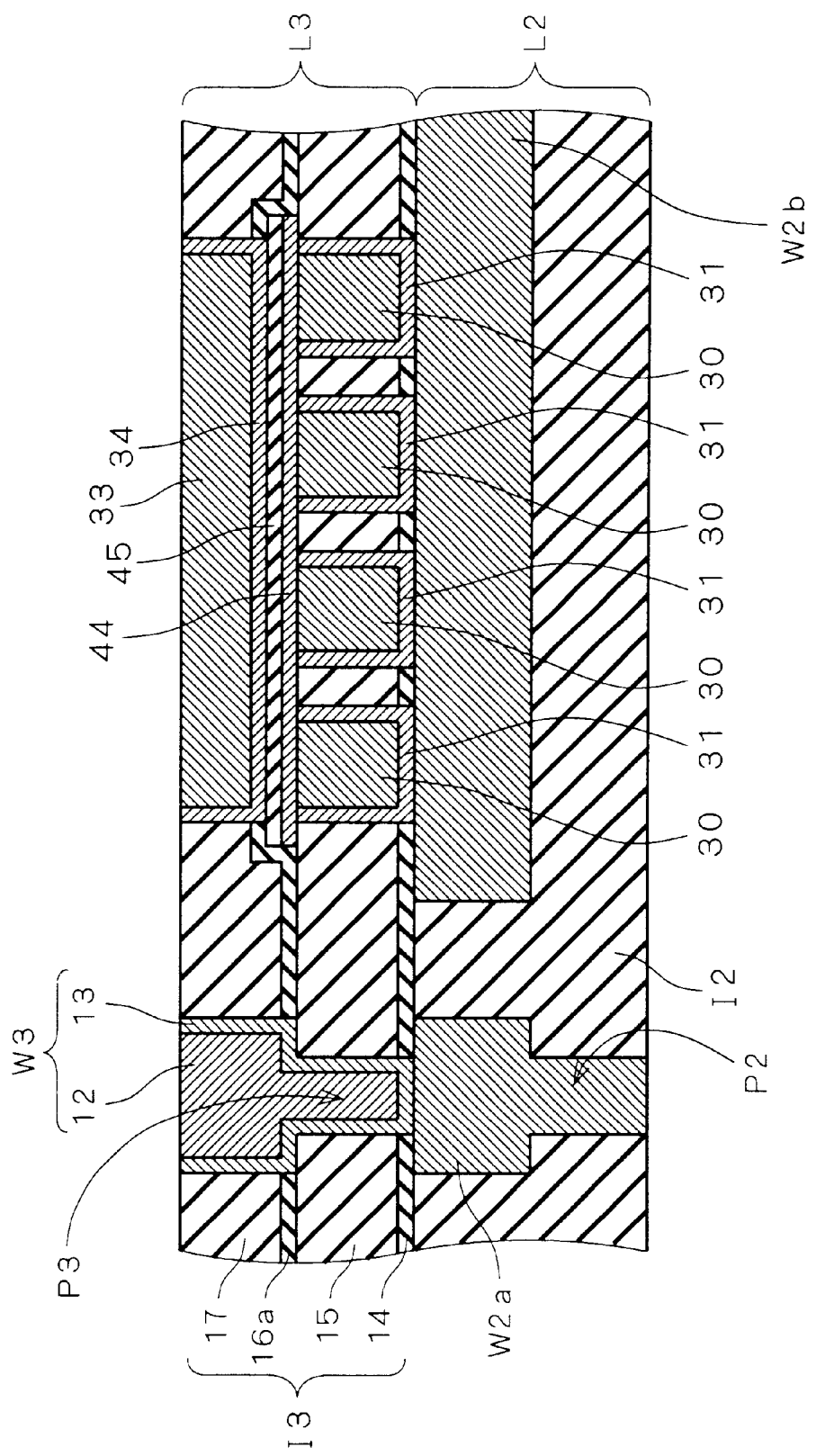
FIG. 60 is a cross section showing a structure of a semiconductor device in accordance with a tenth preferred embodiment of the present invention.

FIG. 60 is a cross section showing a structure of a semiconductor device in accordance with the tenth preferred embodiment of the present invention. The semiconductor device of the tenth preferred embodiment shown in FIG. 60 is based on the structure of the semiconductor device of the eighth preferred embodiment shown in FIG. 50 and the structure of the MIM-type capacitor is improved. The structure having the metal films 30 and 31 which serve as the first electrode of the MIM-type capacitor is divided into a plurality of ones (four in the case of FIG. 60). A plurality of divided metal films 31 are connected in common to the second-level wire W2b. Other structure of the semiconductor device of the tenth preferred embodiment shown in FIG. 60 is the same as that of the semiconductor device of the above-discussed eighth preferred embodiment shown in FIG. 50.

Figure 61:
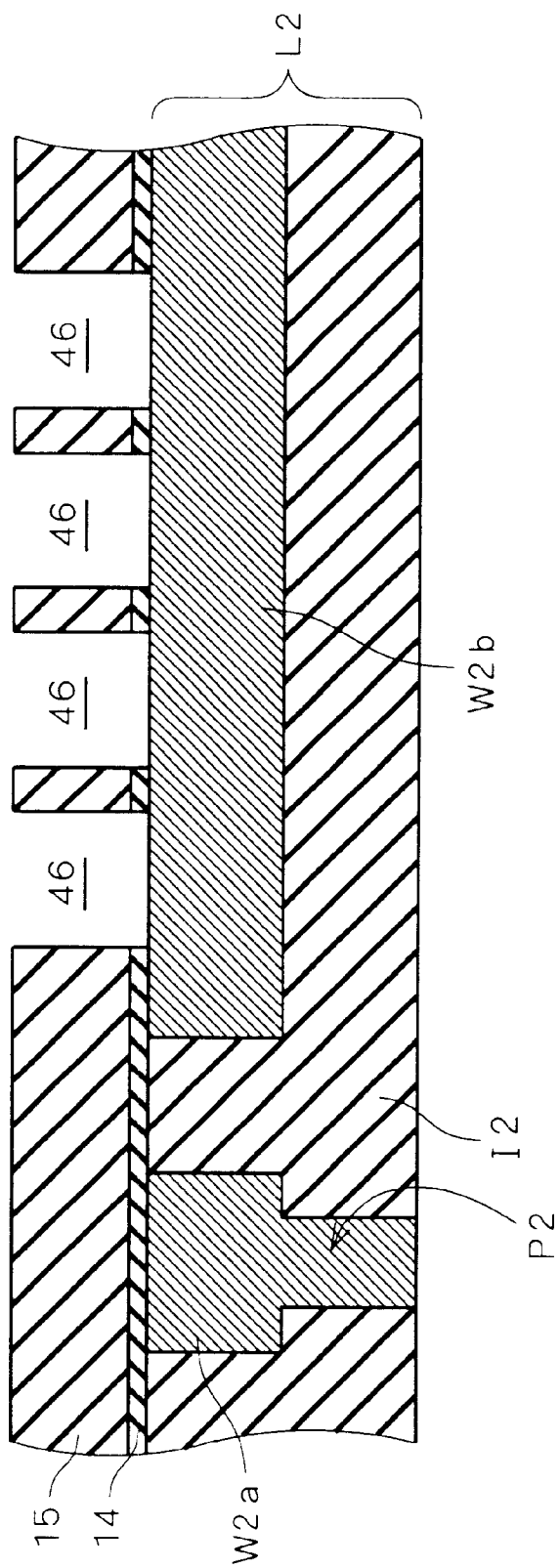
FIG. 61 is a cross section showing a process step in a method of manufacturing a semiconductor device in accordance with the tenth preferred embodiment of the present invention.

FIG. 61 is a cross section showing a process step in a method of manufacturing the semiconductor device in accordance with the tenth preferred embodiment of the present invention. Referring to FIG. 61, a plurality of divided recesses 46 are formed, instead of forming one recess 35 in the step of FIG. 32. Thus, a plurality of divided first electrodes can be formed in a plurality of recesses 46, respectively.

Further, the invention of the tenth preferred embodiment in which the first electrode of the MIM-type capacitor is divided into a plurality of ones can be applied to any one of the above-discussed first to ninth preferred embodiments and the eleventh to fifteenth preferred embodiments discussed later.

Thus, according to the structure of the semiconductor device and the method of manufacturing the same of the tenth preferred embodiment, the MIM-type capacitor can be formed in the multi-level wire structure in the dual damascene process with no additional complicate process step.

Further, since the first electrode of the MIM-type capacitor is divided into a plurality of ones, the area of an upper surface of each divided first electrode is reduced. Therefore, dishing can be reduced in the CMP process for polishing the metal film 30 which is so formed as to fill the inside of the recess 46. Moreover, since the metal film 44 is formed in the structure of FIG. 60, the facing area of the first electrode and the second electrode is not reduced and the capacitor capacitance is not reduced even when the first electrode is divided.

The Eleventh Preferred Embodiment

Figure 62:
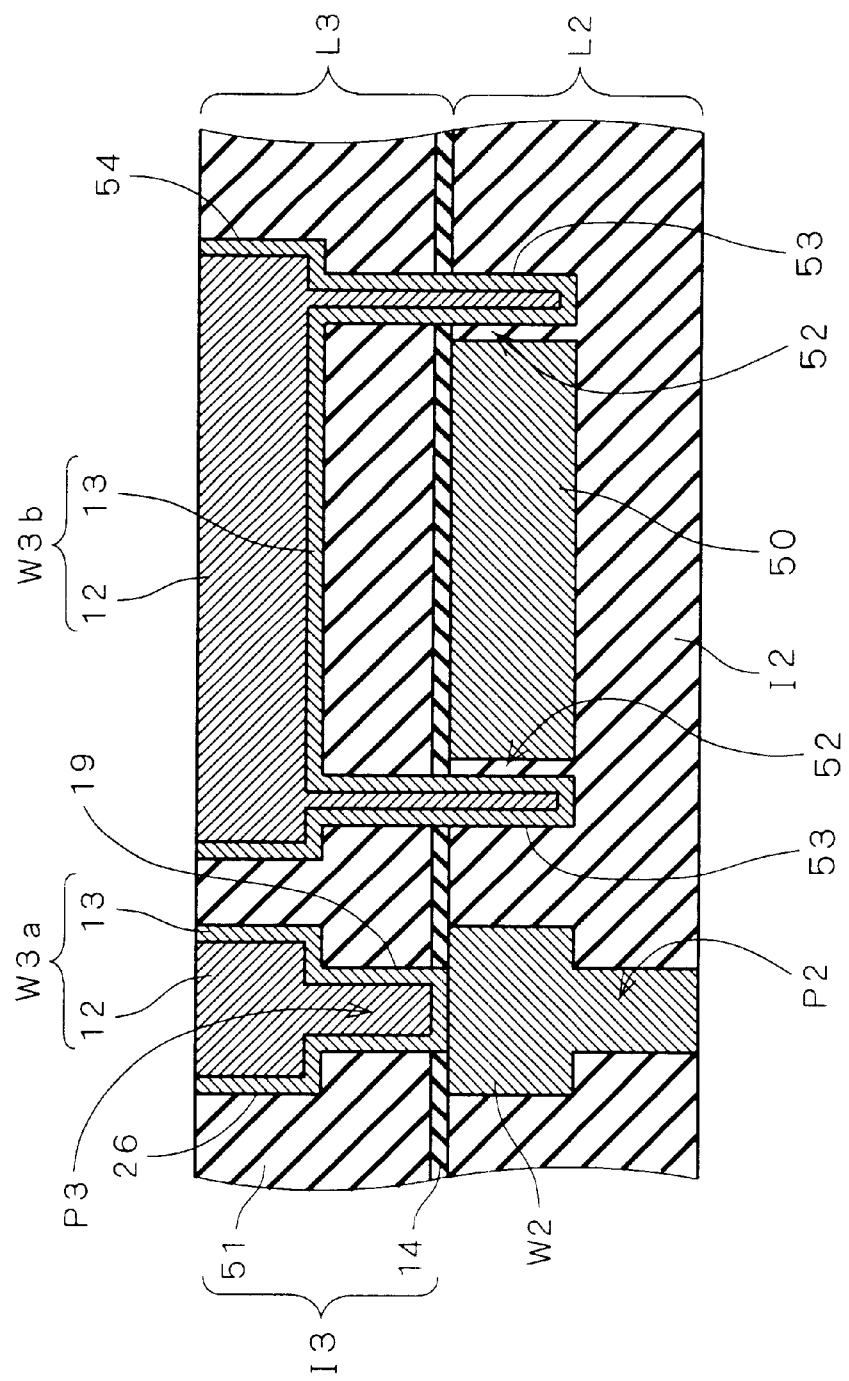
FIG. 62 is a plan view showing a structure of a semiconductor device in accordance with an eleventh preferred embodiment of the present invention.
Figure 63:
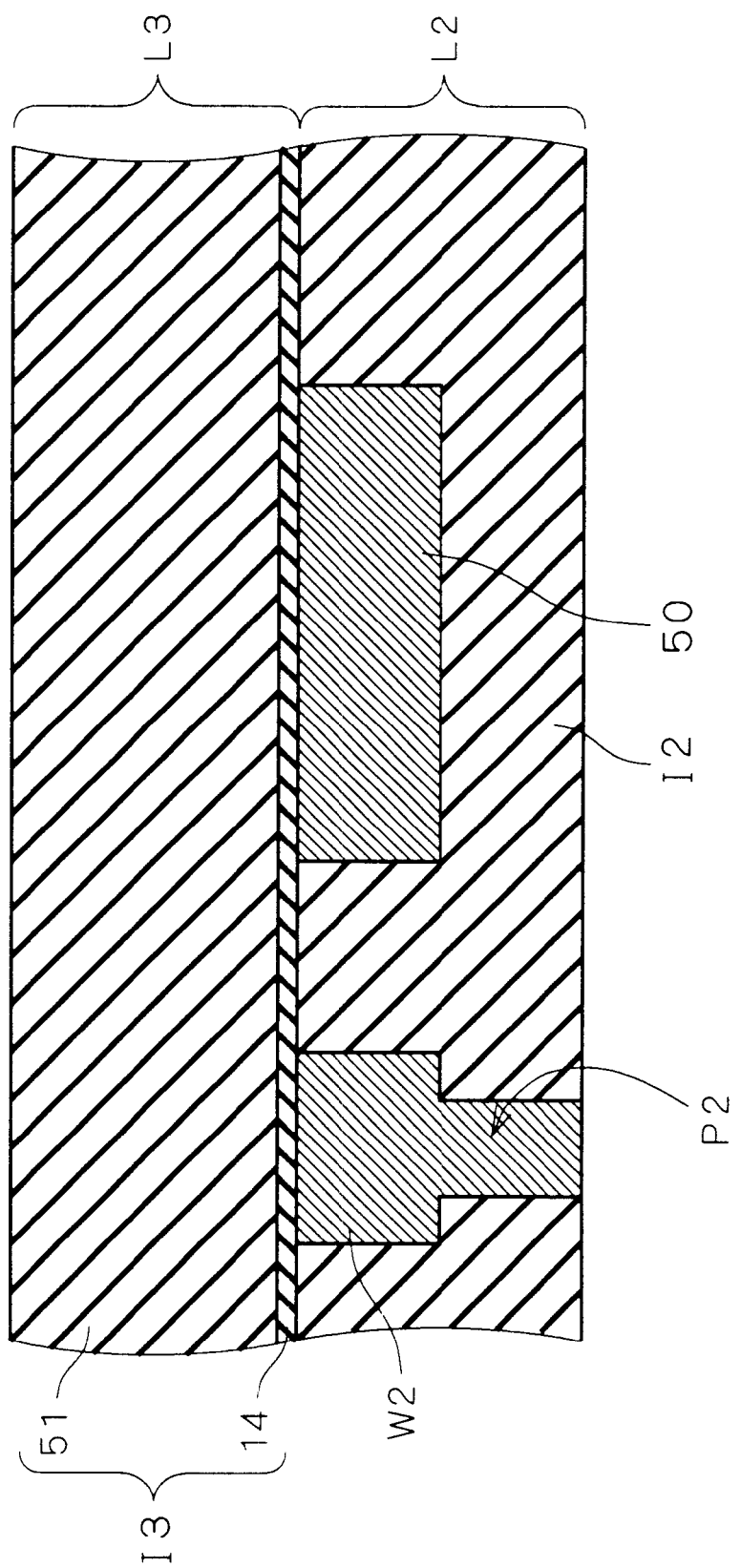
FIG. 63 is a plan view showing another structure of the semiconductor device in accordance with the eleventh preferred embodiment of the present invention.

FIG. 62 is a plan view showing a structure of a semiconductor device in accordance with the eleventh preferred embodiment of the present invention, and FIG. 63 is a plan view showing another structure of the semiconductor device in accordance with the eleventh preferred embodiment of the present invention. Further, FIG. 64 is a cross section showing a sectional structure taken along the line X1—X1 of FIGS. 62 and 63.

Figure 64:
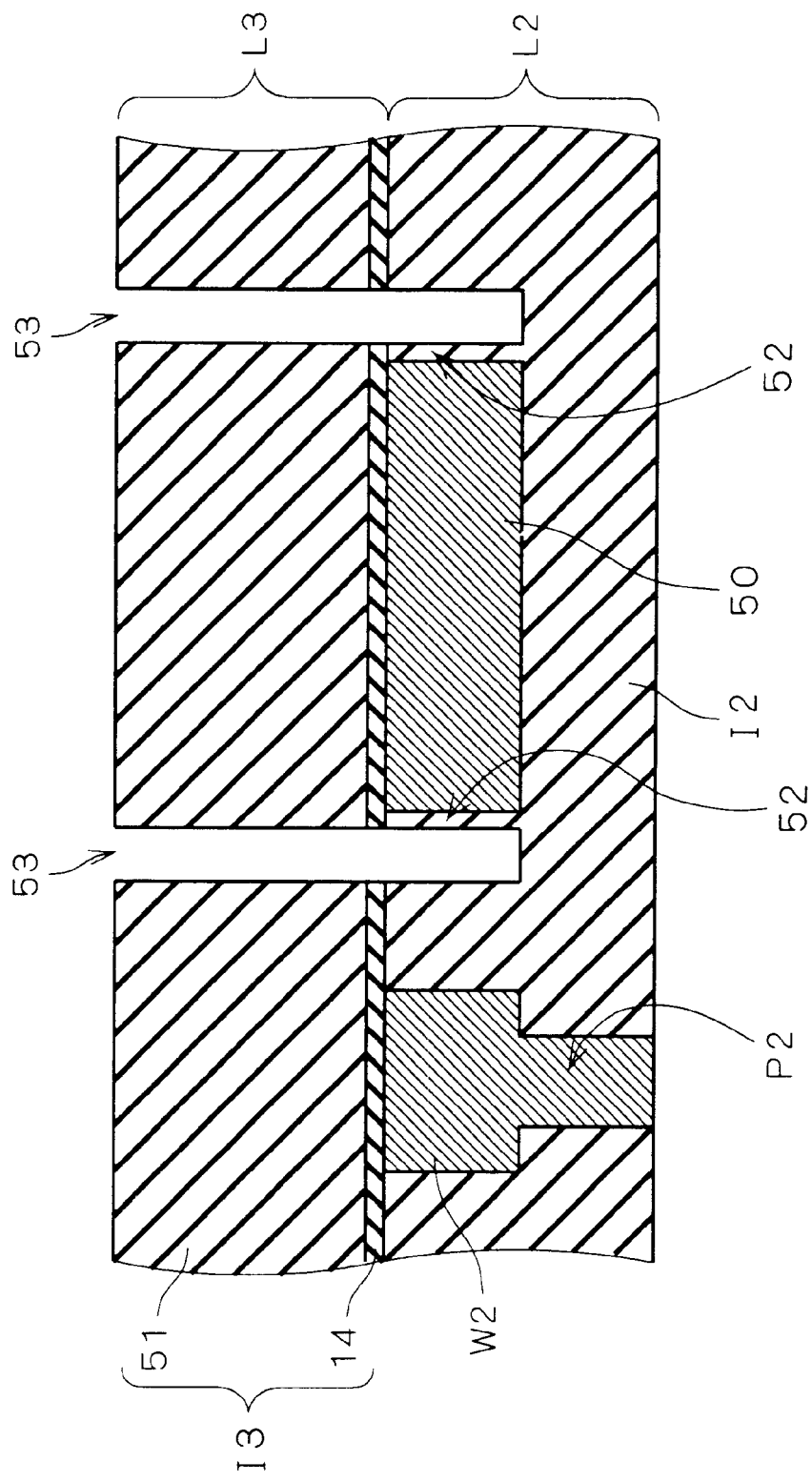
FIG. 64 is a cross section showing a sectional structure taken along the line X1—X1 of FIGS. 62 and 63.

Referring to FIG. 64, the second-level wire W2 is formed by a dual damascene process in the insulating film I2 made of a silicon oxide film. Further, a metal film 50 serving as the first electrode of the MIM-type capacitor is formed in the upper surface of the insulating film I2. The metal film 50 is made of copper. The insulating film I3 has a structure in which the insulating film 14 and an insulating film 51 are layered on the upper surface of the second interconnection layer L2 in this order. The insulating film 14 is made of $Si_3N_4$, SiC or the like, serving as an antioxidizing film for the second-level wire W2 and the metal film 50. The insulating film 51 is made of a silicon oxide film, an SiOC film or the like.

In the insulating film 51, the third-level wires W3a and W3b are formed. The third-level wire W3a has the metal films 12 and 13 formed in the interconnection trench 26 and the contact hole 19, and the third-level wire W3b has the metal films 12 and 13 formed in an interconnection trench 54 and a deep trench 53. The interconnection trench 54 is formed in au upper surface of the insulating film 51 above the metal film 50. The deep trench 53 is formed, extending from a bottom surface of the interconnection trench 54 into the upper surface of the insulating film I2. In the structure of FIG. 64, the depth from the upper surface of the insulating film I2 to a bottom surface of the deep trench 53 is equal to that from the upper surface of the insulating film I2 to a bottom surface of the metal film 50. A portion of the deep trench 53 which extends into the insulating film I2 is opposed to a side surface of the metal film 50 with an insulating film 52 which is part of the insulating film I2 interposed therebetween. The insulating film 52 is made of the same material as that of the insulating film I2 (a silicon oxide film in this case), serving as the capacitor dielectric film of the MIM-type capacitor. Further, in the second interconnection layer L2, portions of the metal films 12 and 13 which are formed in the deep trench 53 serve as the second electrode of the MIM-type capacitor.

Though the metal films 12 and 13 are formed on only one of the opposed side surfaces of the metal film 50 in some cases depending on the layout, forming the metal films 12 and 13 on both side surfaces of the metal film 50 as shown in FIG. 62 enlarges the area in which the first electrode and the second electrode of the capacitor are opposed to each other and thereby increases the capacitor capacitance. As shown in FIG. 63, forming the metal films 12 and 13 so as to surround the metal film 50 further increases the capacitor capacitance as compared with the case shown in FIG. 62.

FIGS. 65 to 68 are cross sections showing a method of manufacturing the semiconductor device of FIG. 64 in accordance with the eleventh preferred embodiment of the present invention step by step in sequence. First, referring to FIG. 65, the second-level wire W2 and the metal film 50 are formed in the insulating film I2 of the second interconnection layer L2 by a dual damascene process. The metal film 50 is formed in the upper surface of the insulating film I2. Subsequently, the insulating film 14 is entirely formed by CVD to have a film thickness of about 30 to 100 nm. Then, the insulating film 51 is entirely formed by CVD to have a film thickness of about 0.7 to 3.0 μm.

Figure 66:
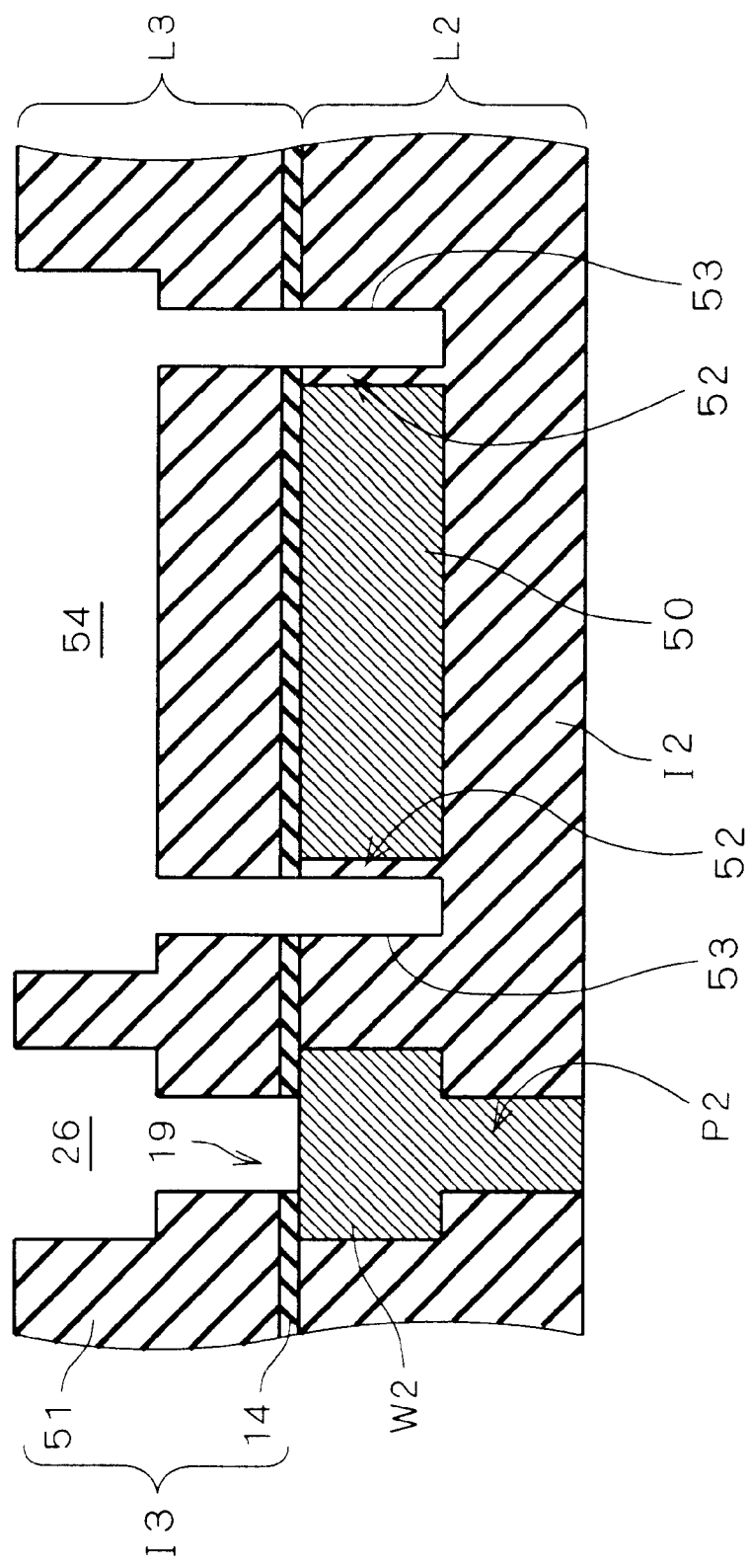

Next, referring to FIG. 66, the deep trench 53 extending from the upper surface of the insulating film 51 into the upper surface of the insulating film I2 is partially formed in the insulating films I2, 14 and 51 by photolithography and anisotropic dry etching. The deep trench 53 is formed at a portion away from the side surface of the metal film 50 by the width of the insulating film 52. Further, the deep trench 53 is formed so that the depth of its bottom surface should not be shallower than the depth of the bottom surface of the metal film 50.

Figure 67:
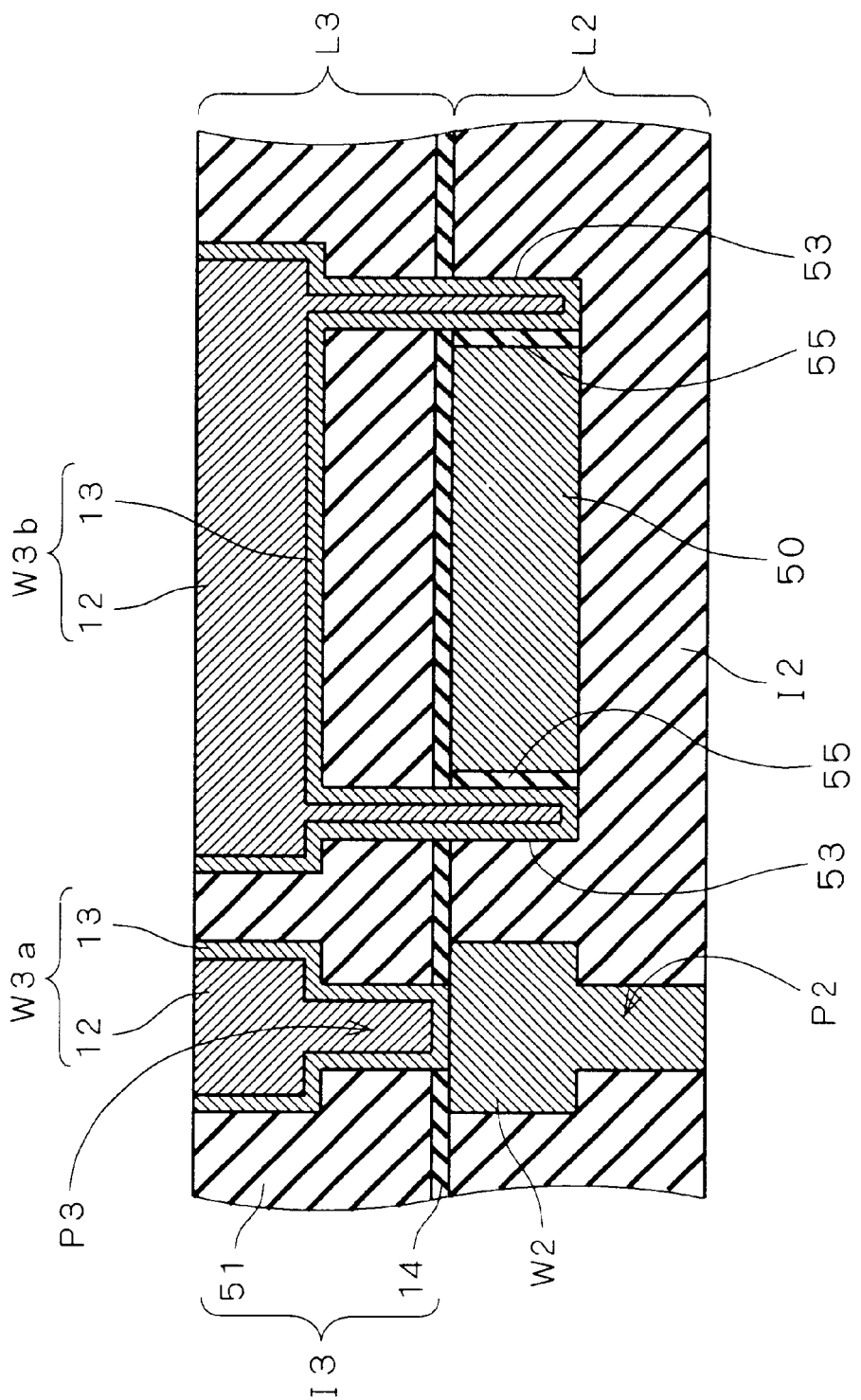
Figure 68:
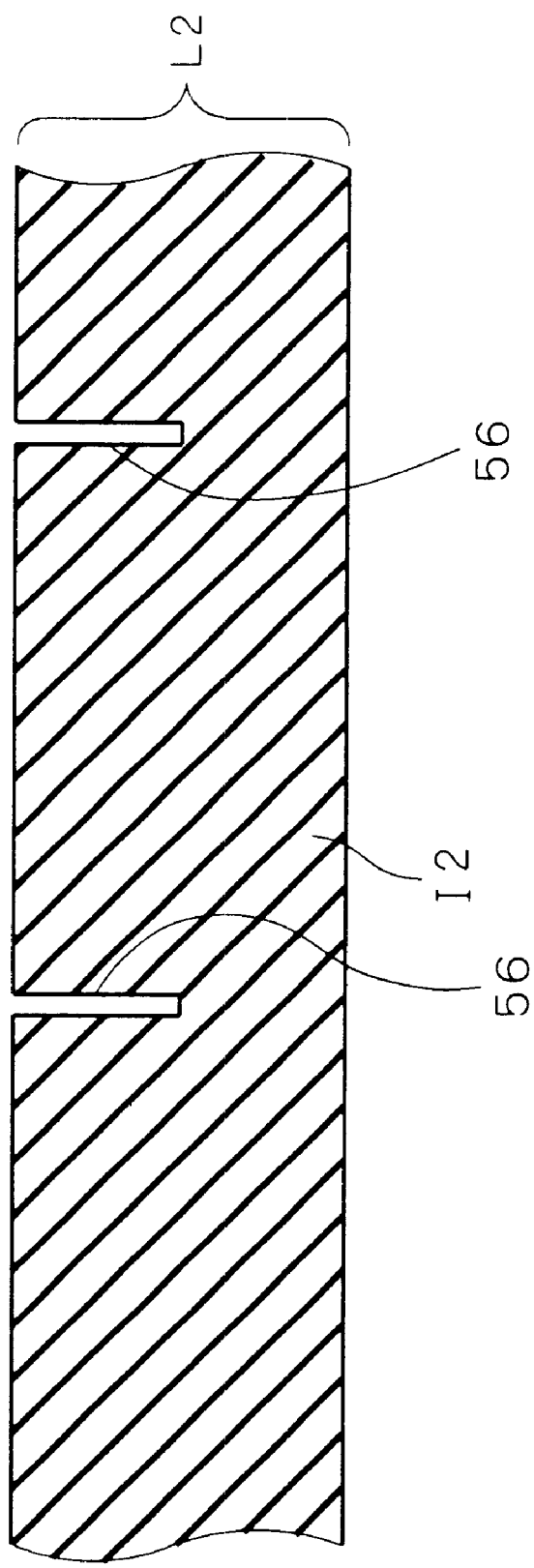
Figure 70:
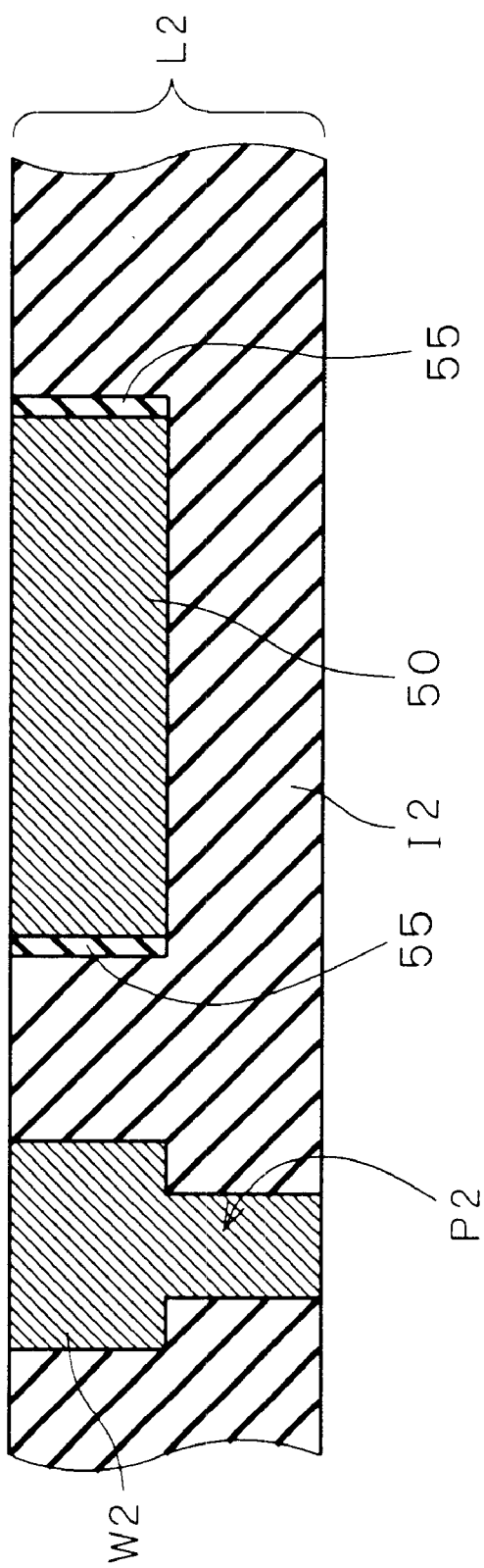
FIGS. 70 to 74 are cross sections showing a method of manufacturing a semiconductor device in accordance with the twelfth preferred embodiment of the present invention step by step in sequence.
Figure 71:
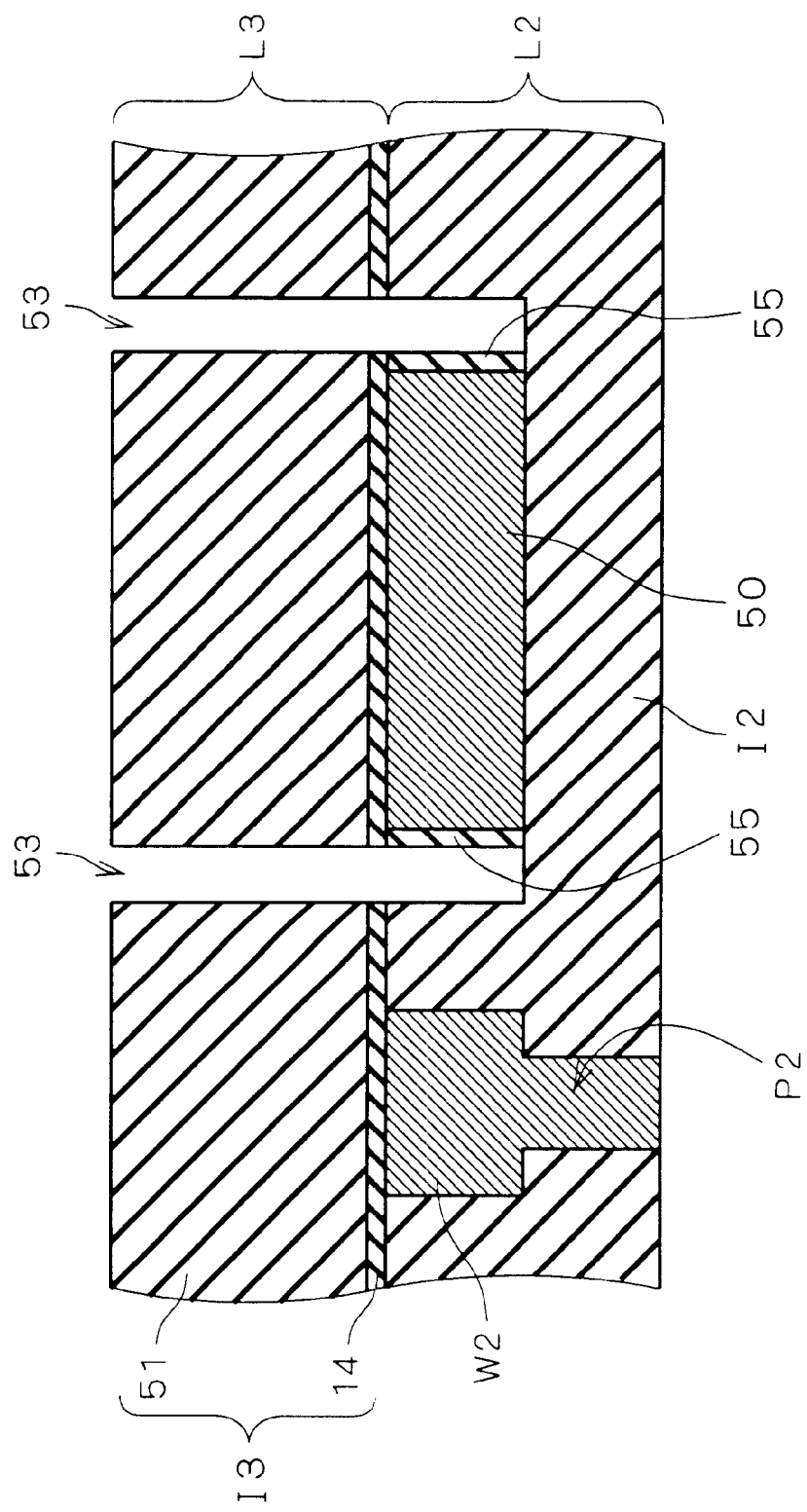

Next, referring to FIG. 67, the contact hole 19 is formed by photolithography and anisotropic dry etching. Next, referring to FIG. 68, the insulating film 51 is patterned by photolithography and anisotropic dry etching, to form the interconnection trench 26 partially overlapping the contact hole 19 and the interconnection trench 54 partially overlapping the deep trench 53 in the insulating film 51. Subsequently, a portion of the insulating film 14 which is not covered with the insulating film 51 is removed by full etchback, to expose the upper surface of the second-level wire W2.

Subsequently, the metal film 13 is entirely formed by sputtering. Then, the metal film 12 is entirely formed by plating to have a film thickness enough to fully fill the inside of the contact hole 19, the inside of the deep trench 53 and the inside of the interconnection trenches 26 and 54. The metal films 12 and 13 are polished by CMP till the upper surface of the insulating film 51 is exposed, to planarize the surfaces of these metal and insulating films. Through the above process steps, the structure shown in FIG. 64 is obtained.

Thus, according to the structure of the semiconductor device and the method of manufacturing the same of the eleventh preferred embodiment, the MIM-type capacitor can be formed in the multi-level wire structure in the dual damascene process with no additional complicate process step, like in the first preferred embodiment.

Further, according to the structure of the semiconductor device and the method of manufacturing the same of the eleventh preferred embodiment, the metal films 12 and 13 can be buried also in the deep trench 53 in the step for burying the metal films 12 and 13 in the interconnection trenches 26 and 54 of the third interconnection layer L3 (FIG. 69). In other words, forming the second electrode of the MIM-type capacitor and formation of the third-level wires W3a and W3b are performed in the same CMP step. Therefore, the number of process steps is reduced as compared with the above-discussed first to tenth preferred embodiments in which different CMP steps are needed for formation of the second electrode and formation of the third-level wire W3.

Furthermore, since the first electrode and the second electrode of the MIM-type capacitor are formed in the same plane, the flatness of surface is improved as compared with the case where the first electrode and the second electrode are layered. Therefore, when the MIM-type capacitor is formed in the multi-level wire structure, it is possible to suppress level difference in the surfaces of interconnection layers.

The Twelfth Preferred Embodiment

FIG. 69 is a cross section showing a structure of a semiconductor device in accordance with the twelfth preferred embodiment of the present invention. The structure of semiconductor device of the twelfth preferred embodiment shown in FIG. 69 is different from that of the semiconductor device of the eleventh preferred embodiment shown in FIG. 64 in that an insulating film 55 separate from the insulating film I2 is formed instead of the insulating film 52 which is part of the insulating film I2. The insulating film 55 is made of a material having higher dielectric constant than a silicon oxide film which is the material of the insulating film I2, such as $Si_3N_4$, SiC and $Ta_2O_3$. The insulating film 55 serves as the capacitor dielectric film of the MIM-type capacitor. Other structure of the semiconductor device of the twelfth preferred embodiment is the same as that of the semiconductor device of the above-discussed eleventh preferred embodiment.

FIGS. 70 to 74 are cross sections showing a method of manufacturing the semiconductor device of FIG. 69 in accordance with the twelfth preferred embodiment of the present invention step by step in sequence. First, referring to FIG. 70, trenches 56 are formed in the upper surface of the insulating film I2 by photolithography and anisotropic dry etching. Next, referring to FIG. 71, the insulating films 55 are entirely formed by CVD to have a film thickness enough to fully fill the inside of the trenches 56. Subsequently, the insulating film 55 is polished by CMP till the upper surface of the insulating film I2 is exposed, to planarize the surfaces of these metal and insulating films.

Figure 72:
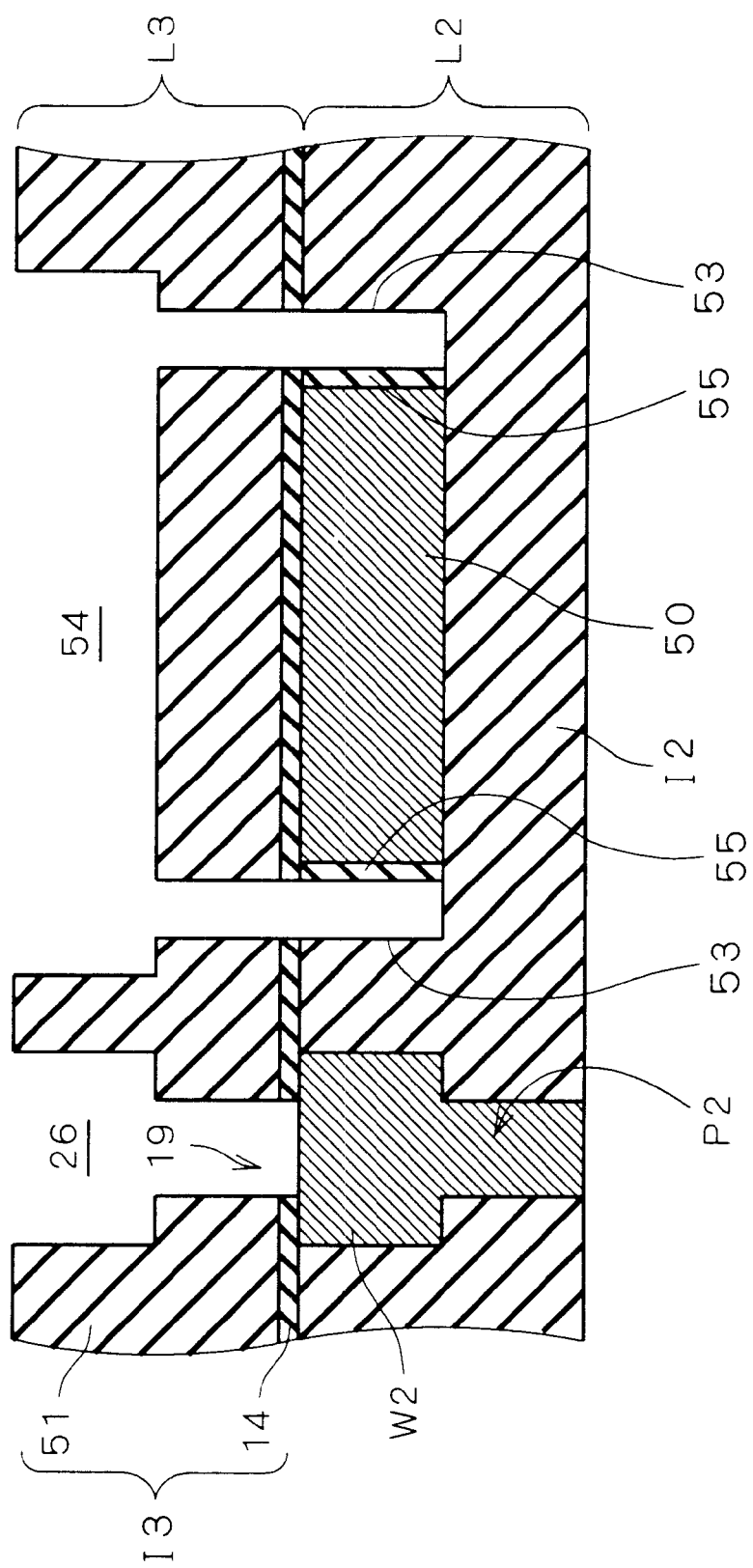
Figure 73:
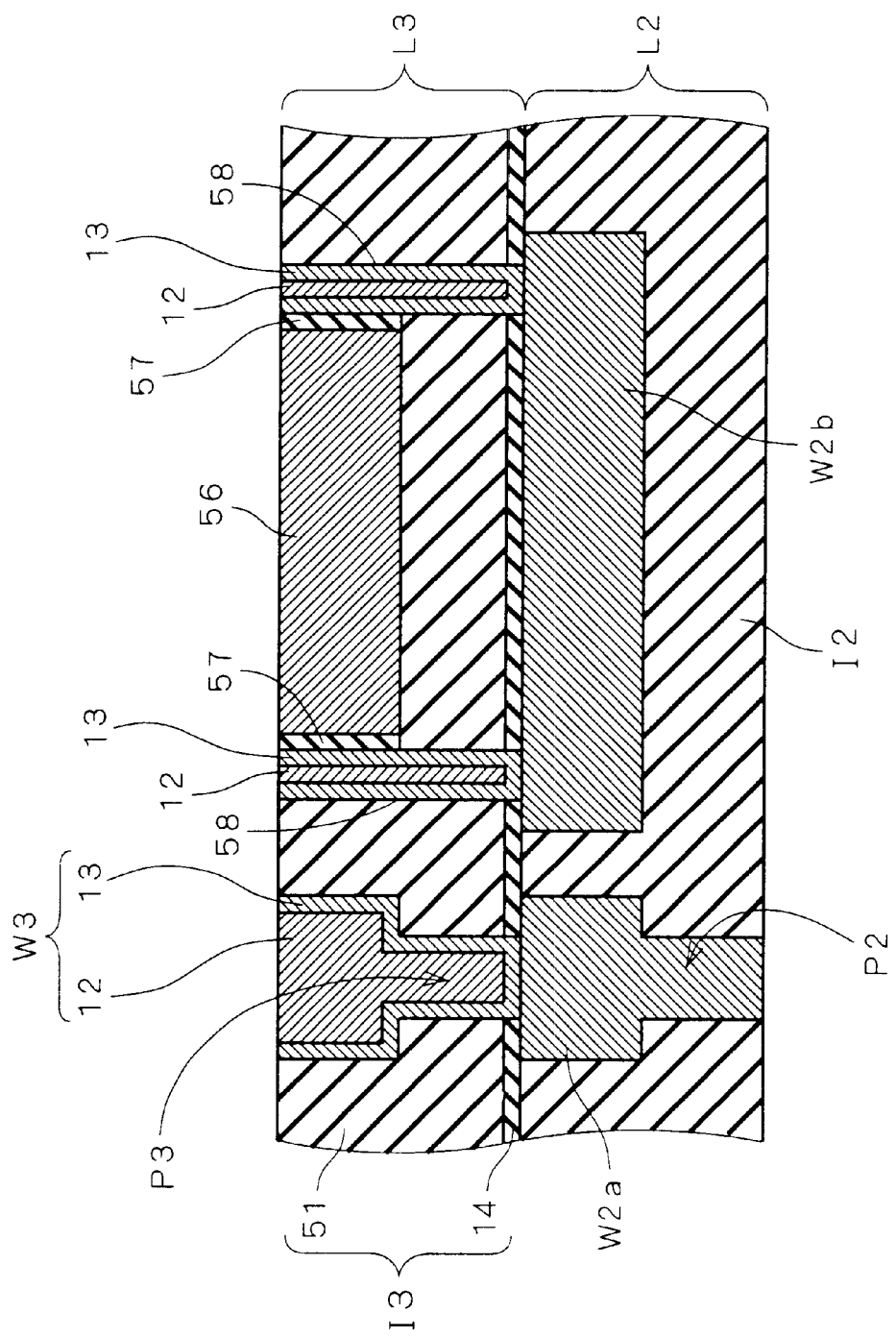

Next, referring to FIG. 72, the second-level wire W2 and the metal film 50 are formed in the insulating film I2 by a dual damascene process. The metal film 50 is formed between the insulating films 55 opposed to each other. Next, referring to FIG. 73, the insulating films 14 and 51 are entirely formed by CVD in this order. Subsequently, the deep trenches 53 are partially formed in the insulating films I2, 14 and 51 by photolithography and anisotropic dry etching. Each of the deep trenches 53 is formed so that one of the side surfaces of the insulating film 55 which is opposite to the side in contact with the metal film 50 should be exposed.

Figure 74:
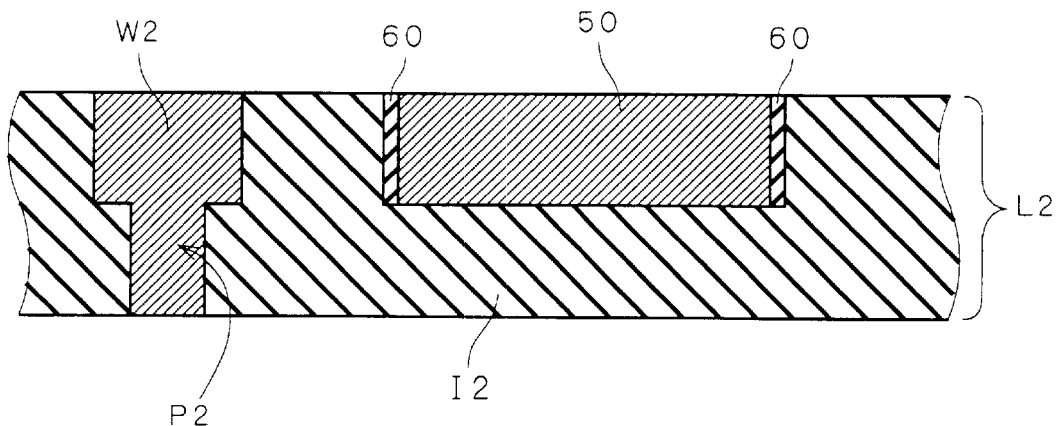

Next, referring to FIG. 74, the contact hole 19 is formed by photolithography and anisotropic dry etching. Subsequently, the interconnection trenches 26 and 54 are formed by photolithography and anisotropic dry etching. Then, a portion of the insulating film 14 which is not covered with the insulating film 51 is removed by full etchback, to expose the upper surface of the second-level wire W2.

The metal film 13 is entirely formed by sputtering. Subsequently, the metal film 12 is entirely formed by plating to have a film thickness enough to fully fill the inside of the contact hole 19, the inside of the deep trenches 53 and the inside of the interconnection trenches 26 and 54. Then, the metal films 12 an 13 are polished by CMP till the upper surface of the insulating film 51 is exposed, to planarize the surfaces of these metal and insulating films. Through the above process steps, the structure shown in FIG. 69 is obtained.

Thus, according to the structure of the semiconductor device and the method of manufacturing the same of the twelfth preferred embodiment, the MIM-type capacitor can be formed in the multi-level wire structure in the dual damascene process with no additional complicate process step, like in the first preferred embodiment.

Further, since the insulating film 55 made of a material having higher dielectric constant than that of the insulating film I2 is used as the capacitor dielectric film, the capacitor capacitance can be increased as compared with the semiconductor device of the eleventh preferred embodiment.

Figure 75:
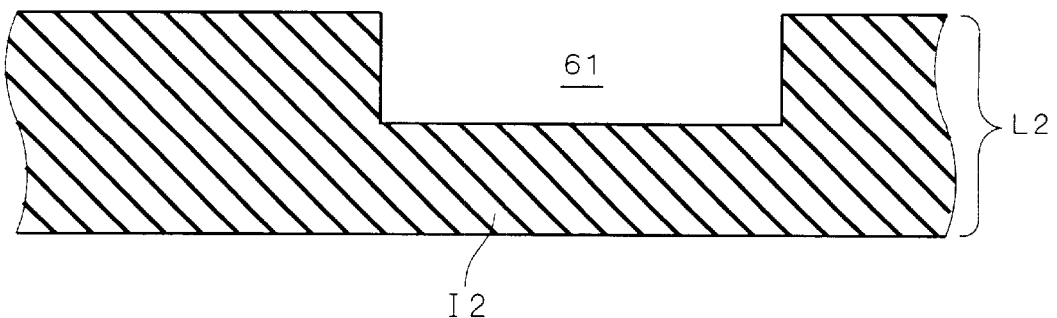
FIG. 75 is a cross section showing a structure of a semiconductor device in accordance with a variation of the twelfth preferred embodiment of the present invention.

FIG. 75 is a cross section showing a structure of a semiconductor device in accordance with a variation of the twelfth preferred embodiment of the present invention. In the second interconnection layer L2, the second-level wires W2a and W2b are formed. In the upper surface of the third interconnection layer L3, the third-level wire W3 and a metal film 56 serving as the first electrode of the MIM-type capacitor are formed. On side surfaces of the metal film 56, insulating films 57 are formed. The insulating film 57 is made of $Si_3N_4$, SiC, $Ta_2O_3$ or the like, serving as the capacitor dielectric film of the MIM-type capacitor. Deep trenches 58 are formed, extending from the upper surface of the insulating film I3 to the upper surface of the second-level wire W2b. The inside of the trench 58 is filled with the metal films 12 and 13. Portions of the metal films 12 and 13 opposed to the metal film 56 with the insulating film 57 interposed therebetween serve as the second electrode of the MIM-type capacitor. The semiconductor device of FIG. 75 can be manufactured by a normal dual damascene process on the basis of the process steps shown in FIGS. 70 to 74. According to the structure of the semiconductor device shown in FIG. 75 and the method of manufacturing the same of the variation of the twelfth preferred embodiment, the same effect can be achieved as discussed in the twelfth preferred embodiment.

The Thirteenth Preferred Embodiment

Figure 76:
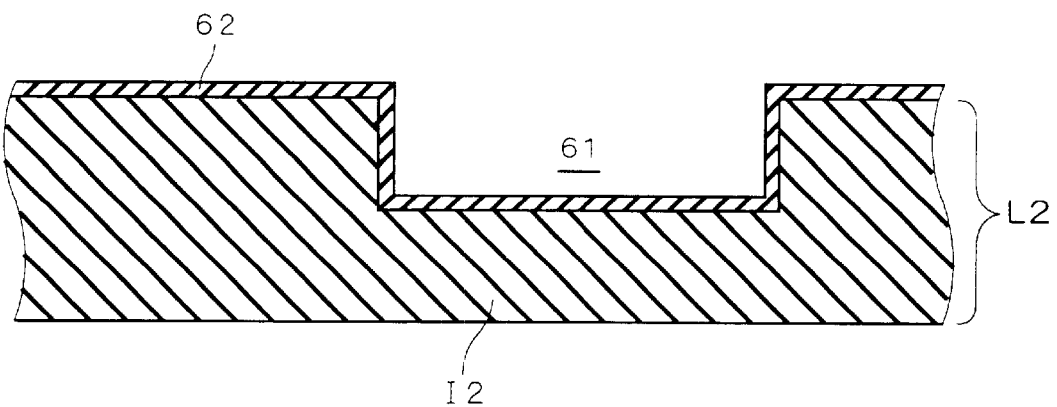
FIG. 76 is a cross section showing part of a structure of a semiconductor device in accordance with a thirteenth preferred embodiment of the present invention.
Figure 77:
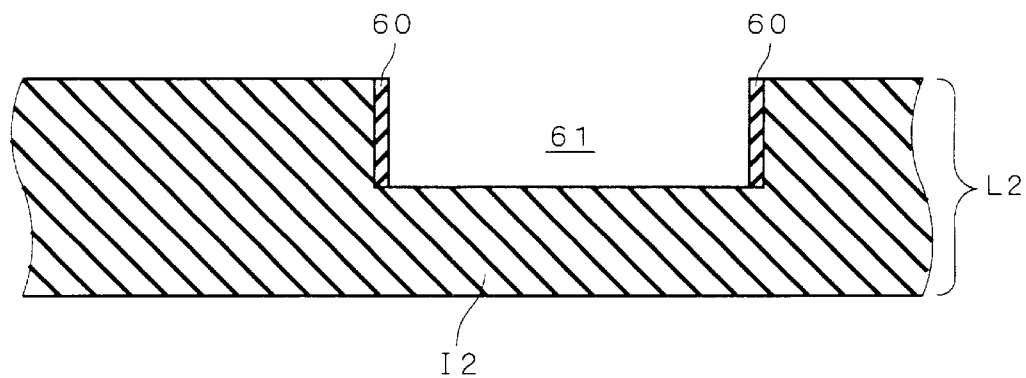
FIGS. 77 to 80 are cross sections showing a method of manufacturing the structure showing in FIG. 76 step by step in sequence.
Figure 78:
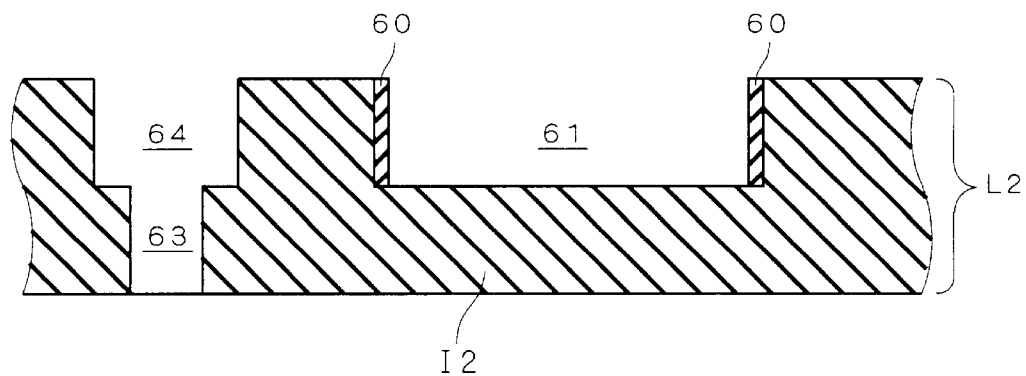

In the thirteenth preferred embodiment, discussion will be made on another method of manufacturing the capacitor dielectric film (the insulating film 55 of FIG. 69) formed on the side surface of the first electrode of the MIM-type capacitor. FIG. 76 is a cross section showing part of a structure of a semiconductor device in accordance with the thirteenth preferred embodiment of the present invention. In FIG. 76, insulating films 60 are formed, instead of the insulating films 55 shown in FIG. 69. The insulating film 60 is made of a material having higher dielectric constant than a silicon oxide film, like the insulating film 55, serving as the capacitor dielectric film of the MIM-type capacitor. Other structure of the semiconductor device of the thirteenth preferred embodiment is the same as that of the semiconductor device of the above-discussed twelfth preferred embodiment shown in FIG. 69.

FIGS. 77 to 80 are cross sections showing a method of manufacturing the structure showing in FIG. 76 step by step in sequence. First, referring to FIG. 77, a recess 61 is formed in the upper surface of the insulating film I2 by photolithography and anisotropic dry etching. Next, referring to FIG. 78, an insulating film 62 is entirely formed by CVD. Specifically, the insulating film 62 is formed on the upper surface of the insulating film 12 and on side surfaces and a bottom surface of the recess 61. The insulating film 62 is made of the same material as that of the insulating film 60 shown in FIG. 76.

Figure 79:
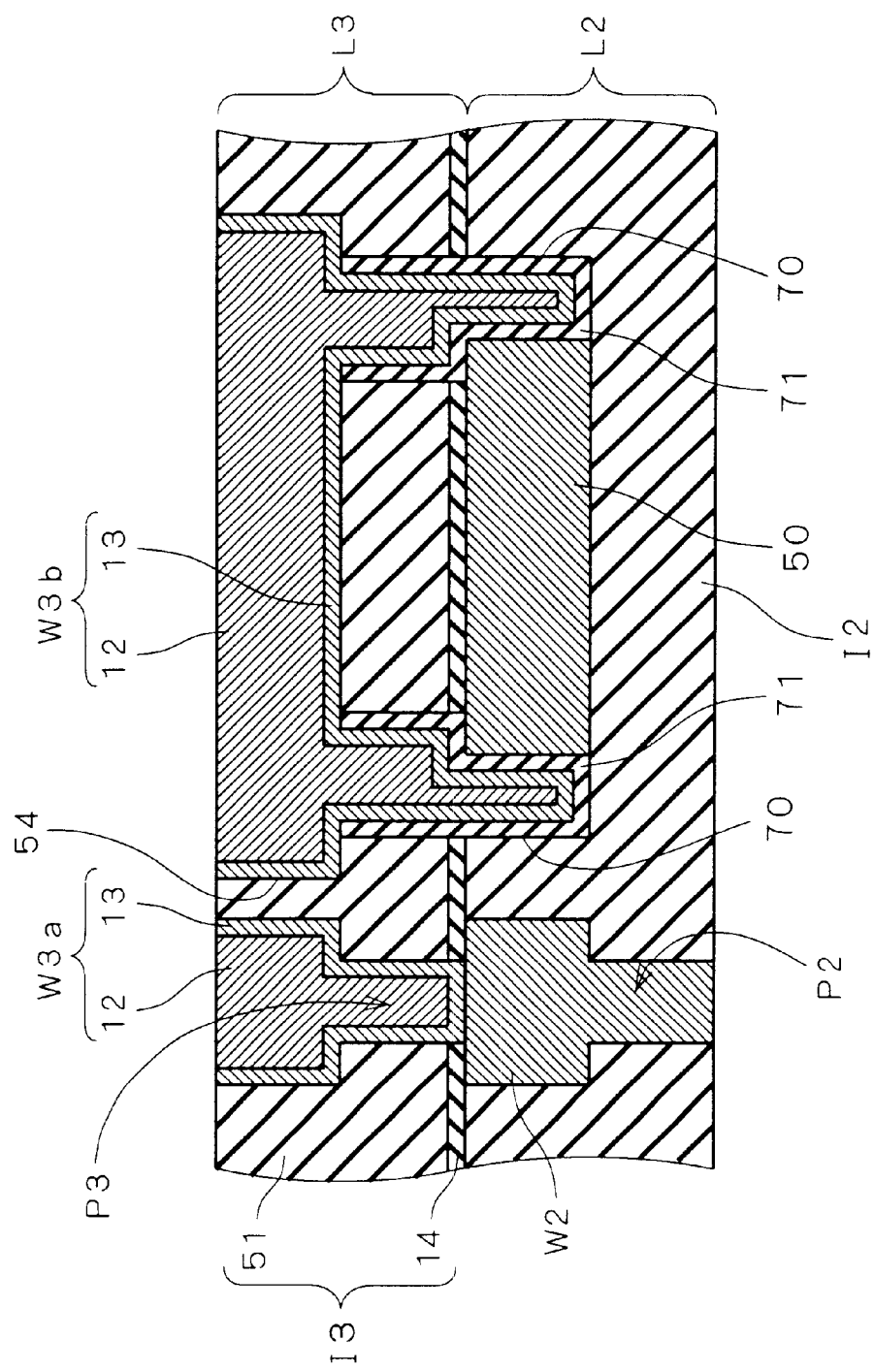
Figure 80:
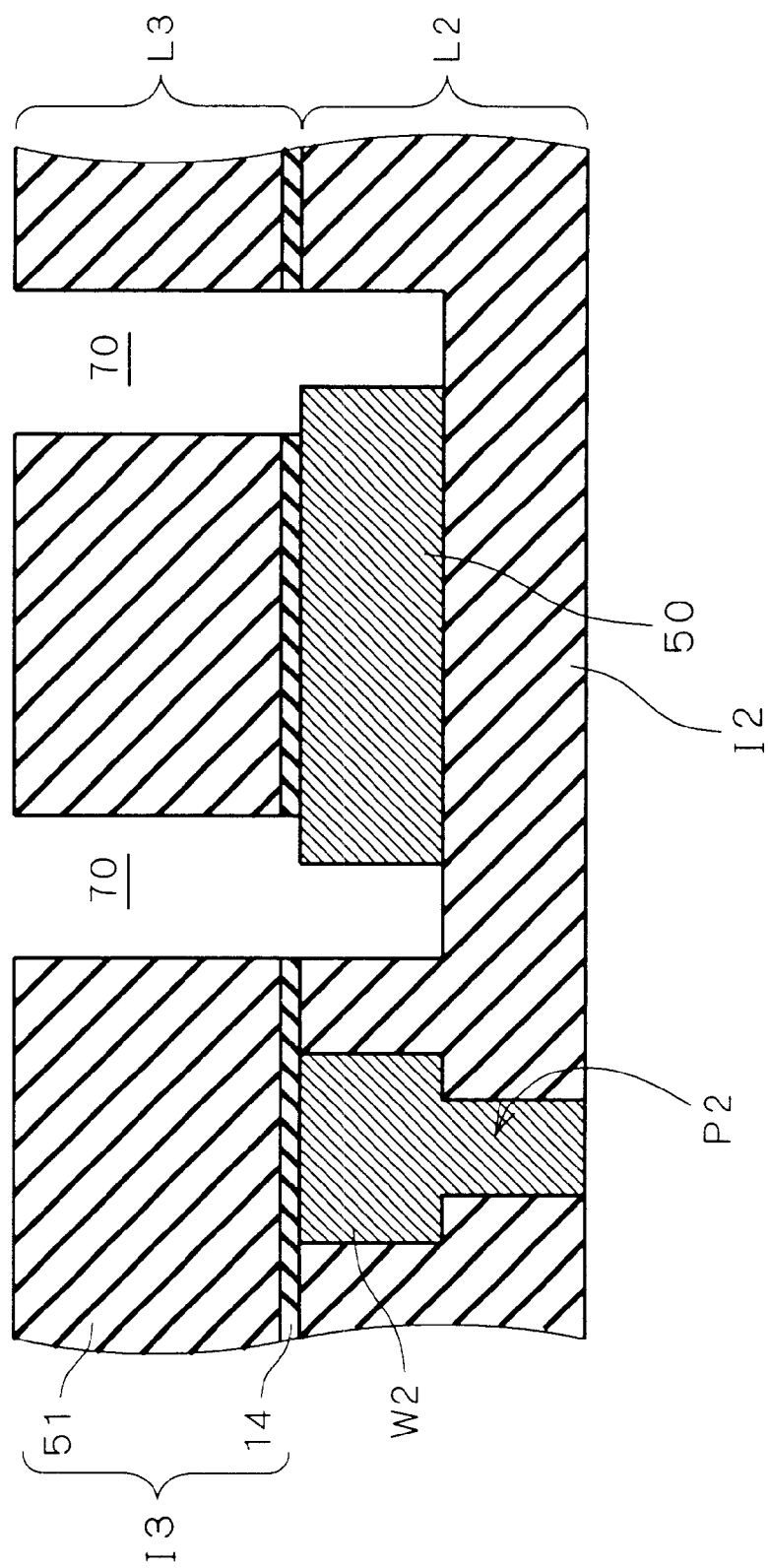

Next, referring to FIG. 79, the insulating film 62 is fully etched back by anisotropic dry etching having high etching rate in the direction of depth. Through this step, the insulating films 60 are formed as the insulating film 62 left on the side surfaces of the recess 61. Next, referring to FIG. 80, a contact hole 63 which corresponds to the plug portion P2 is formed by photolithography and anisotropic dry etching. Subsequently, an interconnection trench 64 partially overlapping the contact hole 63 is formed by photolithography and anisotropic dry etching.

Then, the metal film 50 is formed to have a film thickness enough to fully fill the inside of the contact hole 63, the inside of the interconnection trench 64 and the inside of the recess 61. A barrier metal may be entirely formed before the metal film 50 is formed. Subsequently, the metal film 50 is polished by CMP till the upper surface of the insulating film I2 is exposed, to planarize the surfaces of the metal film 50 and the insulating film 12. Through the above process steps, the structure shown in FIG. 76 is obtained.

Thus, according to the structure of the semiconductor device and the method of manufacturing the same of the thirteenth preferred embodiment, since the insulating film 60 made of a material having higher dielectric constant than that of the insulating film I2 is used as the capacitor dielectric film, the capacitor capacitance can be increased as compared with the semiconductor device of the eleventh preferred embodiment, like the semiconductor device of the twelfth preferred embodiment.

The Fourteenth Preferred Embodiment

Figure 81:
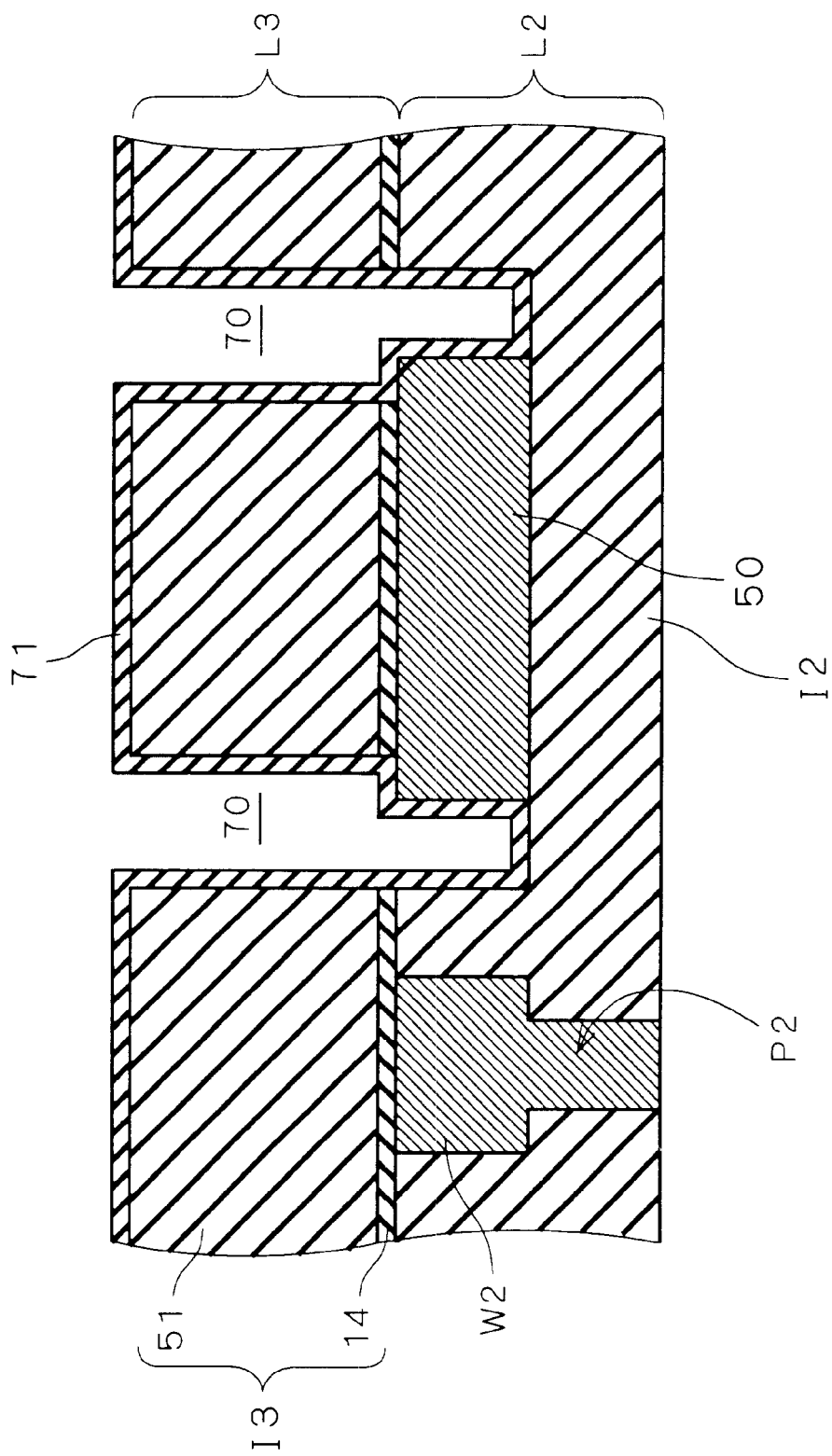
FIG. 81 is a cross section showing a structure of a semiconductor device in accordance with a fourteenth preferred embodiment of the present invention.
Figure 82:
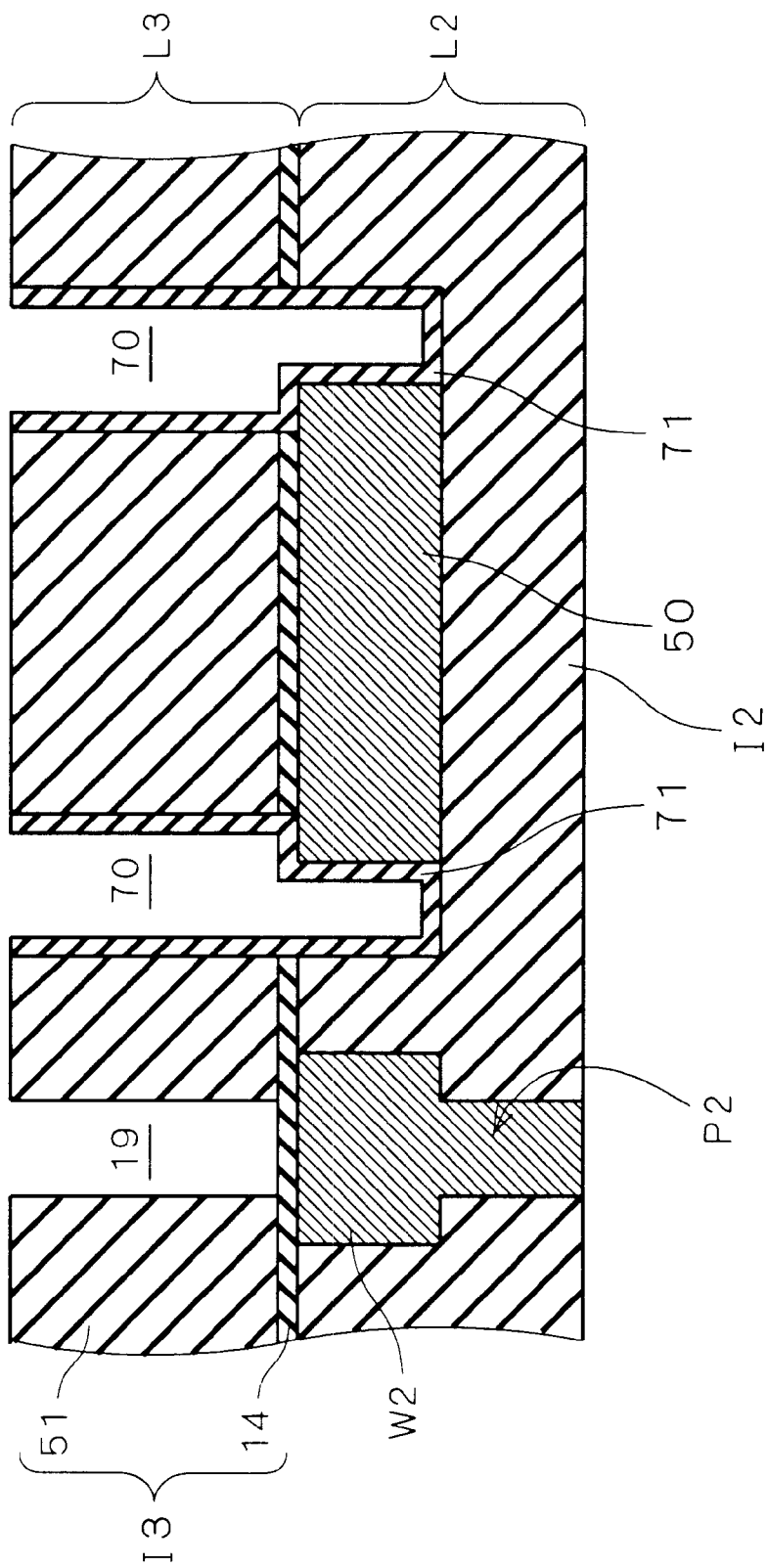
FIGS. 82 to 85 are cross sections showing a method of manufacturing a semiconductor device in accordance with the fourteenth preferred embodiment of the present invention step by step in sequence.

FIG. 81 is a cross section showing a structure of a semiconductor device in accordance with the fourteenth preferred embodiment of the present invention. Deep trenches 70 are formed, extending from the bottom surface of the interconnection trench 54 to the upper surface of the insulating film I2. In the insulating film I2, the deep trenches 70 are formed, being in contact with the side surfaces of the metal film 50. The diameter of a portion of the deep trench 70 which is formed in the insulating film 51 is larger than that of a portion of the deep trench 70 which is formed in the insulating film I2. On side surfaces of the deep trench 70, an insulating film 71 is formed. The insulating film 71 is made of a material having higher dielectric constant than a silicon oxide film which is the material of the insulating film I2, such as $Si_3N_4$, SiC and $Ta_2O_3$. A portion of the insulating film 71 which is in contact with the side surface of the metal film 50 serves as the capacitor dielectric film of the MIM-type capacitor. Further, in the second interconnection layer L2, portions of the metal films 12 and 13 which are formed in the deep trench 70 serve as the second electrode of the MIM-type capacitor. Other structure of the semiconductor device of the fourteenth preferred embodiment is the same as that of the semiconductor device of the above-discussed eleventh preferred embodiment.

Figure 65:
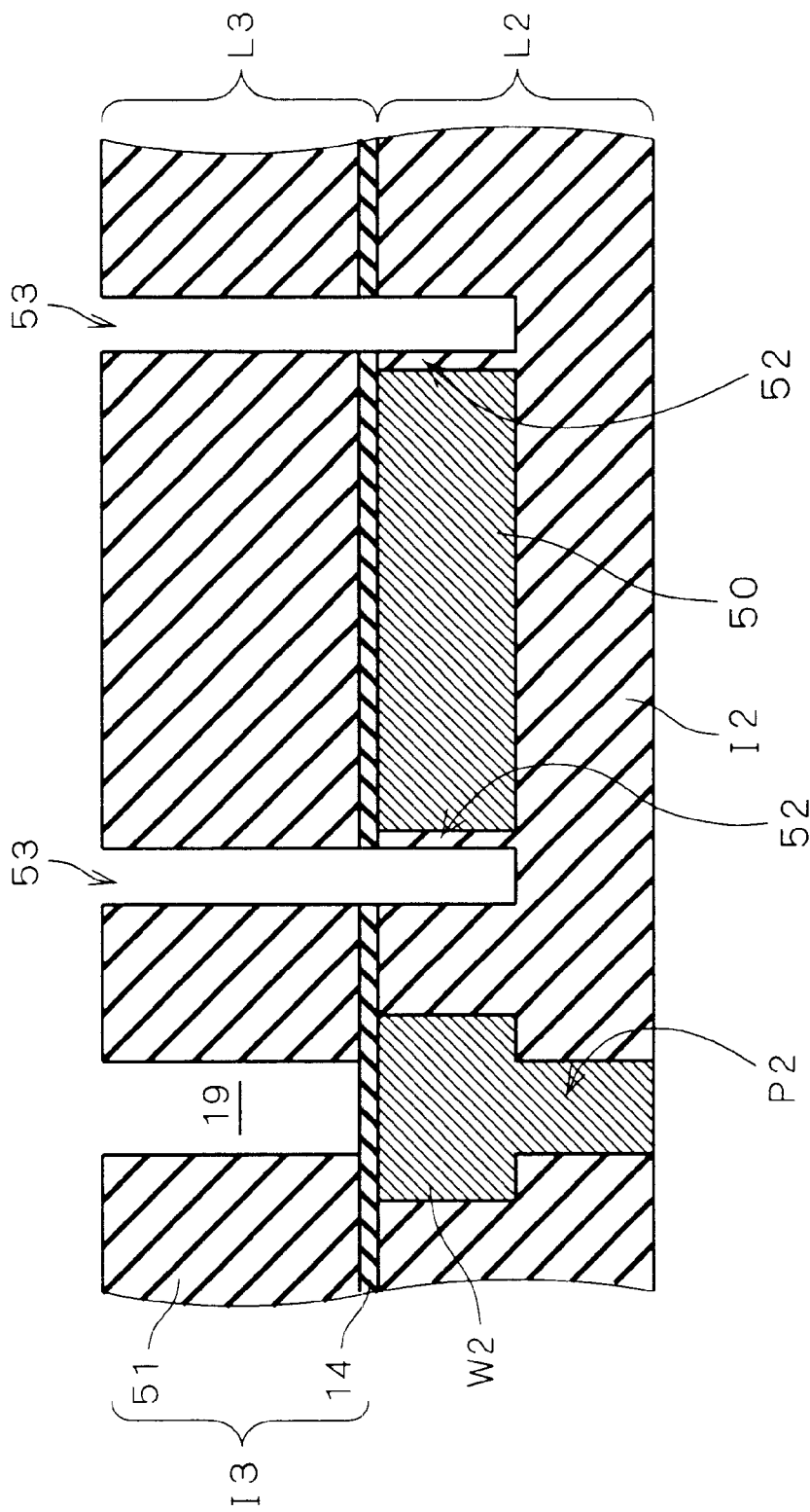
FIGS. 65 to 68 are cross sections showing a method of manufacturing a semiconductor device in accordance with the eleventh preferred embodiment of the present invention step by step in sequence.

FIGS. 82 to 85 are cross sections showing a method of manufacturing the semiconductor device of FIG. 81 in accordance with the fourteenth preferred embodiment of the present invention step by step in sequence. First, the structure of FIG. 65 is obtained through the same steps as discussed in the eleventh preferred embodiment. Next, referring to FIG. 82, the deep trenches 70 are formed in the insulating films 51, 14 and I2 by photolithography and anisotropic dry etching. This anisotropic dry etching is performed under the condition of high selectivity for the metal film 50. Through this step, the deep trenches 70 in contact with the side surfaces of the metal film 50 can be formed in a self-aligned manner.

Figure 83:
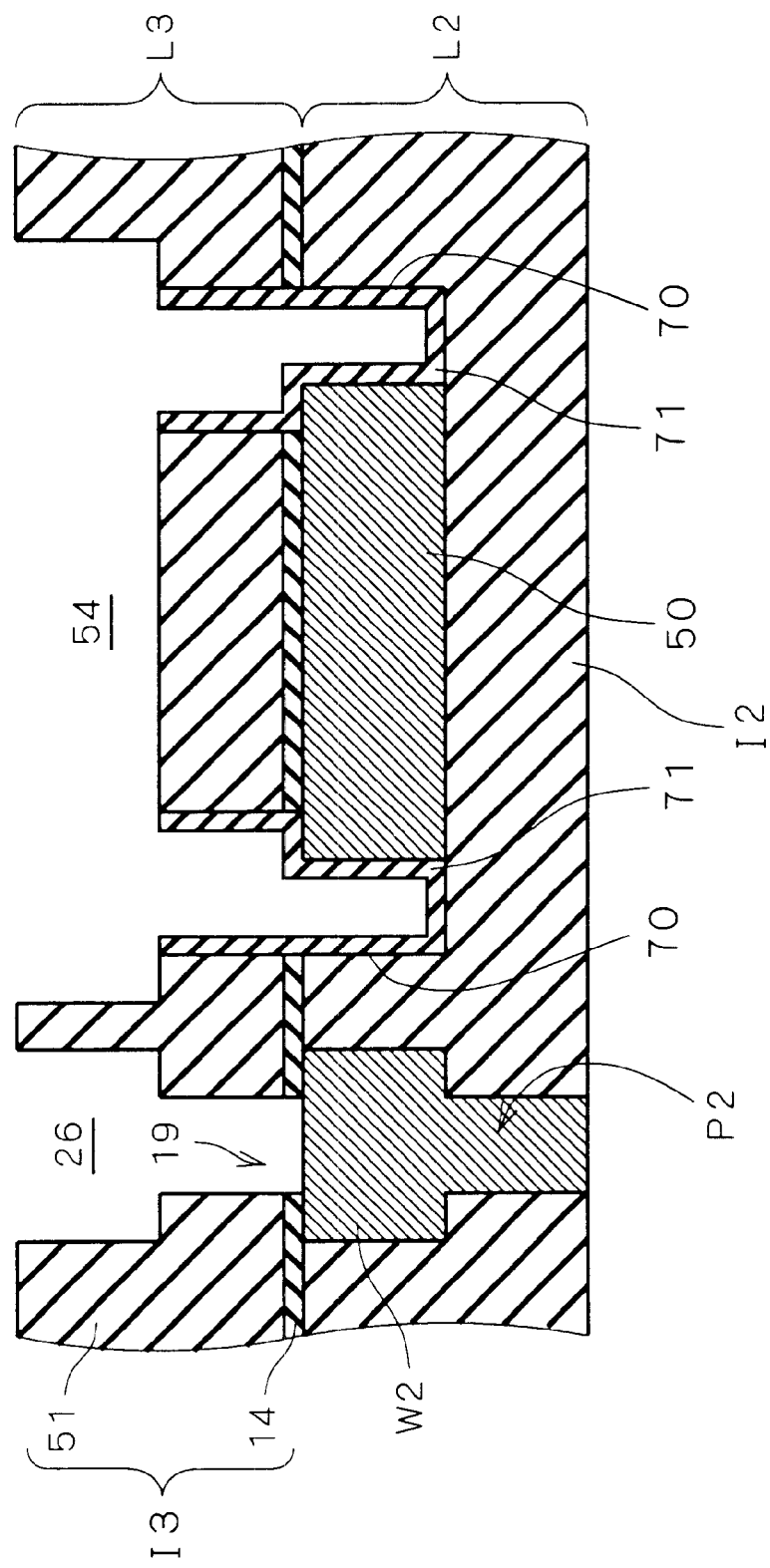
Figure 84:
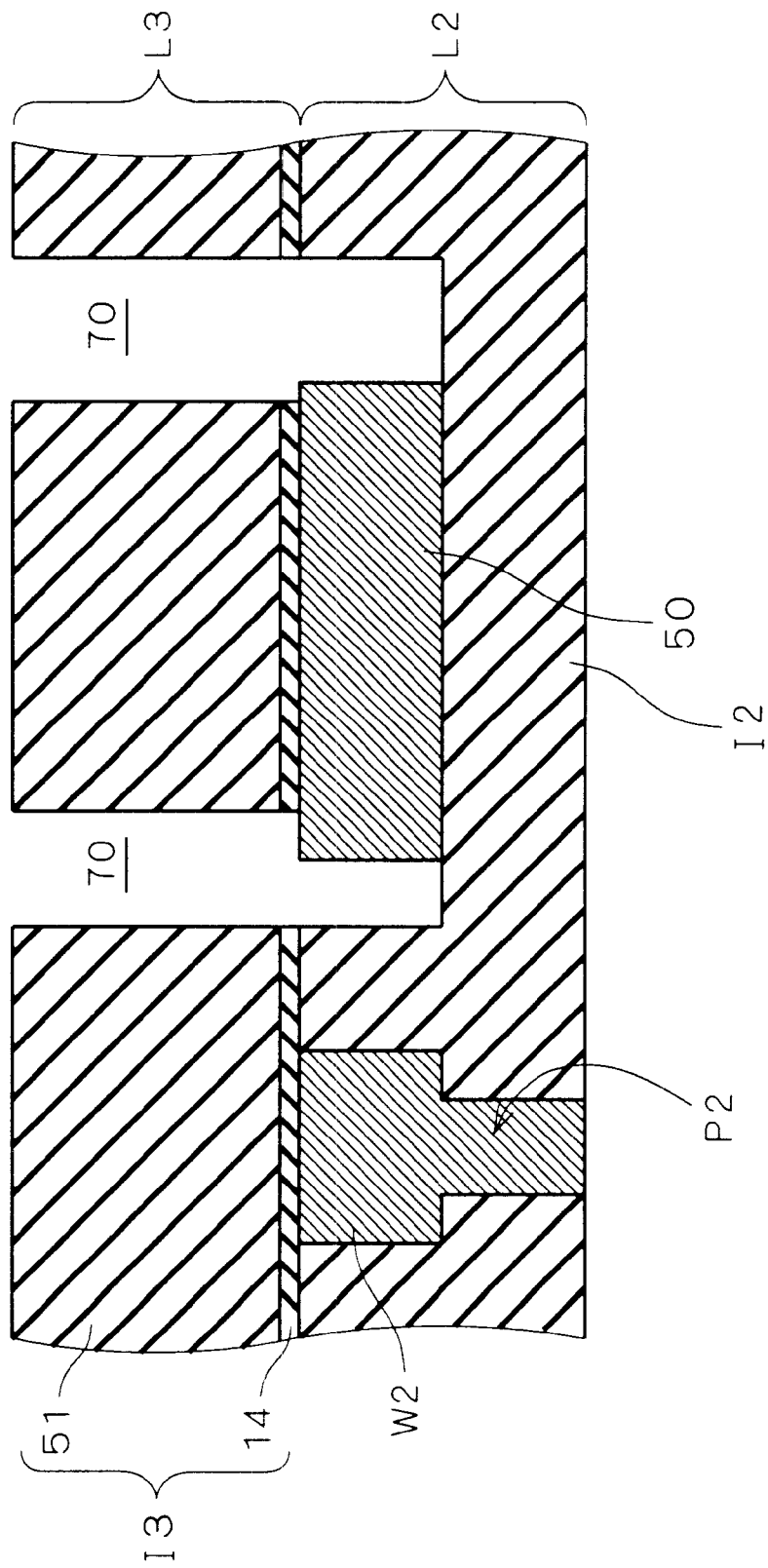
Figure 85:
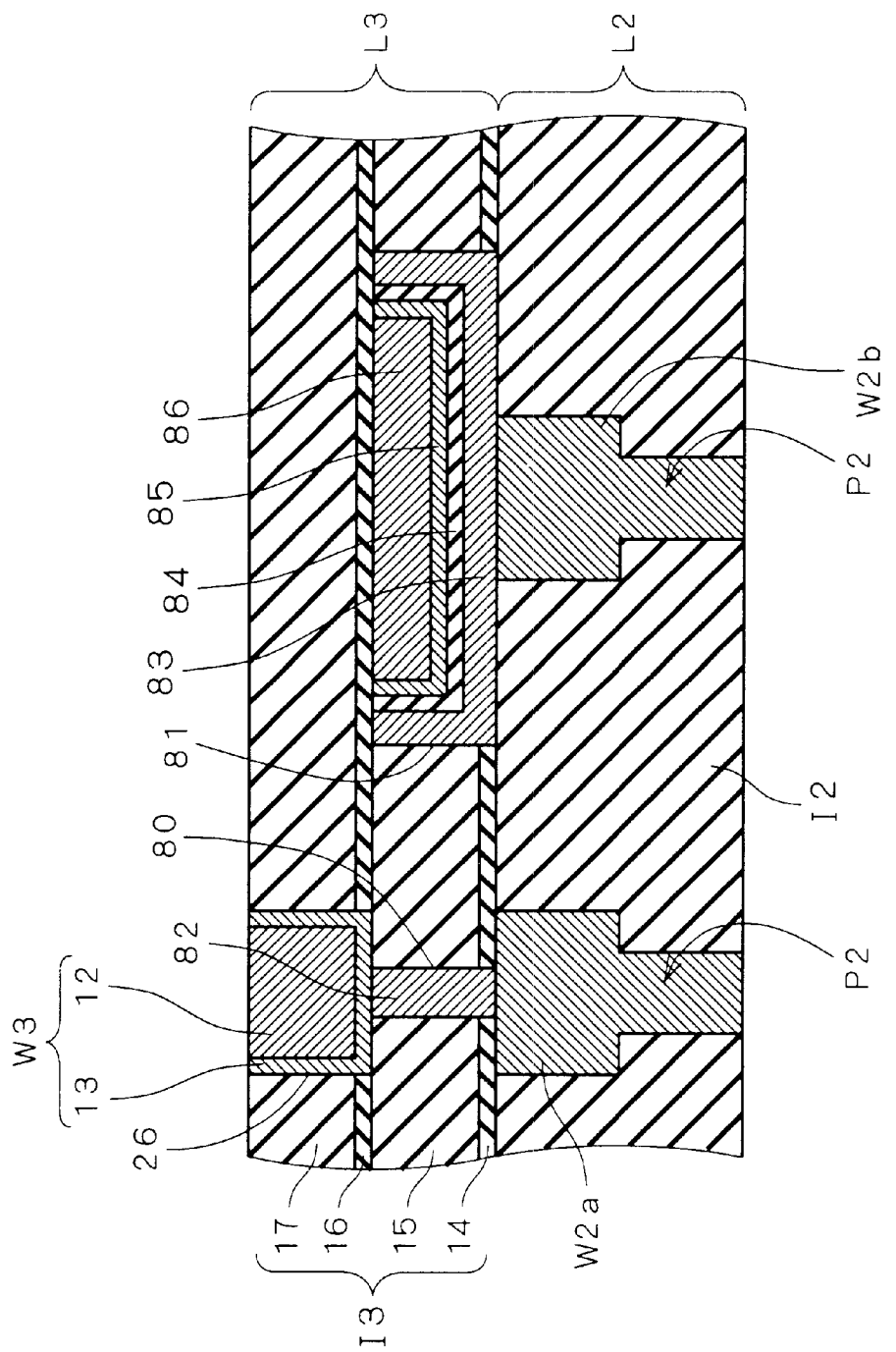

Next, referring to FIG. 83, the insulating film 71 is entirely formed by CVD. Next, referring to FIG. 84, the contact hole 19 is formed by photolithography and anisotropic dry etching. Next, referring to FIG. 85, the interconnection trenches 26 and 54 are formed by photolithography and anisotropic dry etching. Subsequently, a portion of the insulating film 14 which is not covered with the insulating film 51 is removed by full etchback, to expose the upper surface of the second-level wire W2.

Then, the metal film 13 is entirely formed by sputtering. Subsequently, the metal film 12 is entirely formed by plating to have a film thickness enough to fully fill the inside of the contact hole 19, the inside of the deep trenches 70 and the interconnection trenches 26 and 54. Then, the metal films 12 and 13 are polished by CMP till the upper surface of the insulating film 51 is exposed, to planarize the surfaces of these metal and insulating films. Through the above process steps, the structure shown in FIG. 81 is obtained.

Thus, according to the structure of the semiconductor device and the method of manufacturing the same of the fourteenth preferred embodiment, the MIM-type capacitor can be formed in the multi-level wire structure in the dual damascene process with no additional complicate process step, like in the first preferred embodiment.

Further, since the insulating film 71 made of a material having higher dielectric constant than that of the insulating film I2 is used as the capacitor dielectric film, the capacitor capacitance can be increased as compared with the semiconductor device of the eleventh preferred embodiment.

Figure 86:
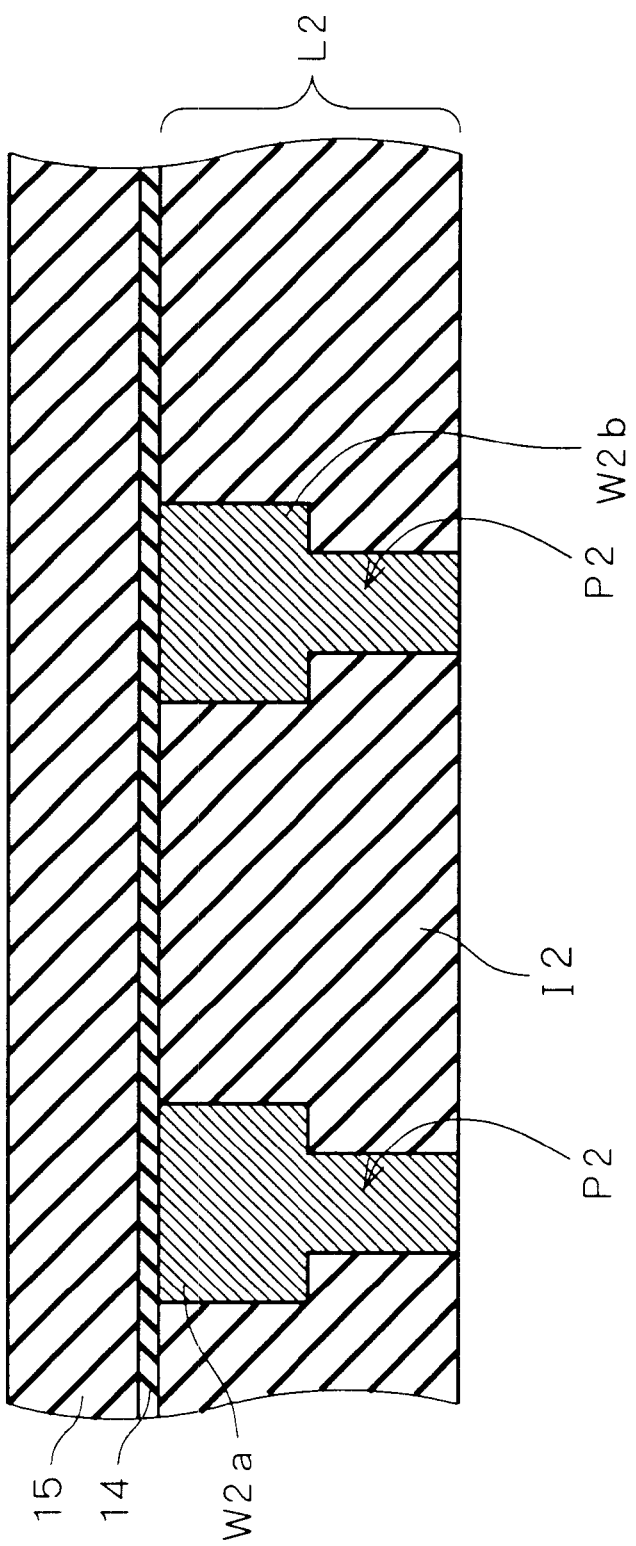
FIG. 86 is a cross section showing a process step in the method of manufacturing a semiconductor device in accordance with the fourteenth preferred embodiment of the present invention.

Furthermore, as shown in FIG. 86, even when the deep trench 70 is out of the formation position due to misalignment and the like of the photomask in the photolithography process for forming the deep trenches 70, the distance between the electrodes of the capacitor is not changed (kept equal to the film thickness of the insulating film 71) and it is therefore possible to avoid variation in capacitor capacitance.

The Fifteenth Preferred Embodiment

Figure 87:
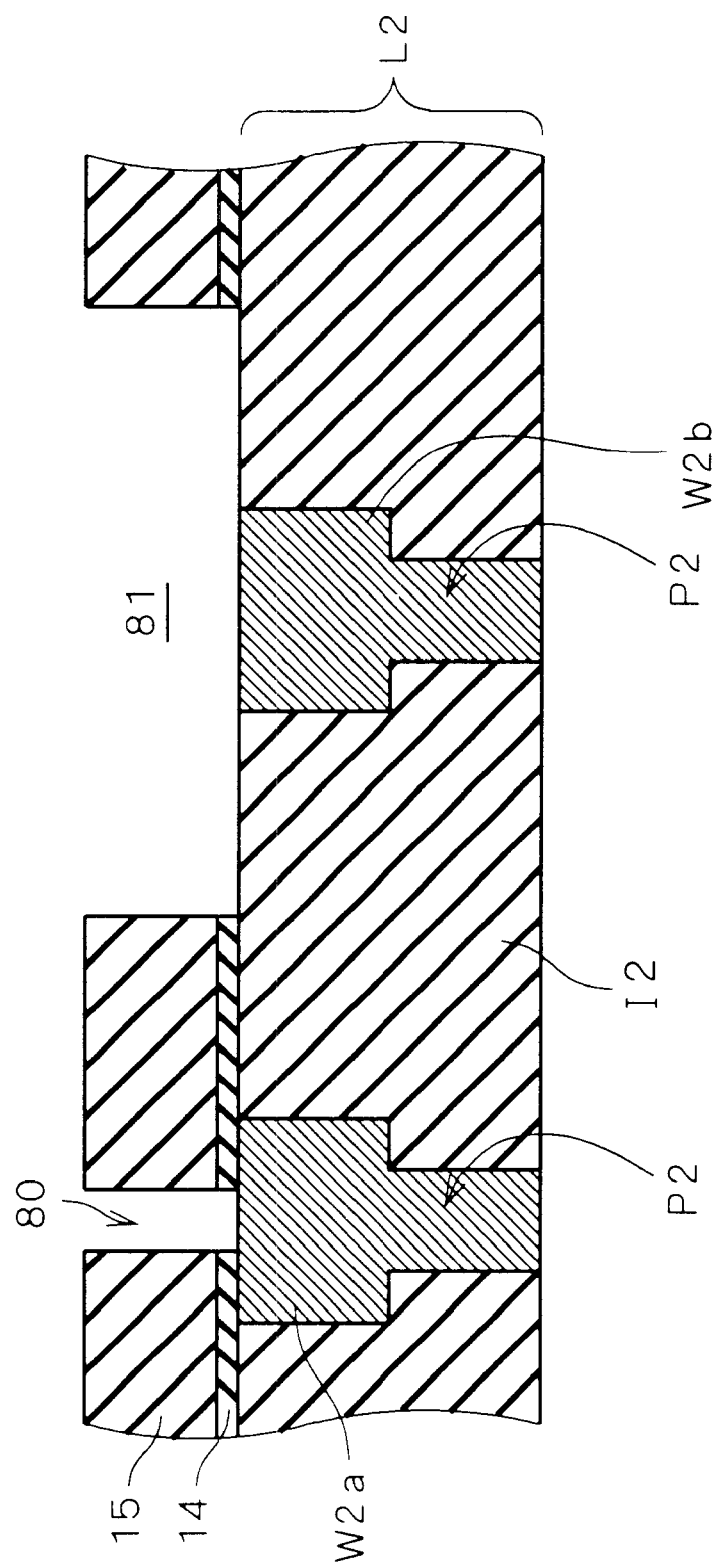
FIG. 87 is a cross section showing a structure of a semiconductor device in accordance with a fifteenth preferred embodiment of the present invention.
Figure 88:
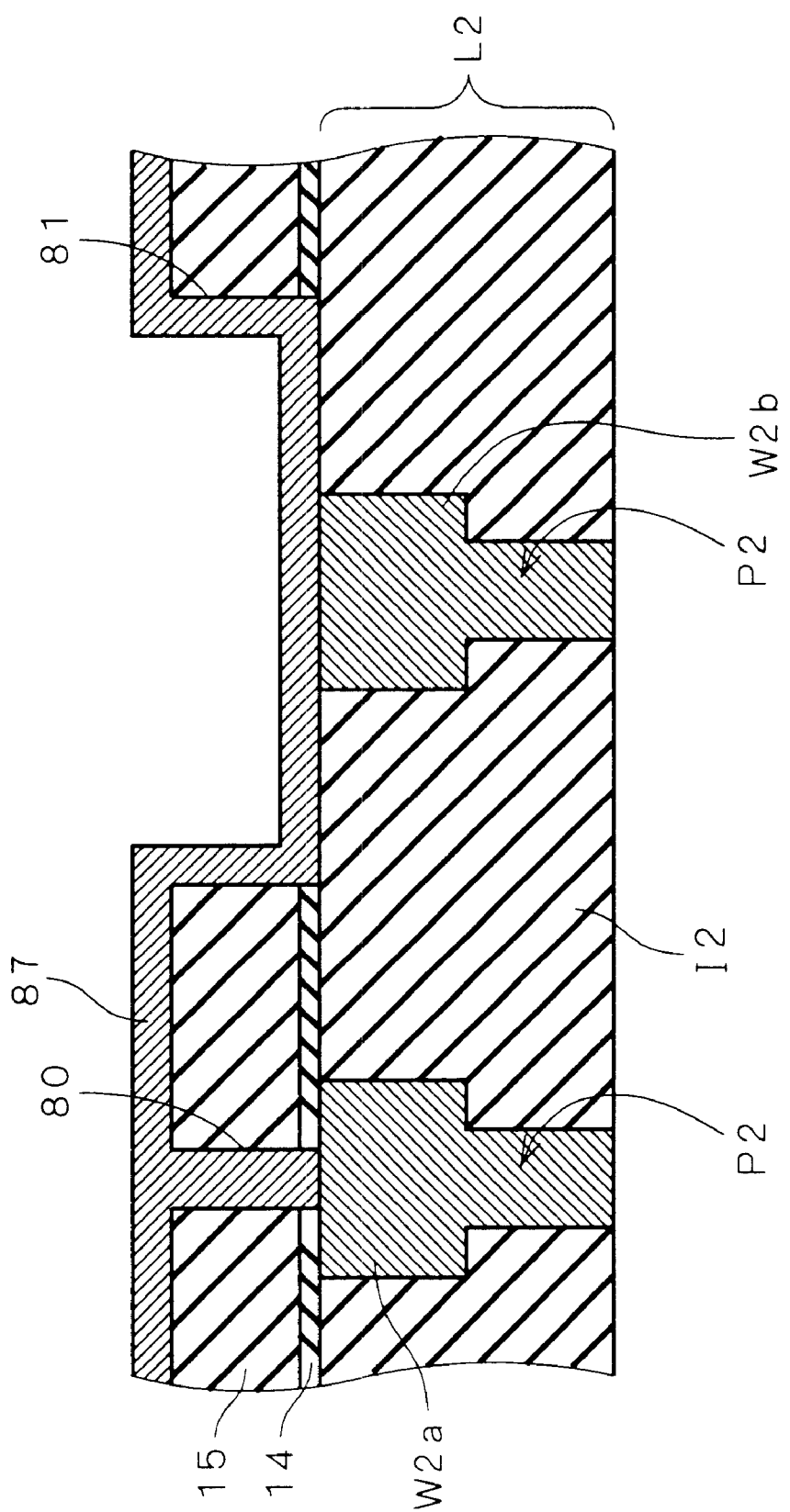
FIGS. 88 to 93 are cross sections showing a method of manufacturing a semiconductor device in accordance with the fifteenth preferred embodiment of the present invention step by step in sequence.
Figure 89:
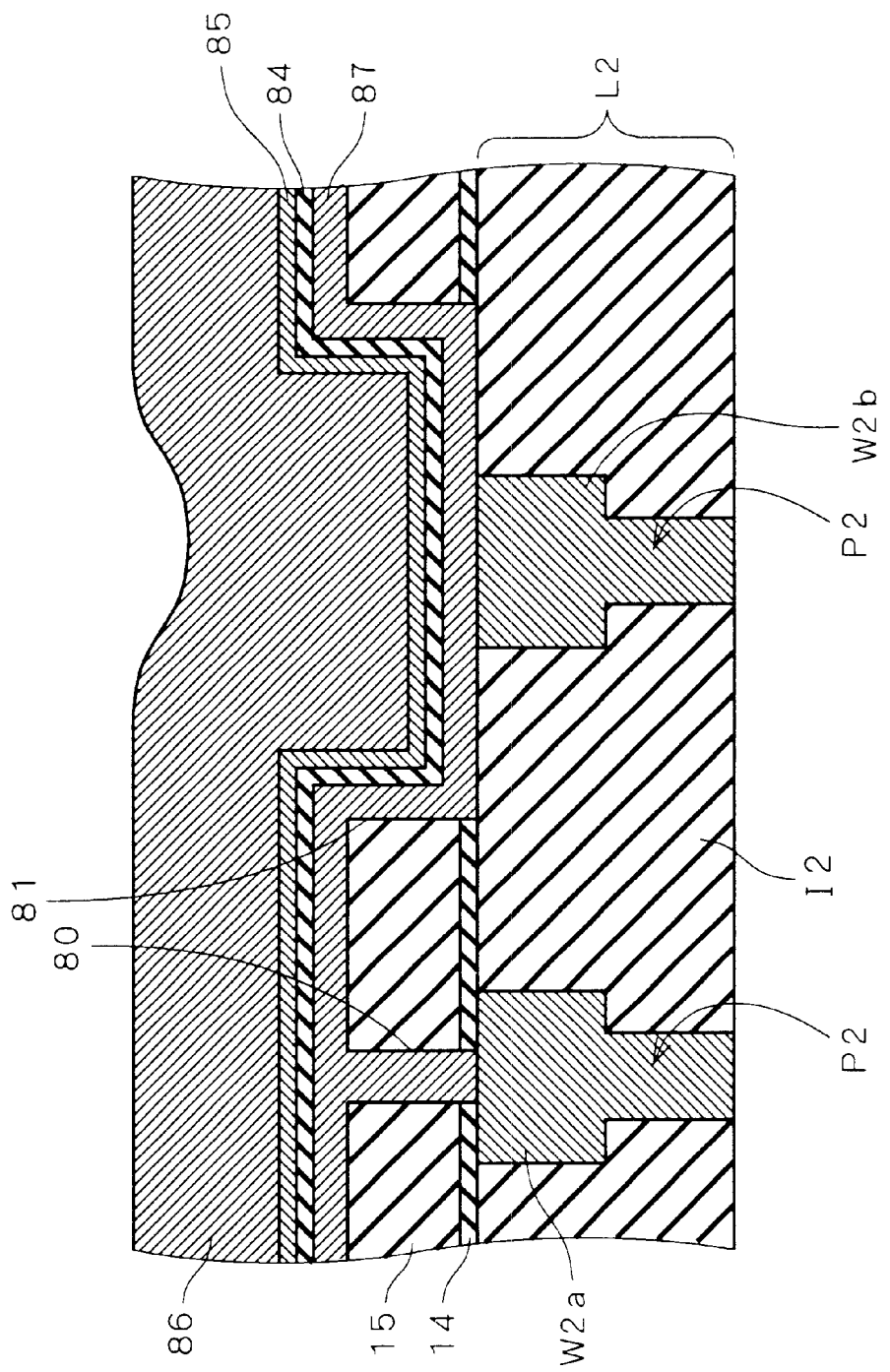

FIG. 87 is a cross section showing a structure of a semiconductor device in accordance with the fifteenth preferred embodiment of the present invention. In the insulating film I2 made of a silicon oxide film, the second-level wires W2a and W2b are formed by a dual damascene process. The second-level wires W2a and W2b are made of copper. The insulating film I3 has a structure in which the insulating films 14 to 17 are layered in this order on the upper surface of the second interconnection layer L2. The insulating films 14 and 16 are made of $Si_3N_4$, SiC or the like, and the insulating film 14 serves as an antioxidizing film for the second-level wires W2a and W2b and the insulating film 16 serves as an antioxidizing film for metal films 82, 83 and 86.

In the insulating films 14 and 15 formed is a recess 81 having a bottom surface defined by the upper surface of the second interconnection layer L2. The metal film 83 is formed on side surfaces and the bottom surface of the recess 81. The metal film 83 is made of copper, serving as the first electrode of the MIM-type capacitor. On the metal film 83, a metal film 84 is formed. The metal film 84 is made of $Si_3N_4$, SiC, $Ta_2O_3$ or the like, serving as the capacitor dielectric film of the MIM-type capacitor. On the metal film 84, a metal film 85 is formed and on the metal film 85, the metal film 86 is formed. The metal film 85 is made of TaN, Ta, TiN or the like, serving as a barrier metal for the metal film 86. The metal film 86 is made of copper. The metal films 85 and 86 serve as the second electrode of the MIM-type capacitor.

In the insulating films 16 and 17, the third-level wire W3 is formed. Further, in the insulating films 14 and 15 formed is a contact hole 80 for connecting the third-level wire W3 and the second-level wire W2a. The inside of the contact hole 80 is filled with the metal film 82. The metal film 82 is made of copper. In FIG. 87, the diameter of the contact hole 80 is smaller than that of the respective plug portions P2 of the second-level wires W2a and W2b.

FIGS. 88 to 93 are cross sections showing a method of manufacturing the semiconductor device of FIG. 87 in accordance with the fifteenth preferred embodiment of the present invention step by step in sequence. First, referring to FIG. 88, the second-level wires W2a and W2b are formed by a dual damascene process in the insulating film I2 of the second interconnection layer L2. Subsequently, the insulating films 14 and 15 are entirely formed by CVD in this order. Next, referring to FIG. 89, the contact hole 80 and the recess 81 are formed in the insulating films 14 and 15 by photolithography and anisotropic dry etching. By forming the contact hole 80, part of the upper surface of the second-level wire W2a is exposed and by forming the recess 81, the upper surface of the second-level wire W2b is exposed.

Figure 90:
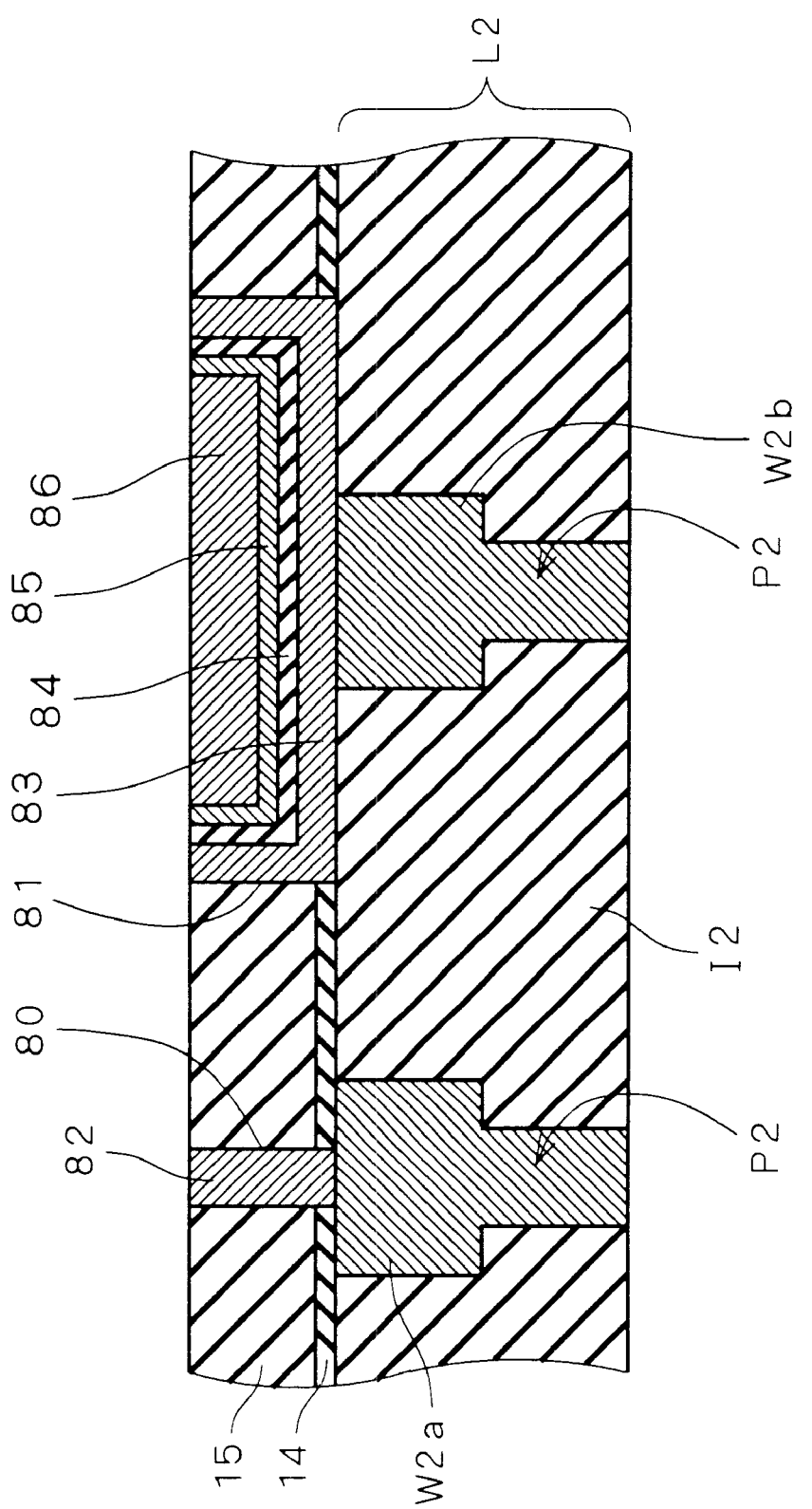
Figure 91:
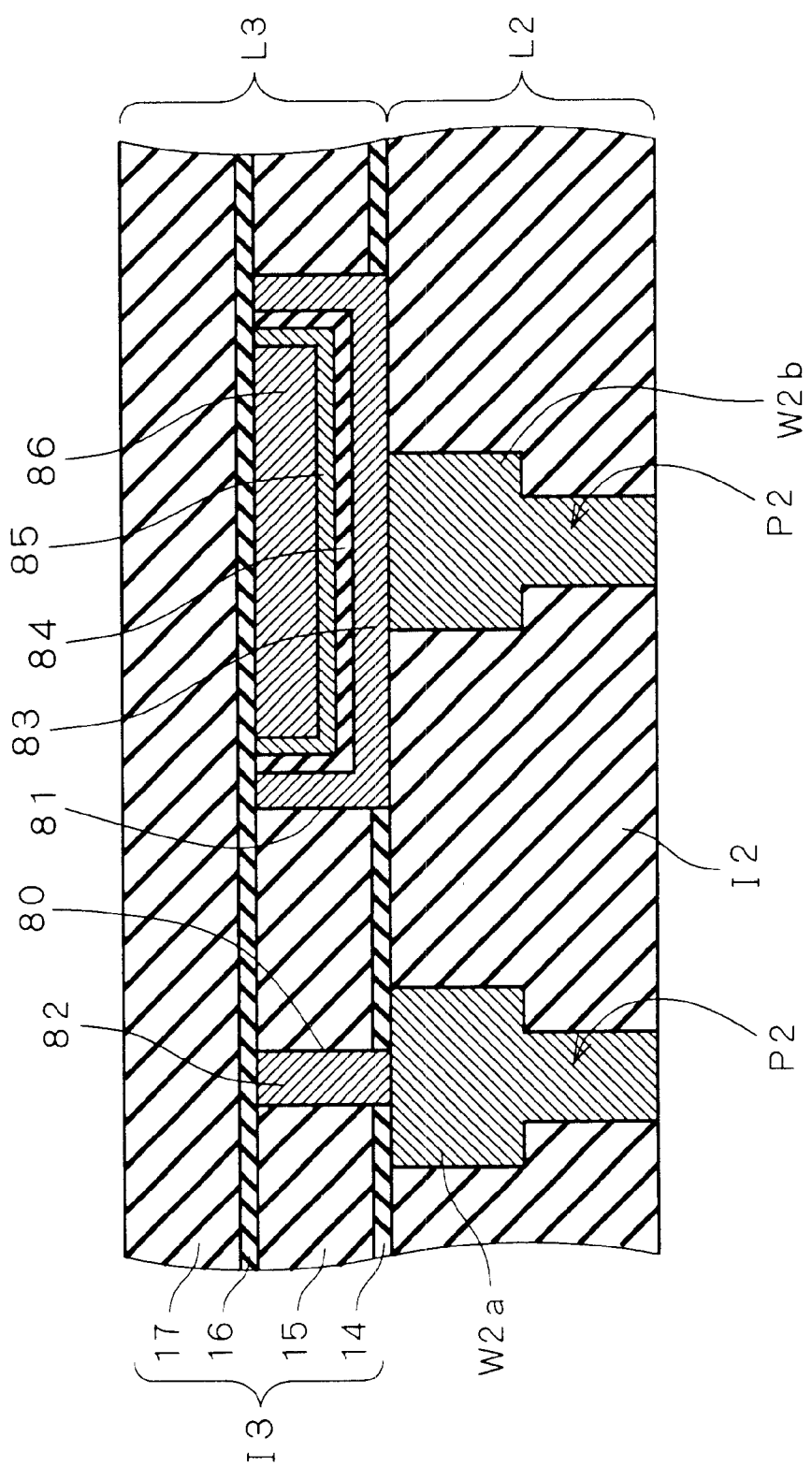
Figure 92:
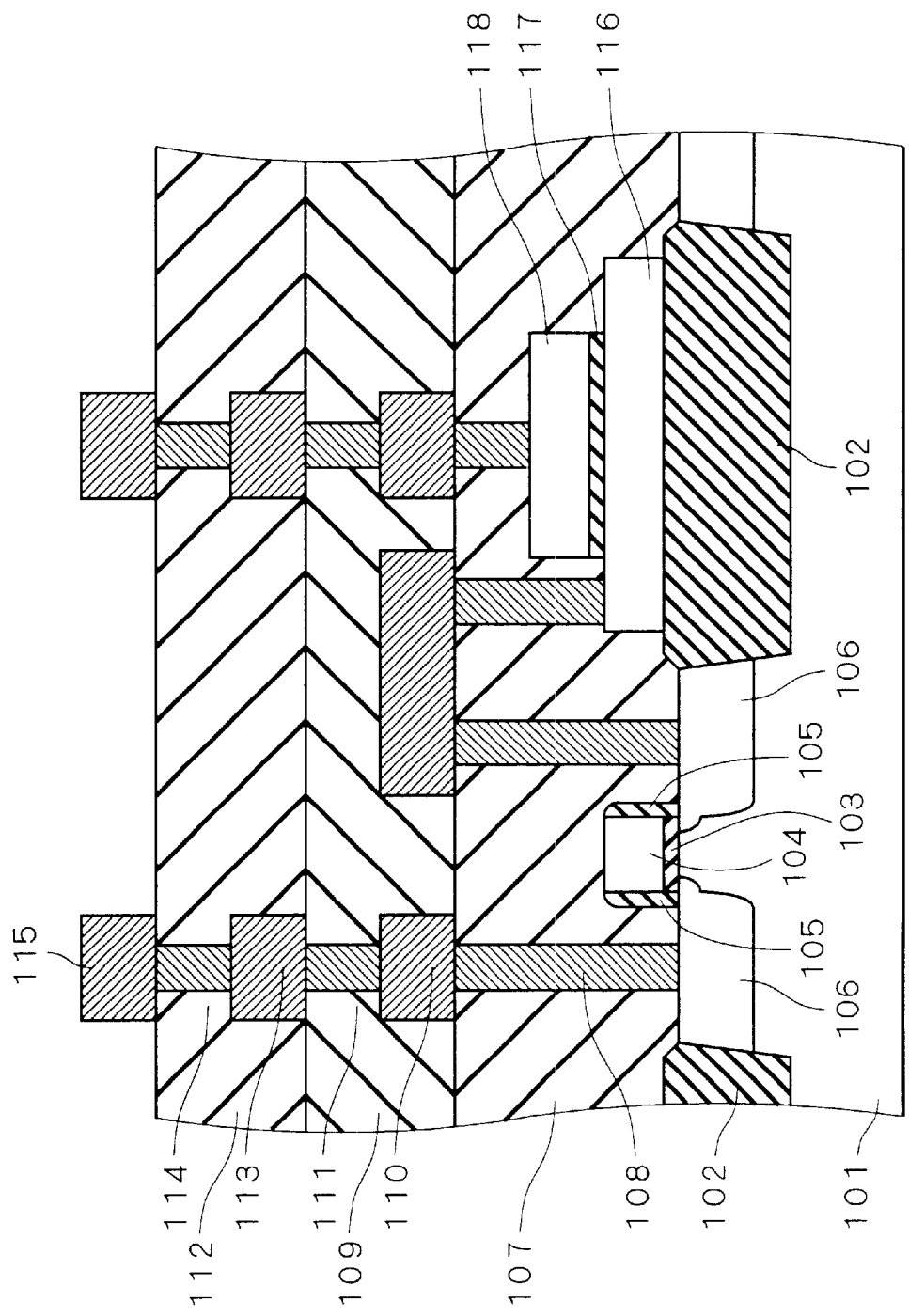
Figure 93:
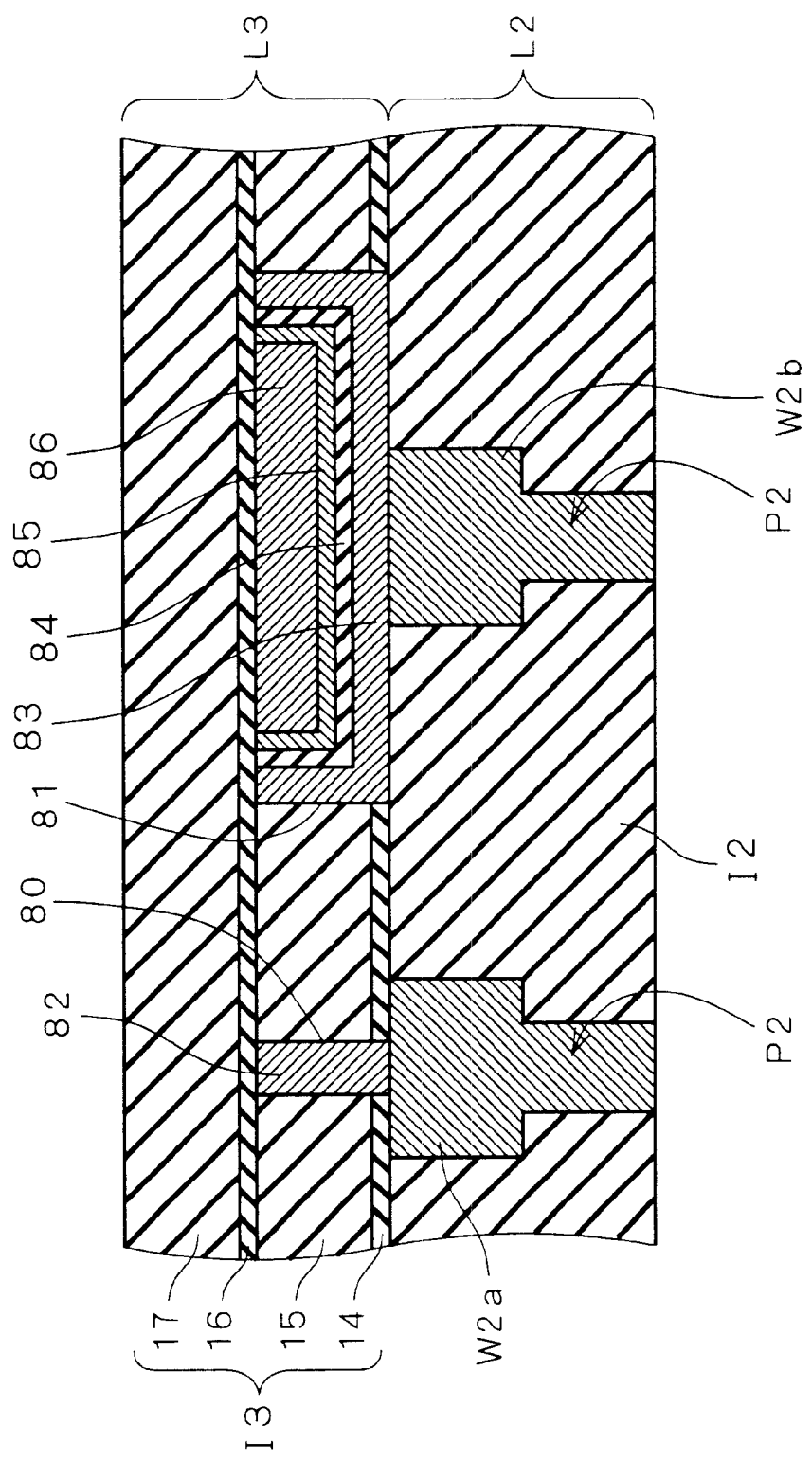

Next, referring to FIG. 90, a metal film 87 is entirely formed by plating to have a film thickness enough to fully fill the inside of the contact hole 80. At this time, a metal film such as W (tungsten), Pt (platinum) or Ru (ruthenium) may be formed by CVD, and a metal film such as Al (aluminum) may be formed by sputtering. Next, referring to FIG. 91, the insulating film 84 is entirely formed by CVD. Subsequently, the metal film 85 is entirely formed by sputtering. Then, the metal film 86 is entirely formed by plating to have a film thickness enough to fully fill the inside of the recess 81. Next, referring to FIG. 92, the metal films 85 to 87 and the insulating film 84 are polished by CMP till the upper surface of the insulating film 15 is exposed, to planarize the surfaces of these metal and insulating films. Next, referring to FIG. 93, the insulating films 16 and 17 are entirely formed by CVD in this order.

Subsequently, the interconnection trench 26 is formed in the insulating films 16 and 17 by photolithography and anisotropic dry etching. Then, the metal film 13 is entirely formed by sputtering. Subsequently, the metal film 12 is entirely formed by plating to have a film thickness enough to fully fill the inside of the interconnection trench 26. Then, the metal films 12 and 13 are polished by CMP till the upper surface of the insulating film 17 is exposed, to planarize the surfaces of these metal and insulating films. Through the above process steps, the structure shown in FIG. 87 is obtained.

Thus, according to the structure of the semiconductor device and the method of manufacturing the same of the fifteenth preferred embodiment, the MIM-type capacitor can be formed in the multi-level wire structure in the damascene process with no additional complicate process step, like in the first preferred embodiment.

Further, the metal film 83 serving as the first electrode of the MIM-type capacitor is formed not only on the bottom surface of the recess 81 but also on the side surfaces thereof. Therefore, the area in which the first electrode and the second electrode are opposed to each other are enlarged and the capacitor capacitance is thereby increased, as compared with, e.g., the semiconductor device of the first preferred embodiment.

Moreover, since the step for filling the inside of the contact hole 80 with the metal film 82 and the step for forming the metal film 83 in the recess 81 are performed in the same process step, the number of process steps is reduced as compared with the case where these steps are separately performed.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
    a substrate;
    a semiconductor element formed on said substrate;
    an interlayer insulating film so formed on said substrate as to cover said semiconductor element;
    an interconnection layer formed on said interlayer insulating film; and
    an MIM (Metal Insulator Metal)-type capacitor formed entirely in said interconnection layer, being electrically connected to said semiconductor element,
    wherein said MIM-type capacitor has
        a first metal film formed on side surfaces and a bottom surface of a recess defined in said interconnection layer, serving as a first electrode;
        a dielectric film formed on said first metal film; and
        a second metal film filling said recess, being opposed to said first metal film with said dielectric film interposed therebetween and serving as a second electrode.

2. The semiconductor device according to claim 1, further comprising:
    a barrier film formed at an interface between said second metal film and said dielectric film,
    wherein a voltage applied to said second electrode is higher than that applied to said first electrode.

3. The semiconductor device according to claim 2, wherein
    said dielectric film is a film whose dielectric constant is higher than that of said interlayer insulating film.

4. The semiconductor device according to claim 3, wherein
    said dielectric film is a film capable of preventing oxidation of said first metal film.

5. The semiconductor device according to claim 1, wherein
    said MIM-type capacitor has a plurality of structures each including said first metal film, said dielectric film and said second metal film,
    said plurality of first metal films are connected to one another with a first wire formed in said interconnection layer,
    said plurality of second metal films are connected to one another with a second wire formed in said interconnection layer,
    said plurality of first metal films serve as said first electrode as a unit, and said plurality of second metal films serve as said second electrode as a unit.

6. The semiconductor device according to claim 5, wherein
said MIM-type capacitor further has a plurality of barrier films formed at interfaces between said plurality of second metal films and said plurality of dielectric films, and
a voltage applied to said second electrode is higher than that applied to said first electrode.

7. The semiconductor device according to claim 6, wherein
each of said plurality of dielectric films is a film whose dielectric constant is higher than that of said interlayer insulating film.

8. The semiconductor device according to claim 7, wherein
each of said plurality of dielectric films is a film capable of preventing oxidation of said plurality of first metal films.

9. A semiconductor device comprising:
a substrate;
a semiconductor element formed on said substrate;
an interlayer insulating film so formed on said substrate as to cover said semiconductor element;
an interconnection layer formed on said interlayer insulating film; and
an MIM (Metal Insulator Metal)-type capacitor formed in said interconnection layer, being electrically connected to said semiconductor element,
wherein said interlayer insulating film has a predetermined insulating layer,
said MIM-type capacitor has
a first metal film formed in a main surface of said interconnection layer, serving a first electrode;
a capacitor dielectric film formed only on a side surface of said first metal film in said main surface of said interconnection layer; and
a second metal film opposed to said first metal film with said capacitor dielectric film interposed therebetween in said main surface of said interconnection layer, serving as a second electrode.

10. The semiconductor device according to claim 9, further comprising:
a barrier film formed at an interface between said second metal film and said dielectric film,
wherein a voltage applied to said second electrode is higher than that applied to said first electrode.

11. The semiconductor device according to claim 10, wherein
said dielectric film is a film whose dielectric constant is higher than that of said interlayer insulating film.

12. The semiconductor device according to claim 9, wherein
said MIM-type capacitor has a plurality of structures each including said dielectric film and said second metal film,
said plurality of dielectric films and said plurality of second metal films are formed on side surfaces of said first metal film which are opposed to each other, respectively,
said plurality of second metal films are connected to one another with a wire formed in said interconnection layer, and
said plurality of second metal films serve as said second electrode as a unit.

13. The semiconductor device according to claim 12, further comprising:
a plurality of barrier films formed at interfaces between said plurality of second metal films and said plurality of dielectric films, respectively,
wherein a voltage applied to said second electrode is higher than that applied to said first electrode.

14. The semiconductor device according to claim 13, wherein
each of said plurality of dielectric films is a film whose dielectric constant is higher than that of said interlayer insulating film.

15. The semiconductor device according to claim 9, wherein
said dielectric film and said second metal film are so formed as to surround said first electrode.

16. The semiconductor device according to claim 15, further comprising:
a barrier film formed at an interface between said second metal film and said dielectric film,
wherein a voltage applied to said second electrode is higher than that applied to said first electrode.

17. The semiconductor device according to claim 16, wherein
said dielectric film is a film whose dielectric constant is higher than that of said interlayer insulating film.

18. A semiconductor device comprising:
a substrate;
a semiconductor element formed on said substrate;
an interlayer insulating film so formed on said substrate as to cover said semiconductor element; and
an MIM (Metal Insulator Metal)-type capacitor formed in said interlayer insulating film, being electrically connected to said semiconductor element,
wherein said MIM-type capacitor has
a plurality of first metal films connected to one another with a wire formed in said interlayer insulating film;
a second metal film formed extending onto said plurality of first metal films, serving as a first electrode together with said plurality of first metal films;
a dielectric film formed on said second metal film; and
a third metal film opposed to said second metal film with said dielectric film interposed therebetween, serving as a second electrode.

19. The semiconductor device according to claim 18, wherein
said second metal film serves as a first barrier film,
said MIM-type capacitor further has
a plurality of second barrier films formed at interfaces between said plurality of first metal films and said wire; and
a third barrier film formed at an interface between said third metal film and said dielectric film.

20. The semiconductor device according to claim 19, wherein
said dielectric film is a film whose dielectric constant is higher than that of said interlayer insulating film.

* * * * *